United States Patent
Choi et al.

(10) Patent No.: US 9,379,001 B2
(45) Date of Patent: Jun. 28, 2016

(54) SEMICONDUCTOR DEVICE AND METHOD OF FABRICATING THE SAME

(71) Applicants: Yonggyu Choi, Seongnam-si (KR); Dong-hyun Kim, Yongin-si (KR); Yongchul Oh, Suwon-si (KR); Kichul Nam, Gwacheon-si (KR)

(72) Inventors: Yonggyu Choi, Seongnam-si (KR); Dong-hyun Kim, Yongin-si (KR); Yongchul Oh, Suwon-si (KR); Kichul Nam, Gwacheon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 10 days.

(21) Appl. No.: 14/182,686

(22) Filed: Feb. 18, 2014

(65) Prior Publication Data

US 2014/0252536 A1    Sep. 11, 2014

(30) Foreign Application Priority Data

Mar. 5, 2013    (KR) .......................... 10-2013-0023463

(51) Int. Cl.
*H01L 29/06* (2006.01)
*H01L 23/485* (2006.01)
*H01L 21/764* (2006.01)
*H01L 21/768* (2006.01)
*H01L 27/02* (2006.01)

(52) U.S. Cl.
CPC ........ *H01L 21/764* (2013.01); *H01L 21/76831* (2013.01); *H01L 21/76897* (2013.01); *H01L 27/0207* (2013.01)

(58) Field of Classification Search
CPC ............ H01L 21/764; H01L 21/76831; H01L 21/76897; H01L 21/0207; H01L 21/31; H01L 23/485; H01L 29/06; H01L 29/0649
See application file for complete search history.

(56) References Cited

U.S. PATENT DOCUMENTS

| | | | |
|---|---|---|---|
| 6,483,192 B1 | 11/2002 | Kobayashi | |
| 7,012,335 B2 | 3/2006 | Lee et al. | |
| 2002/0028558 A1 | 3/2002 | Yang | |
| 2002/0117686 A1 | 8/2002 | Lee et al. | |
| 2006/0258145 A1* | 11/2006 | Lee | H01L 21/76804 438/618 |
| 2011/0017971 A1* | 1/2011 | Kim et al. | 257/5 |

FOREIGN PATENT DOCUMENTS

| | | |
|---|---|---|
| JP | 2008-147326 A | 6/2008 |
| KR | 2002-0096381 A | 12/2002 |
| KR | 10-0382554 B1 | 5/2003 |
| KR | 10-0400324 B1 | 10/2003 |
| KR | 2005-0002988 A | 1/2005 |
| KR | 10-0673113 B1 | 1/2007 |
| KR | 2008-0085559 A | 9/2008 |
| KR | 2009-0000327 A | 1/2009 |
| KR | 2011-0091944 A | 8/2011 |
| KR | 2011-0125053 A | 11/2011 |
| KR | 10-1175259 B1 | 6/2012 |

* cited by examiner

*Primary Examiner* — Whitney T Moore
(74) *Attorney, Agent, or Firm* — Harness, Dickey & Pierce, P.L.C.

(57) ABSTRACT

A semiconductor device includes line patterns disposed on a substrate, the line patterns extending in a first direction and being parallel to one another. The semiconductor device includes conductive patterns spaced apart from each other in the first direction between an adjacent pair of the line patterns. The semiconductor device includes insulating fences electrically isolating the conductive patterns from each other and having chamfered corners. The semiconductor device includes insulating patterns filling gaps between side surfaces of the line patterns and the chamfered corners of the insulating fences.

23 Claims, 62 Drawing Sheets

SEMICONDUCTOR DEVICE AND METHOD OF FABRICATING THE SAME

CROSS-REFERENCE TO RELATED APPLICATIONS

This U.S. non-provisional patent application claims priority under 35 U.S.C. §119 to Korean Patent Application No. 10-2013-0023463, filed on Mar. 5, 2013, in the Korean Intellectual Property Office, the entire contents of which are hereby incorporated by reference.

BACKGROUND

At least one example embodiment of inventive concepts relates to a semiconductor device and a method of fabricating the same, and in particular, to an insulating pattern electrically isolating conductive patterns from each other and/or a method of forming the same.

Higher integration of semiconductor devices is desired to satisfy consumer demands for electronic devices. However, owing to increasing technical difficulties in a fabrication process (e.g., a reduced process margin in a lithography process), it is becoming harder to realize the highly-integrated semiconductor devices. To overcome such a limitation, recent studies focus on new technology for increasing integration density and performance of the semiconductor device.

SUMMARY

At least one example embodiment of inventive concepts provides a highly integrated semiconductor device.

At least one example embodiment of inventive concepts provides a method of fabricating the highly integrated semiconductor device.

According to at least one example embodiment, a semiconductor device includes line patterns disposed on a substrate, the line patterns extending in a first direction and being parallel to one another. The semiconductor device includes conductive patterns spaced apart from each other in the first direction between an adjacent pair of the line patterns, and insulating fences electrically isolating the conductive patterns from each other and having chamfered corners. The semiconductor device includes insulating patterns filling gaps between side surfaces of the line patterns and the chamfered corners of the insulating fences.

According to at least one example embodiment, each of the insulating fences is elongated along a second direction perpendicular to the first direction, each of the insulating fences having an elliptical shape.

According to at least one example embodiment, each of the insulating patterns includes a portion filling a gap between a side surface of the line pattern and at least one end portion of one of the insulating fences.

According to at least one example embodiment, each of the insulating patterns has a side surface that is substantially coplanar with at least one of the insulating fences.

According to at least one example embodiment, at least one of the insulating patterns has an air gap, and the air gap is not exposed to the outside.

According to at least one example embodiment, at least one of the insulating patterns fills a space created by the chamfered portion of at least one of the insulating fences.

According to at least one example embodiment, at least one of the insulating patterns has a side surface that is substantially coplanar with a side surface of at least one of the insulating fences.

According to at least one example embodiment, at least one of the insulating fences has an air gap, and the air gap is not exposed to the outside.

According to at least one example embodiment, at least one of the insulating patterns has a structure that encloses at least one of the conductive patterns.

According to at least one example embodiment, a method of fabricating a semiconductor device includes forming line patterns extending in a first direction, on a substrate. The method includes forming sacrificial patterns spaced apart from each other in the first direction, the sacrificial patterns being between adjacent ones of the line patterns. The method includes forming insulating fences to fill empty spaces defined by the sacrificial patterns and the line patterns. The method includes removing the sacrificial patterns to form a resulting structure, the resulting structure including exposed substrate, the line patterns, and the insulating fences. The method includes conformally forming an insulating layer on the resulting structure. The method includes etching the insulating layer to form insulating patterns filling gaps between the line patterns and corners of the insulating fences, and forming conductive patterns on the exposed substrate.

According to at least one example embodiment, the removing the sacrificial patterns includes etching corners of the insulating fences to form chamfered corners.

According to at least one example embodiment, the removing of the sacrificial patterns includes etching at least one of the insulating fences to separate the at least one of the insulating fences from the line patterns.

According to at least one example embodiment, the etching the insulating layer forms insulating patterns that fill gaps between the insulating fences and the line patterns.

According to at least one example embodiment, the removing of the sacrificial patterns includes partially etching at least one of the insulating fences such that the at least one of the insulating fences has an etched portion.

According to at least one example embodiment, the etching the insulating layer forms insulating patterns that fill the etched portion of the at least one of the insulating fences.

According to at least one example embodiment, the method includes etching the insulating fences to a first depth. The etching the insulating layer forms insulating patterns that have a thickness equivalent to the first depth, is performed in an anisotropic etching process, and forms the insulating patterns have a structure that encloses the conductive patterns.

According to at least one example embodiment, the insulating fences include a nitride layer formed by a vapor deposition process.

According to at least one example embodiment, the insulating layer includes a nitride layer formed by an atomic layer deposition process.

According to at least one example embodiment, a semiconductor device includes a device isolation pattern on a substrate to define active regions, and gate electrodes formed parallel to a first direction such that the gate electrodes cross the active regions and the device isolation pattern. The semiconductor device includes first and second impurity regions formed in the active regions at both sides of each of the gate electrodes, and bit line structures extending in a second direction perpendicular to the first direction. The bit line structures are electrically connected to the first impurity regions. The semiconductor device includes first contact plugs between the bit line structures and electrically connected to the second impurity regions. The semiconductor device includes first insulating fences between the bit line structures, the first insulating fences electrically isolating the first contact plugs from each other, each of the first insulating fences having chamfered corners. The semiconductor device includes insulating patterns filling gaps between side surfaces of the bit line structures and the chamfered corners of the first insulating fences.

According to at least one example embodiment, each of the first insulating fences has an elliptical shape.

According to at least one example embodiment, the insulating patterns fill gaps between side surfaces of the bit line structures and end portions of the first insulating fences, and at least one of the insulating patterns has a side surface that is substantially coplanar with a side surface of at least one of the first insulating fences.

According to at least one example embodiment, at least one of the insulating patterns has an air gap, and the air gap is not exposed to the outside.

According to at least one example embodiment, at least one of the insulating patterns fills a space created by the chamfered portion of at least one of the first insulating fences, and the insulating pattern has a side surface that is substantially coplanar with a side surface of at least one of the first insulating fences.

According to at least one example embodiment, at least one of the first insulating fences has an air gap, and the air gap is not exposed to the outside.

According to at least one example embodiment, at least one of the insulating patterns has a structure that encloses at least one of the first contact plugs.

According to at least one example embodiment, the first insulating fences include a nitride layer formed by a vapor deposition process.

According to at least one example embodiment, the insulating patterns include a nitride layer formed by an atomic layer deposition process.

According to at least one example embodiment, the semiconductor device includes second contact plugs between the gate electrodes, the second contact plugs electrically connecting the first impurity regions to the bit line structures. The semiconductor device includes second insulating fences between the gate electrodes, the second insulating fences electrically isolating adjacent the second contact plugs from each other.

According to at least one example embodiment, a semiconductor device includes first and second line patterns extending in a first direction and being parallel to one another. The semiconductor device includes a plurality of insulating fences between the first and second line patterns. Each of the insulating fences has chamfered corners. The semiconductor device includes a plurality of insulating patterns, at least a one of the insulating patterns enclosing the chamfered corners of at least one of the insulating fences. The semiconductor device includes a plurality of conductive patterns between the first and second line patterns, the plurality of conductive patterns being electrically isolated from each other by at least one of the insulating patterns and at least one of the insulating fences.

According to at least one example embodiment, each of the first and second line patterns includes a conductive line and at least one insulating spacer.

According to at least one example embodiment, at least a first one of the insulating patterns includes a first air gap sealed within the first one of the insulating patterns.

According to at least one example embodiment, at least one of the insulating fences includes at least a second one of the insulating patterns and a second air gap, the second air gap being sealed within the at least one of the insulating fences by the second one of the insulating patterns.

According to at least one example embodiment, each of the insulating fences has a substantially elliptical shape.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 3A through 8A are plan views illustrating a method of fabricating a semiconductor device, according to at least one example embodiment of inventive concepts.

FIGS. 3B through 8B are sectional views taken along lines I-I' of FIGS. 3A through 8A, respectively.

FIGS. 11A through 21A are plan views illustrating a method of fabricating a semiconductor device, according to still other example embodiments of the inventive concept.

FIGS. 11B through 21B are sectional views taken along lines I-I' of FIGS. 11A through 21A, respectively.

FIGS. 11C through 21C are sectional views taken along lines II-II' of FIGS. 11A through 21A, respectively.

FIGS. 22A through 25A are plan views illustrating a method of fabricating a semiconductor device, according to at least one example embodiment of inventive concepts.

FIGS. 22B through 25B are sectional views taken along lines I-I' of FIGS. 22A through 25A, respectively.

FIGS. 22C through 25C are sectional views taken along lines II-II' of FIGS. 22A through 25A, respectively.

Figure 1A:
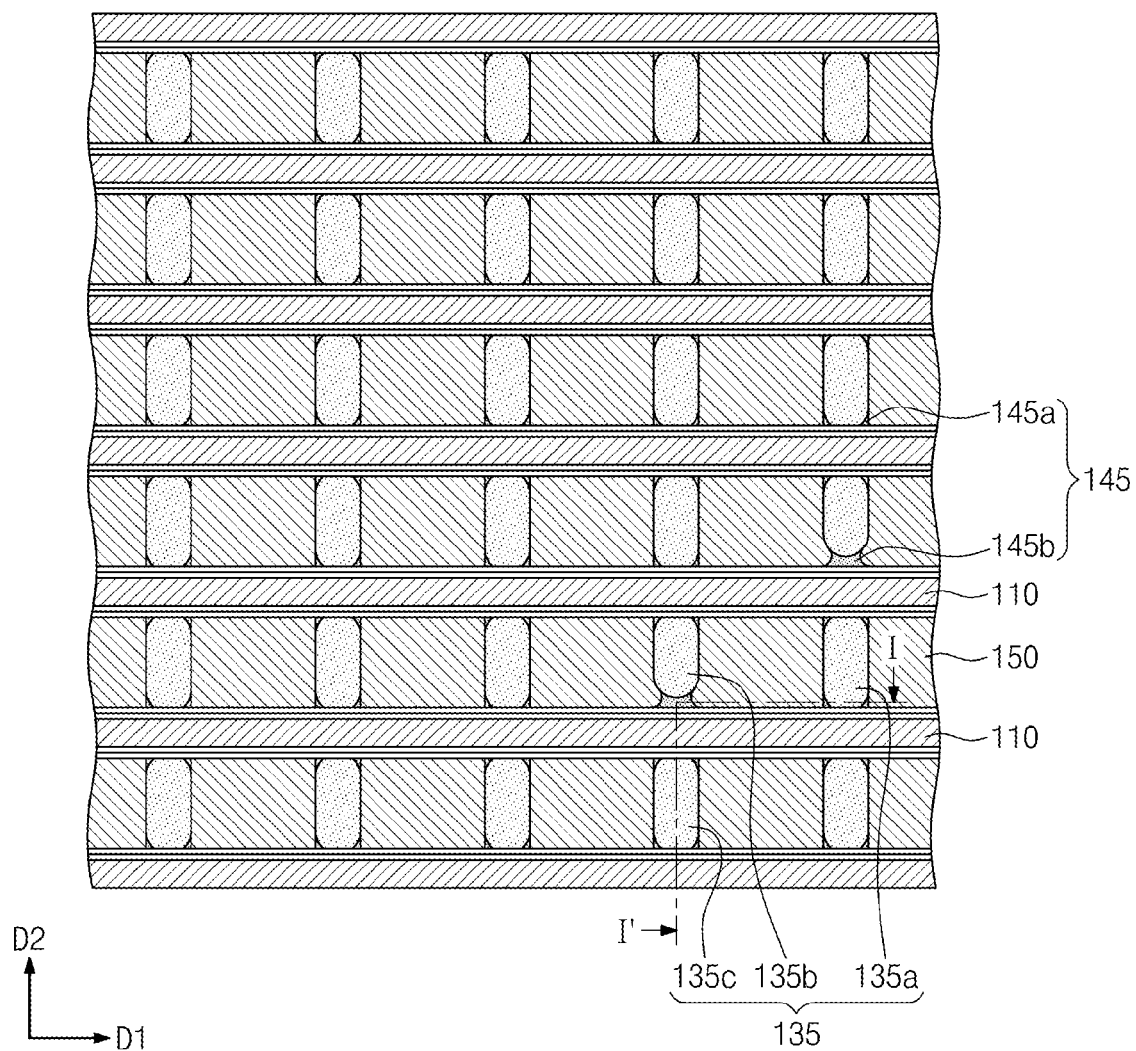
FIG. 1A is a plan view illustrating a semiconductor device according to at least one example embodiment of inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments of inventive concepts will now be described more fully with reference to the accompanying drawings, in which example embodiments are shown. Example embodiments of inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms.

These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1B:
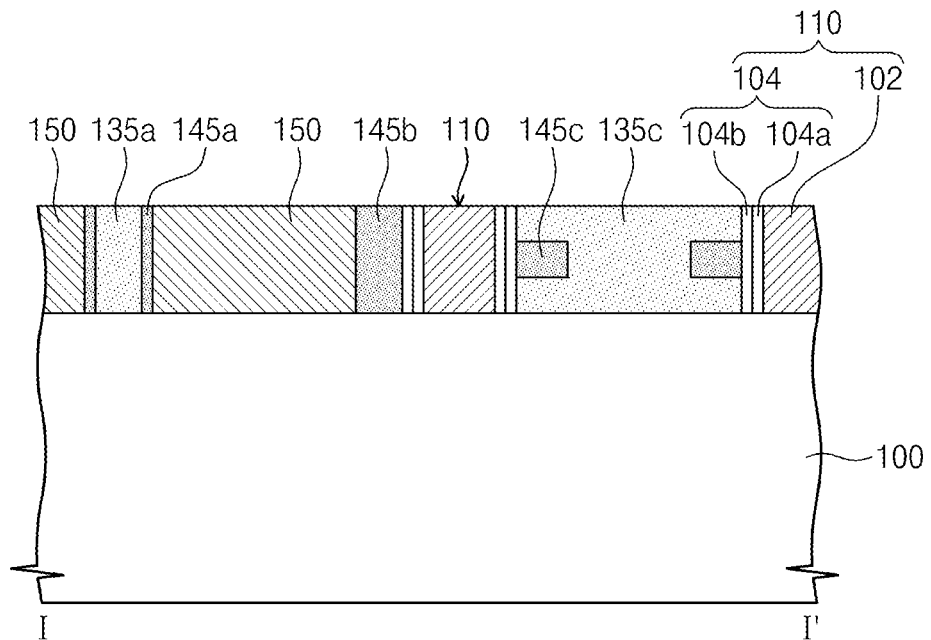
FIGS. 1B and 1C are sectional views taken along line I-I' of FIG. 1A.
Figure 1C:
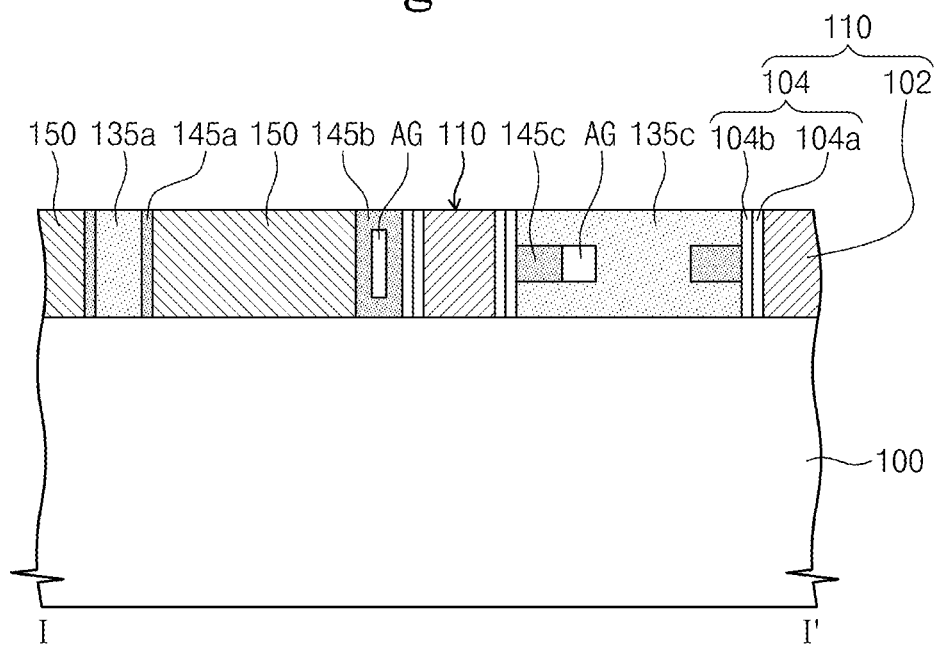

FIG. 1A is a plan view illustrating a semiconductor device according to at least one example embodiment of inventive concepts. FIGS. 1B and 1C are sectional views taken along line I-I' of FIG. 1A.

Referring to FIGS. 1A through 1C, line patterns 110, insulating fences 135, insulating patterns 145, and conductive patterns 150 may be provided on a substrate 100.

The line patterns 110 may extend in a first direction D1 and be separated from each other in a second direction D2 (e.g., perpendicular to the first direction D1). For example, each of the line patterns 110 may include a conductive line 102 and spacers 104 provided on both side surfaces of the conductive line 102. Each of the spacers 104 may have a multi-layered structure, for example, including layers 104a and 104b. The line pattern 110 may further include a capping pattern (not shown) disposed on the conductive line 102.

The insulating fences 135 may be provided between a pair of the line patterns 110 disposed adjacent to each other. The insulating fences 135 may have a shape elongated along the second direction D2 and be separated from each other in the first direction D1.

The insulating fences 135 may include a first insulating material. The first insulating material may be selected to have an etch selectivity with respect to the line patterns 110, when a specific etchant is used to etch the line patterns 110. The first insulating material may include oxide, nitride, and/or oxynitride. For example, the first insulating material may include silicon oxide, silicon nitride, and/or silicon oxynitride.

According to at least one example embodiment of inventive concepts, in plan view, each of the insulating fences 135 may be elongated along the second direction D2 to have rounded corners. For example, each of the insulating fences 135 may be shaped like an ellipse, whose major axis is parallel to the second direction D2. In at least one other example embodiment, each of the insulating fences 135 may be shaped like a circle. In still at least one other example embodiment, each of the insulating fences 135 may be shaped like a polygon.

Each of the insulating fences 135 may include at least one of a first insulating fence 135a, a second insulating fence 135b, or a third insulating fence 135c.

According to at least one example embodiment of inventive concepts, end portions of the first insulating fences 135a may be in contact with side surfaces of the line patterns 110. The end portion of each of the first insulating fences 135a may have a curved surface. Accordingly, a space may be provided between a corner of the end portion of the first insulating fence 135a and the side surface of the line pattern 110. According to at least one other example embodiment of inventive concepts, at least one end portion of the second insulating fences 135b is not in contact with the side surface of the line pattern 110. In this case, the end portion of the second insulating fence 135b may be spaced apart from the side surface of the line pattern 110. According to at least one example embodiment of inventive concepts, each of the third insulating fences 135c may include a partially-etched portion.

The insulating patterns 145 may include at least one of first insulating patterns 145a, second insulating patterns 145b, or third insulating patterns 145c.

The first insulating patterns 145a may be provided to cover the side surface of each of the line patterns 110 and the corners of the first insulating fences 135a. The side surfaces of the first insulating patterns 145a may be formed to be substantially coplanar with the side surfaces of the first insulating fences 135a.

According to at least one example embodiment of inventive concepts, the second insulating patterns 145b may be provided to fill spaces between the side surface of each of the line patterns 110 and an end portion of at least one of the second insulating fences 135b. The side surfaces of the second insulating patterns 145b may be formed to be substantially coplanar with the side surfaces of the second insulating fences 135b. In an example embodiment, the insulating pattern 145 may be formed to have an air gap AG, as shown in FIG. 1C. The second insulating patterns 145b may be formed not to fill wholly the space between the line patterns 110 and the second insulating fences 135b, and thus, the air gap AG may be formed in the second insulating pattern 145b. In at least one example embodiment, the air gap AG may be sealed by the second insulating pattern 145b, and thereby, it is not exposed to the outside.

According to at least one example embodiment of inventive concepts, the third insulating pattern 145c may be provided to fill an etched portion of each of the third insulating fences 135c. The side surfaces of the third insulating patterns 145c may be formed to be substantially coplanar with the side surface of the third insulating fence 135c. In an example embodiment, at least one of the third insulating fences 135c may be formed to have the air gap AG, as shown in FIG. 1C. The third insulating patterns 145c may be formed not to fill wholly the etched portions of the third insulating fences 135c, and thus, the air gap AG may be formed in the third insulating fences 135c. In at least one example embodiment, the air gap AG may be sealed by the third insulating patterns 145c, and thereby, it is not exposed to the outside.

Each of the insulating patterns 145 may include a second insulating material. The insulating patterns 145 may include a material having an etch selectivity with respect to the insulating fences 135, the line patterns 110, and the conductive pattern 150. The second insulating material may include oxide, nitride, and/or oxynitride. For example, the second insulating material may include silicon oxide, silicon nitride, and/or silicon oxynitride. In at least one example embodiment, each of the insulating fences 135 may include a silicon nitride layer formed by a chemical vapor deposition process, and each of the insulating patterns 145 may include a silicon nitride layer formed by an atomic layer deposition process.

The conductive patterns 150 may be provided between a pair of the line patterns 110 disposed adjacent to each other. The conductive patterns 150 and the insulating fences 135 may be alternately arranged between the pair of the line patterns 110. The conductive patterns 150 may be electrically isolated from each other by the insulating fences 135 and insulating patterns 145, and thereby, each of the conductive patterns 150 may have an island-shaped structure isolated from the others.

According to example embodiments of the inventive concept, the insulating fences 135 and the insulating patterns 145 may be provided to isolate electrically the conductive patterns 150 from each other. Since the side surfaces of the insulating patterns 145 are substantially coplanar with those of the insulating fences 135, it is unnecessary to reduce a size of each conductive pattern 150. Accordingly, it is possible to enhance an electrical isolation between the conductive patterns 150 without an increase in electrical resistance of the conductive patterns 150, and thereby, improve electric reliability of the conductive patterns 150.

Figure 2A:
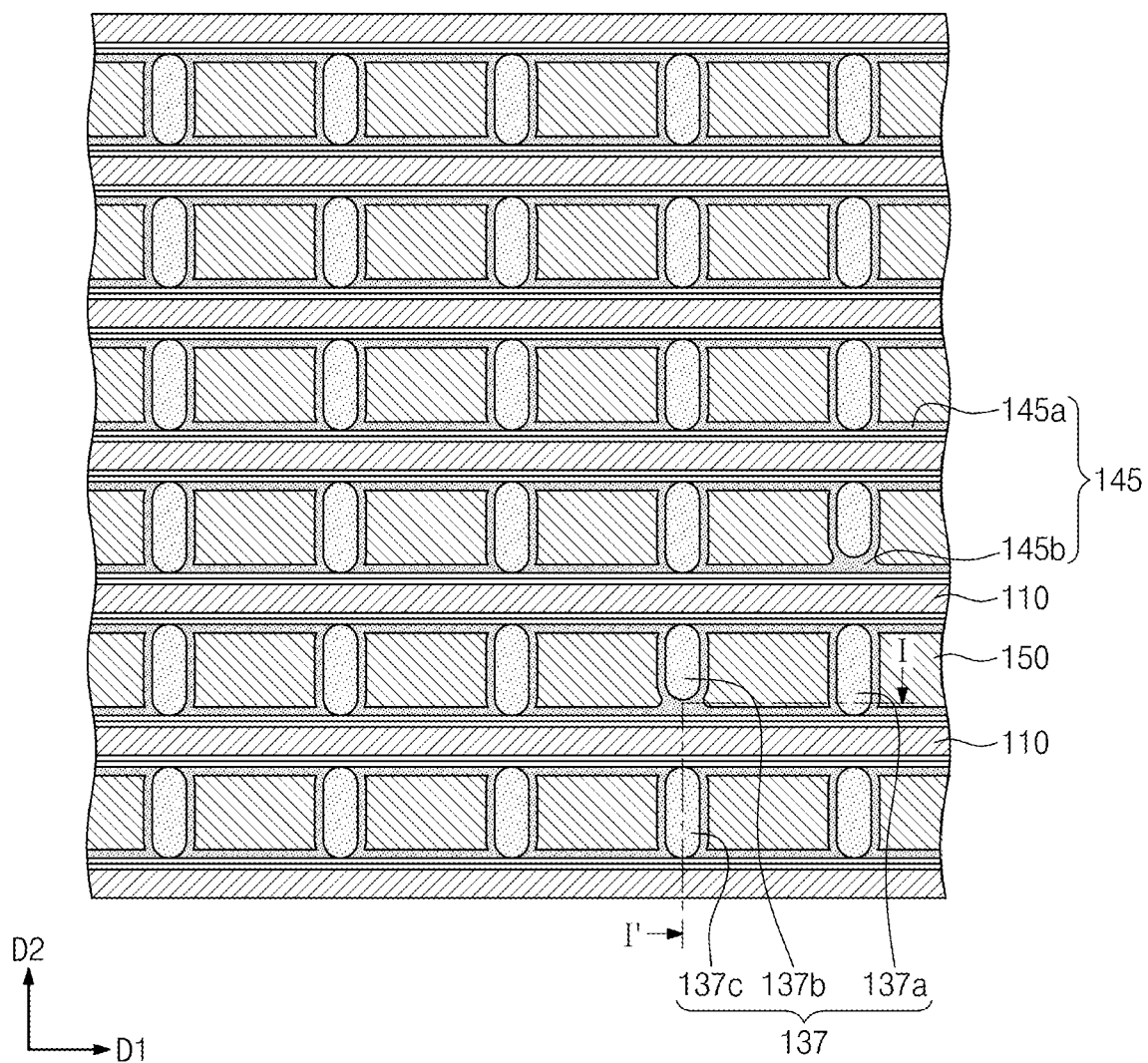
FIG. 2A is a plan view illustrating a semiconductor device according to at least one example embodiment of inventive concepts.
Figure 2B:
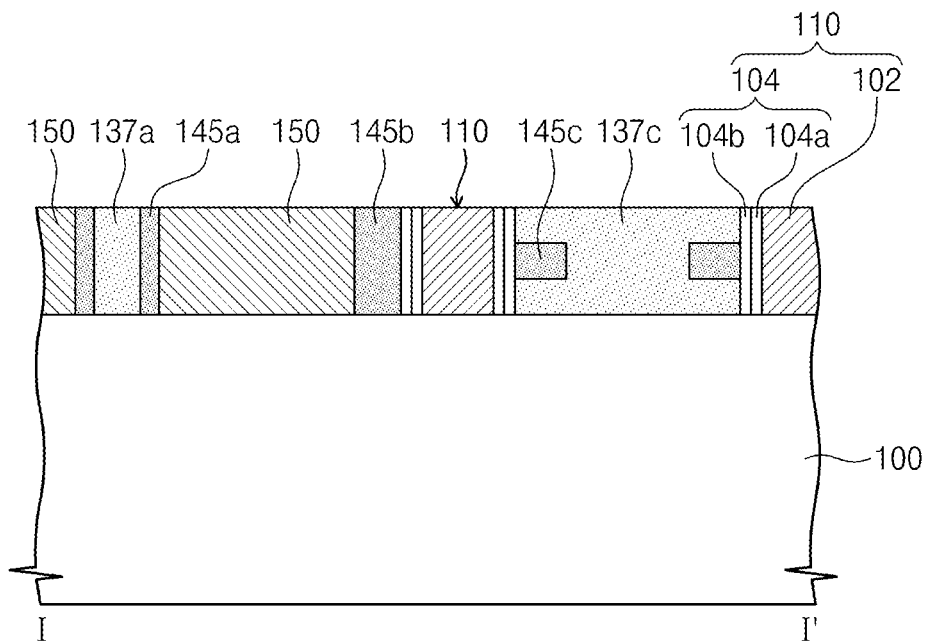
FIGS. 2B and 2C are sectional views taken along line I-I' of FIG. 2A.
Figure 2C:
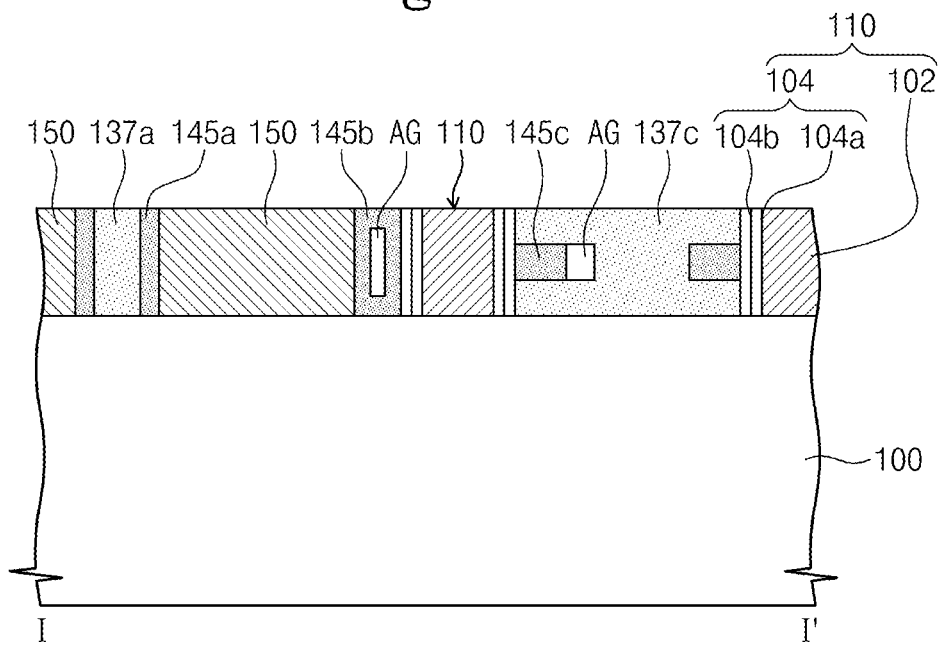

FIG. 2A is a plan view illustrating a semiconductor device according to at least one example embodiment of inventive concepts. FIGS. 2B and 2C are sectional views taken along line I-I' of FIG. 2A.

Referring to FIGS. 2A through 2C, line patterns 110, insulating fences 137, insulating patterns 145, and conductive patterns 150 may be provided on a substrate 100.

The line patterns 110 may be elongated along a first direction D1 and be separated from each other in a second direction D2 (e.g., perpendicular to the first direction D1). The insulating fences 137 may be provided between a pair of the line patterns 110 disposed adjacent to each other. The insulating fences 137 may have a shape elongated along the second direction D2 and be separated from each other in the first direction D1. The conductive patterns 150 and the insulating fences 137 may be alternatingly arranged between the pair of the line patterns 110.

The insulating fences 137 may include at least one of first, second, and third insulating fences 137a, 137b, and 137c. The insulating patterns 145 may include at least one of first, second, and third insulating patterns 145a, 145b, and 145c.

According to at least one example embodiment of inventive concepts, each of the first insulating patterns 145a may be provided along an inner side surface of a space defined by the pair of the line patterns 110 and a pair of the first insulating fences 137a there between. According to at least one example embodiment of inventive concepts, each of the first insulating patterns 145a may have a closed-loop structure. Further, at least a portion of the first insulating patterns 145a may be extended to fill spaces between corners of the first insulating fences 137a and side surfaces of the line patterns 110.

According to other aspects of the inventive concept, the second insulating pattern 145b may be extended to fill spaces between an end portion of the second insulating fence 137b and the side surface of the line pattern 110. In this case, the second insulating patterns 145b disposed adjacent to each other may be connected to each other through the space between the insulating fence 137b and the line pattern 110. In a modified embodiment, at least one of the second insulating patterns 145b may be formed to have the air gap AG, as shown in FIG. 2C. The second insulating patterns 145b may be formed not to fill wholly the spaces between the line patterns 110 and the second insulating fences 137b, and thus, the air gap AG may be formed in the second insulating pattern 145b. In at least one example embodiment, the air gap AG may be sealed by the second insulating pattern 145b, and thereby, it is not exposed to the outside.

According to at least one example embodiment of inventive concepts, the third insulating pattern 145c may be extended to fill an etched portion of each of the third insulating fences 137c. In a modified embodiment, as shown in FIG. 2C, since the insulating pattern 145c does not fill wholly the etched portion of the insulating fence 137c, the third insulating fence 137c may be formed to have the air gap AG. The air gap AG is not exposed to the outside.

According to at least one example embodiment of inventive concepts, the insulating fences 137 of FIGS. 2A and 2B may have a width that is smaller than that of the insulating fences 135 of FIGS. 1A and 1B. Except for this difference, the line patterns 110, the insulating fences 137, the insulating patterns 145, and the conductive patterns 150 may be configured to have substantially the same features as those described with reference to FIGS. 1A and 1B. The difference in width may be substantially equivalent to a width of the insulating pattern 145 provided on the side surface of the insulating fence 137.

According to at least one example embodiment of inventive concepts, the insulating fences 137 and the insulating patterns 145 may be provided to isolate electrically the conductive patterns 150 from each other. Since the insulating fence 137 has a width that is smaller, by the width of the insulating pattern 145 provided on the side surface of the insulating fence 137, than the insulating fences 135 of FIGS. 1A and 1B, it is unnecessary to reduce a size of each conductive pattern 150. Accordingly, it is possible to enhance an electrical isolation between the conductive patterns 150 without an increase in electrical resistance of the conductive patterns 150, and thereby, improve electric reliability of the conductive patterns 150.

FIGS. 3A through 8A are plan views illustrating a method of fabricating a semiconductor device, according to at least one example embodiment of inventive concepts, and FIGS. 3B through 8B are sectional views taken along lines I-I' of FIGS. 3A through 8A, respectively.

Figure 3A:
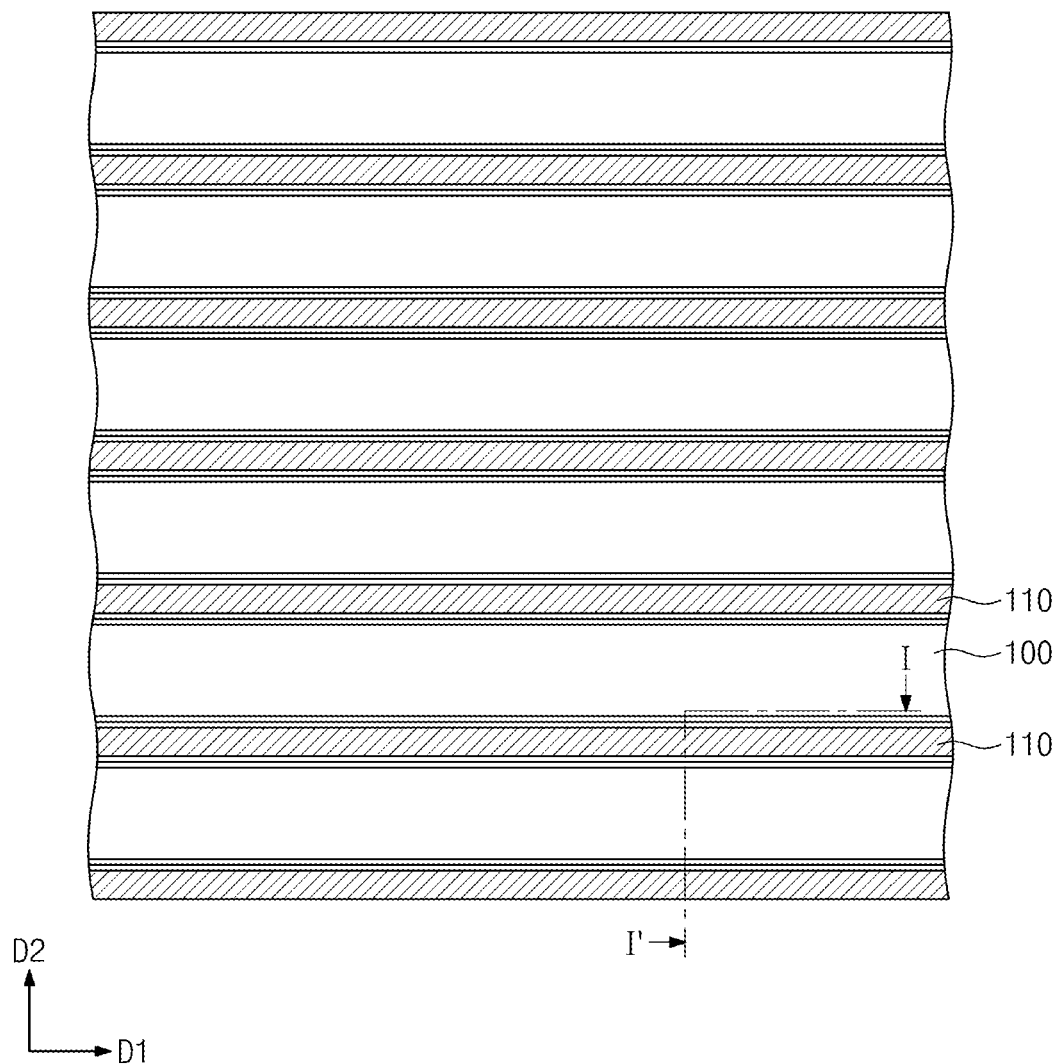
Figure 3B:
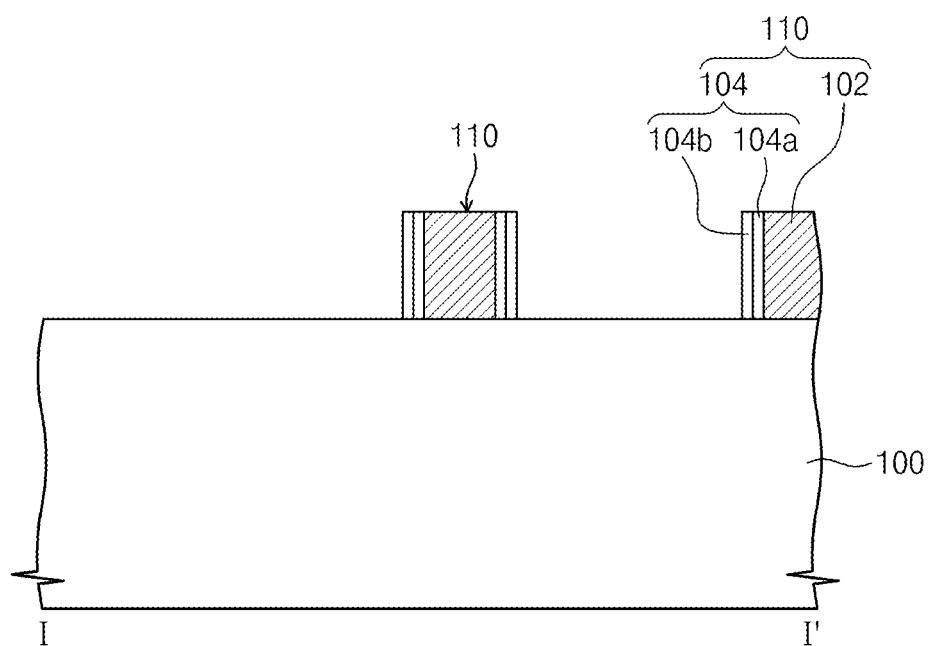

Referring to FIGS. 3A and 3B, line patterns 110 may be formed on a substrate 100 to extend along a first direction D1.

The formation of the line patterns 110 may include forming conductive lines 102, which may be elongated along the first direction D1 and be spaced apart from each other in a second direction D2, and forming spacers 104 on side surfaces of the conductive lines 102. The spacers 104 may be formed to include at least two layers or have a multi-layered structure. The second direction D2 may be perpendicular to the first direction D1.

The conductive line 102 may include doped polysilicon, metals, and/or metal compounds, and the spacers 104 may include oxide, nitride, and/or oxynitride. In the case where each of the spacers 104 has a multi-layered structure, each of the spacers 104 may include an oxide layer 104a and a nitride layer 104b.

Figure 4A:
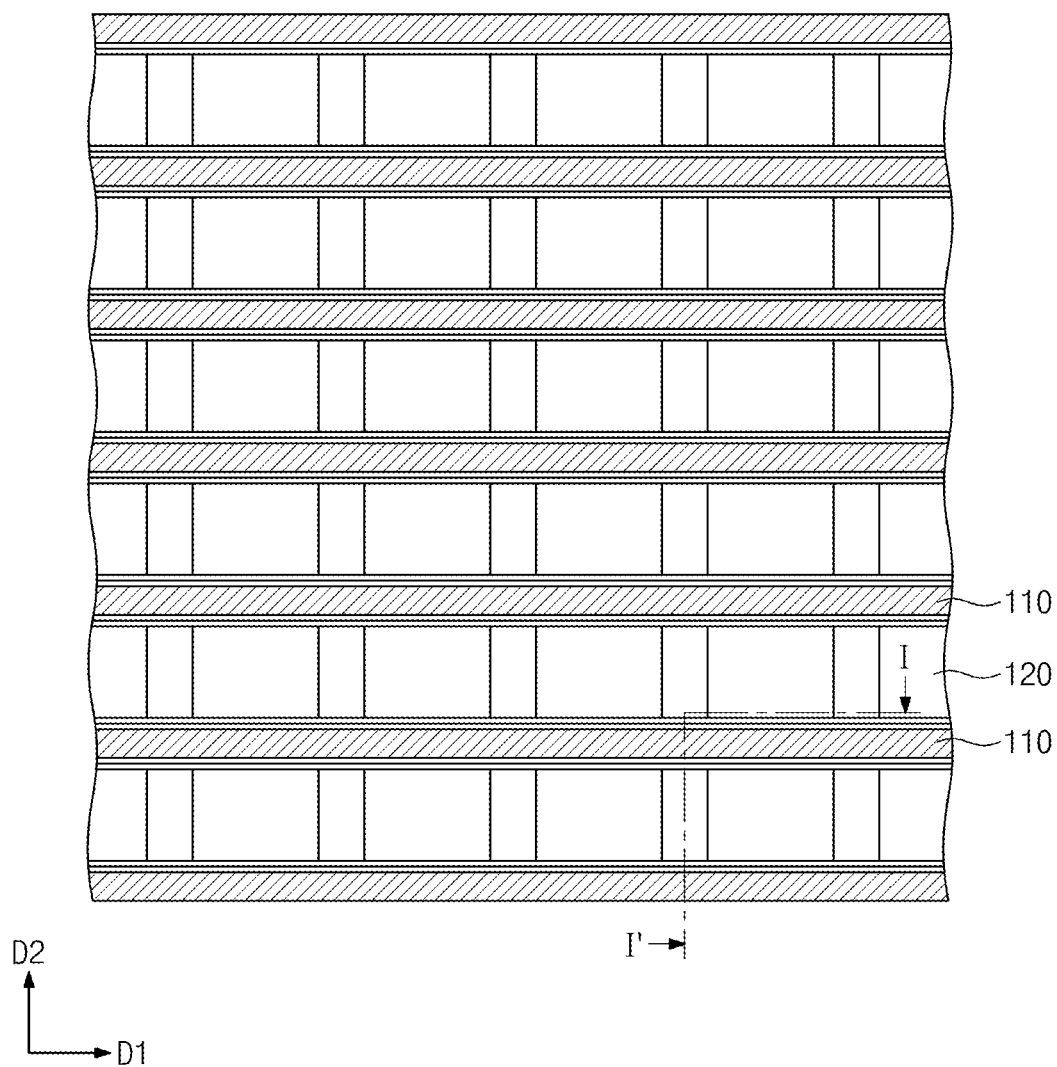
Figure 4B:
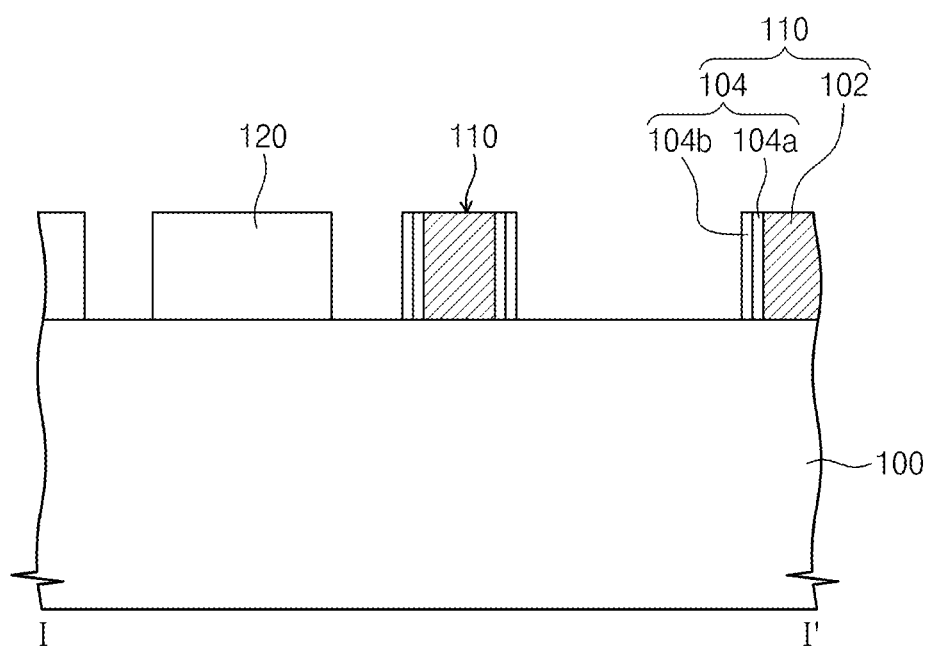

Referring to FIGS. 4A and 4B, sacrificial patterns 120 may be formed on the substrate 100. The sacrificial patterns 120 may be formed spaced apart from each other in the first direction D1 between the line patterns 110.

The sacrificial patterns 120 may include a material having an etch selectivity with respect to the line patterns 110, when an etchant is used to etch sacrificial patterns 120. For example, the sacrificial patterns 120 may include oxide (e.g., silicon oxide).

Figure 5A:
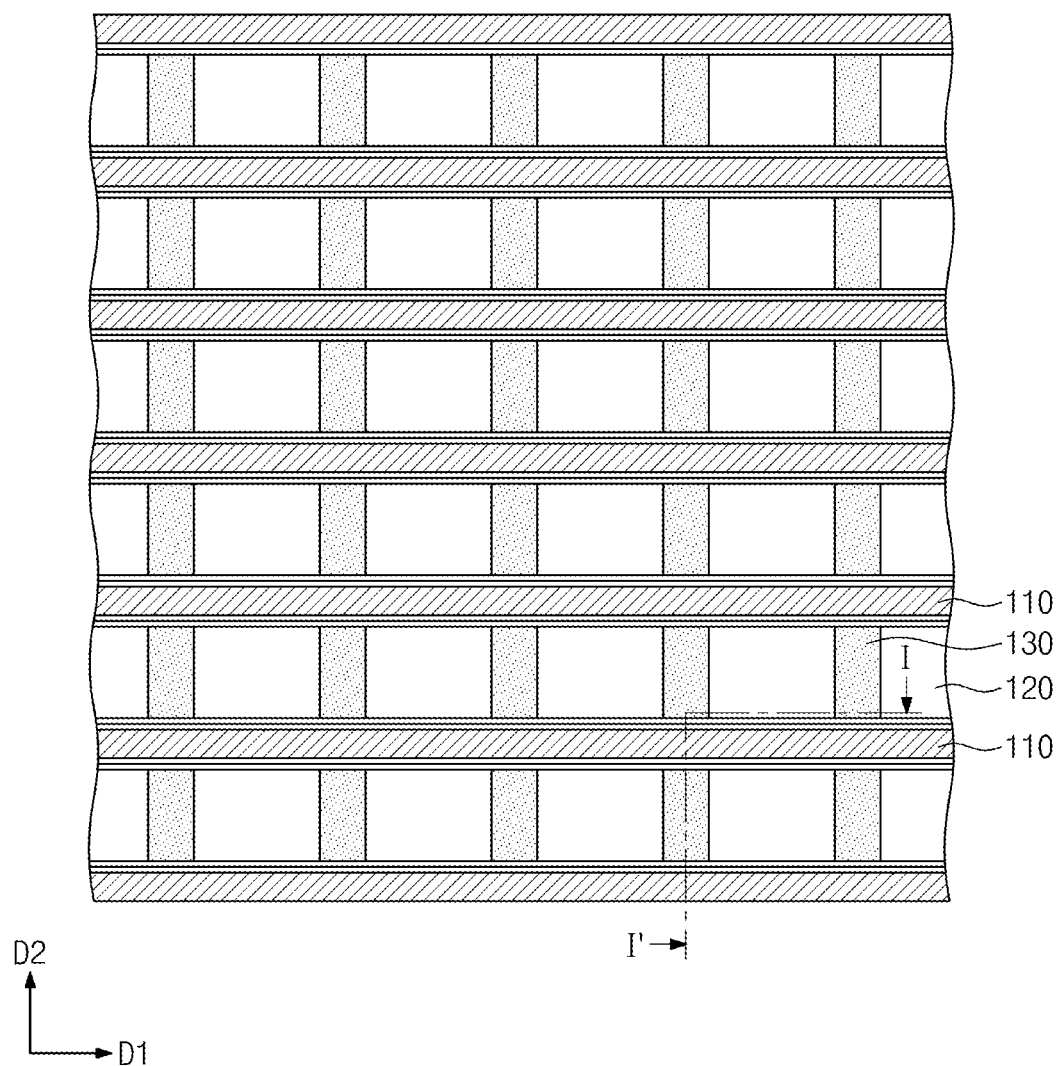
Figure 5B:
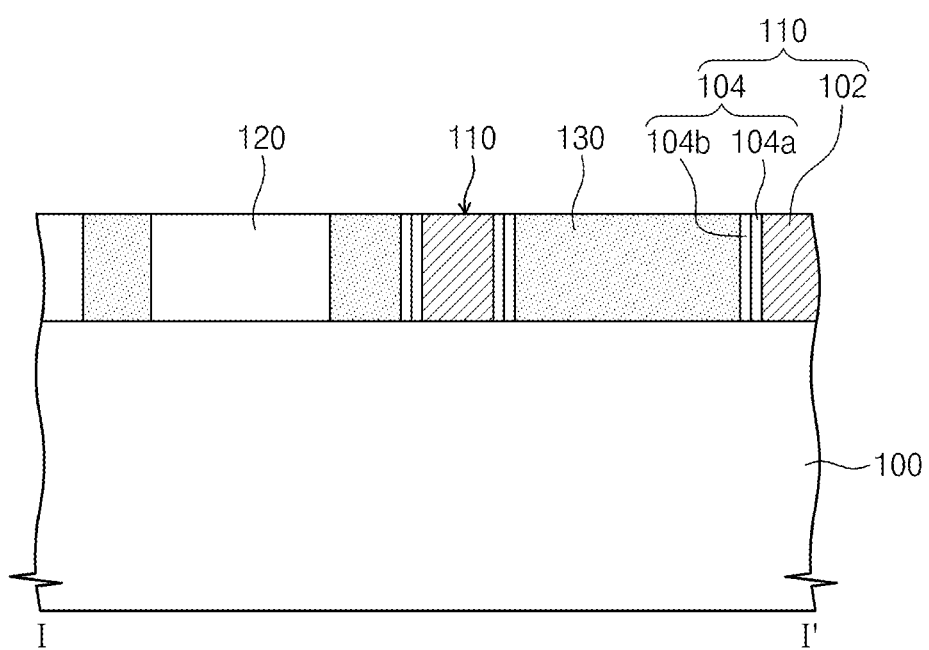

Referring to FIGS. 5A and 5B, preliminary insulating fences 130 may be formed between each pair of the line patterns 110 to fill spaces defined by the sacrificial patterns 120. The preliminary insulating fences 130 and the sacrificial patterns 120 may be alternatingly arranged.

In at least one example embodiment, the formation of the preliminary insulating fences 130 may include forming a silicon nitride layer on the line patterns 110 and the sacrificial patterns 120 using a chemical vapor deposition process, and then, polishing the silicon nitride layer to expose top surfaces of the line patterns 110. Accordingly, the preliminary insulating fences 130 may have top surfaces that are substantially coplanar with those of the line patterns 110.

Figure 6A:
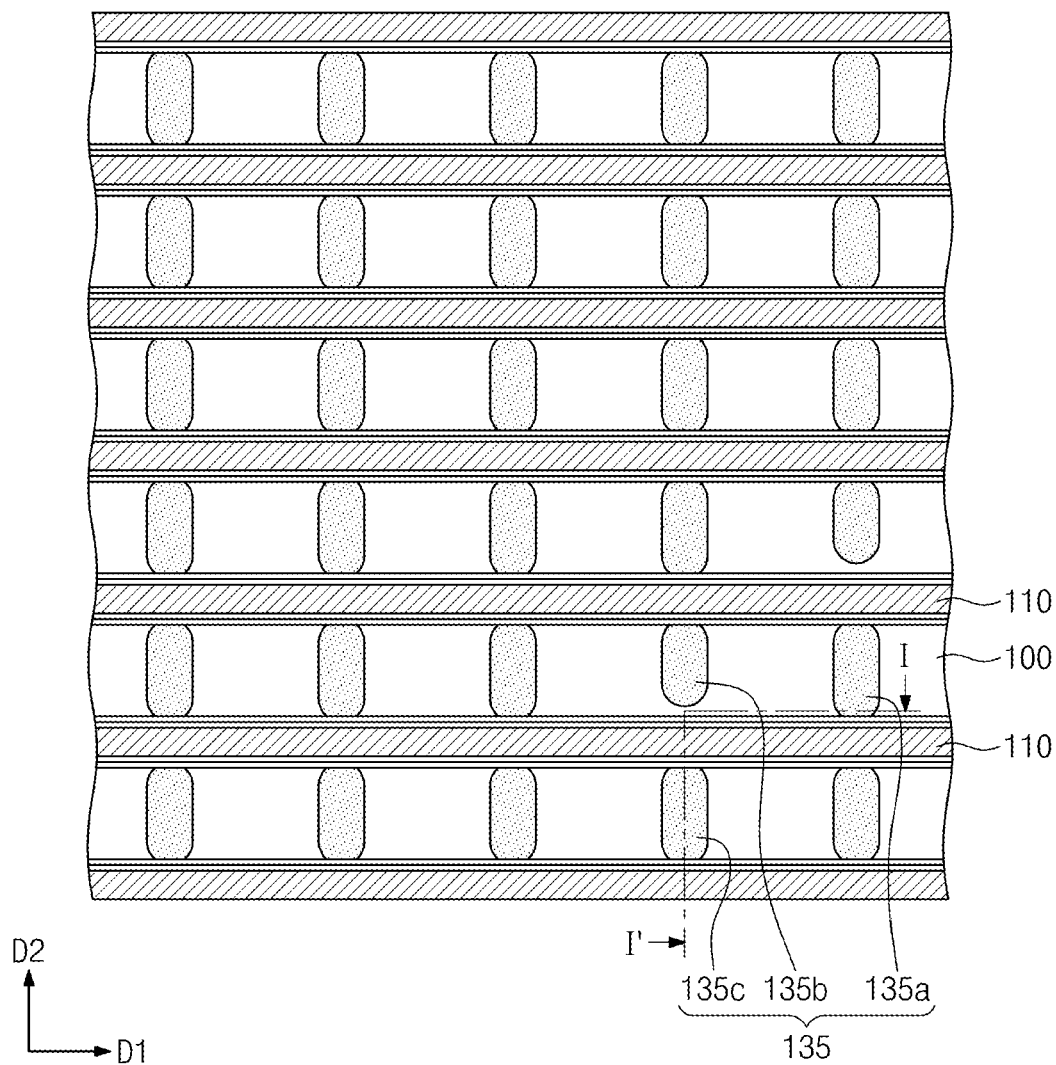
Figure 6B:
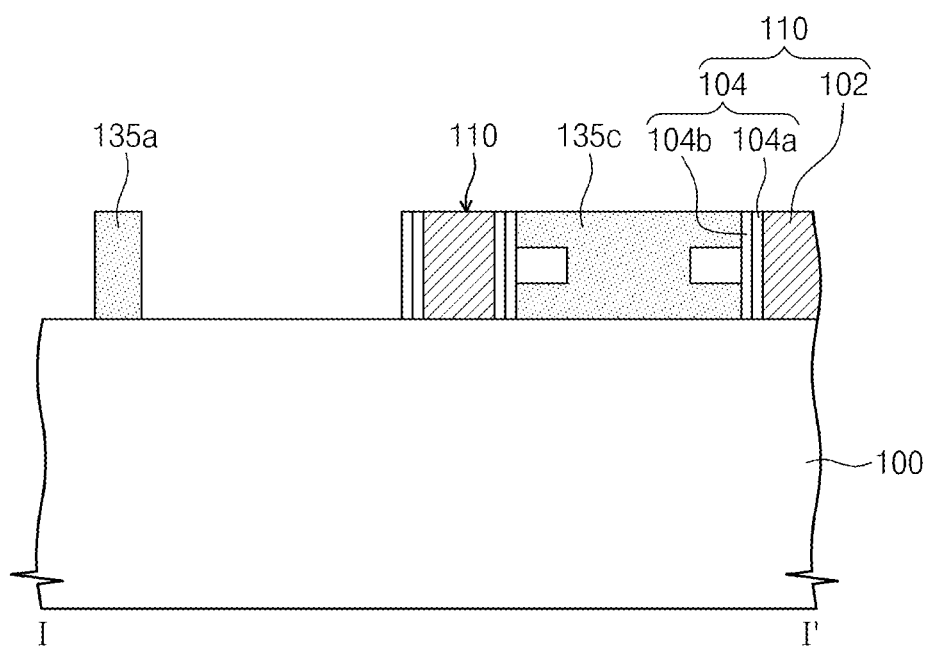

Referring to FIGS. 6A and 6B, the sacrificial patterns 120 may be removed.

In at least one example embodiment, the removal of the sacrificial patterns 120 may be performed using a wet etching process. As the result of the wet etching process, the preliminary insulating fences 130 may be partially etched during the removal of the sacrificial patterns 120, thereby forming insulating fences 135. The insulating fences 135 may include at least one of first, second, and third insulating fences 135a, 135b, and 135c.

According to at least one example embodiment of inventive concepts, as the result of the wet etching process, corners of the preliminary insulating fences 130 may be partially etched to form the first insulating fences 135a. Empty spaces may be formed between the corners of the first insulating fences 135a and the side surfaces of the line patterns 110.

According to at least one example embodiment of inventive concepts, as the result of the wet etching process, end portions of the preliminary insulating fences 130 may be etched to form the second insulating fences 135b. The end portion of the second insulating fence 135b may be spaced apart from the side surface of the line pattern 110.

According to at least one example embodiment of inventive concepts, as the result of the wet etching process, the side surfaces of the preliminary insulating fences 130 may be partially etched to form the third insulating fences 135c.

Figure 7A:
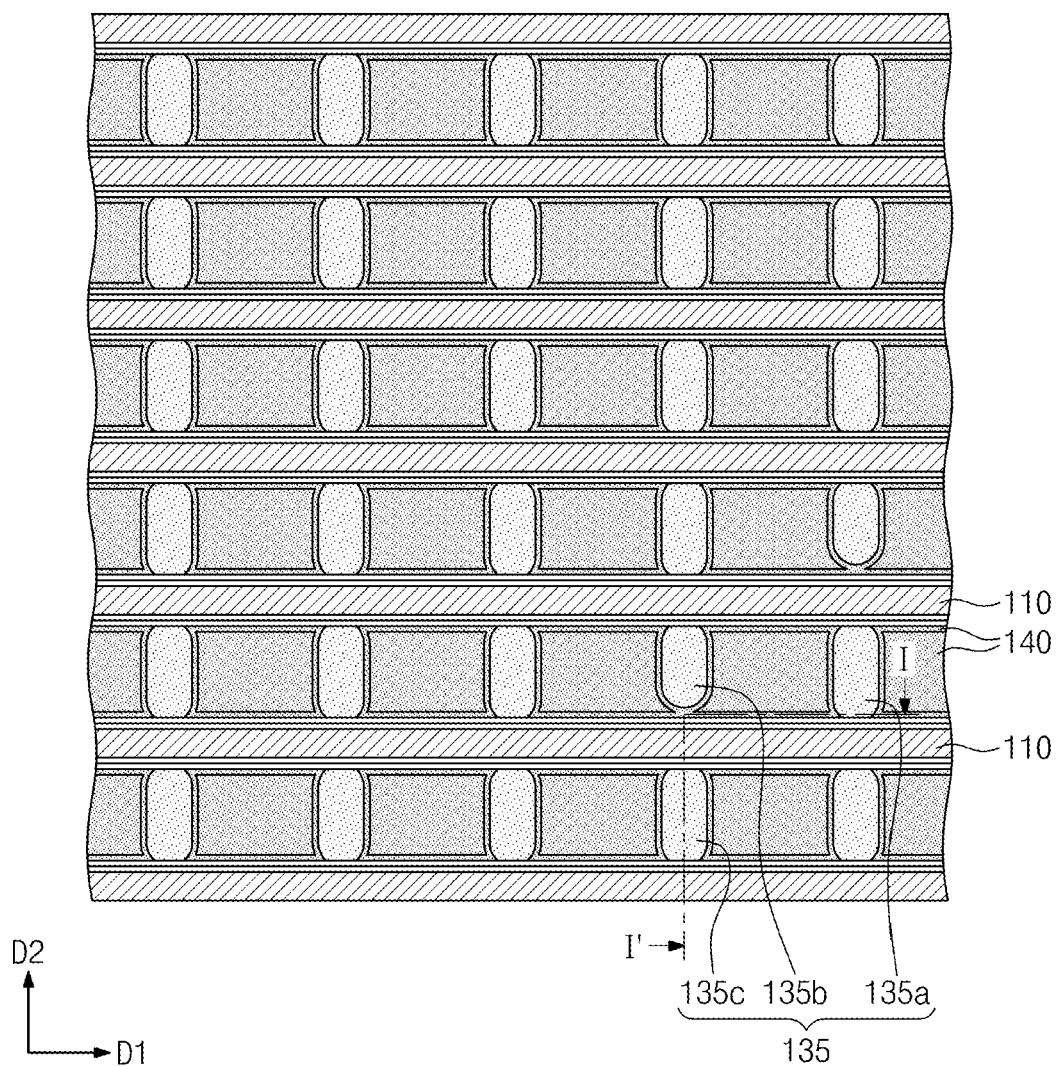
Figure 7B:
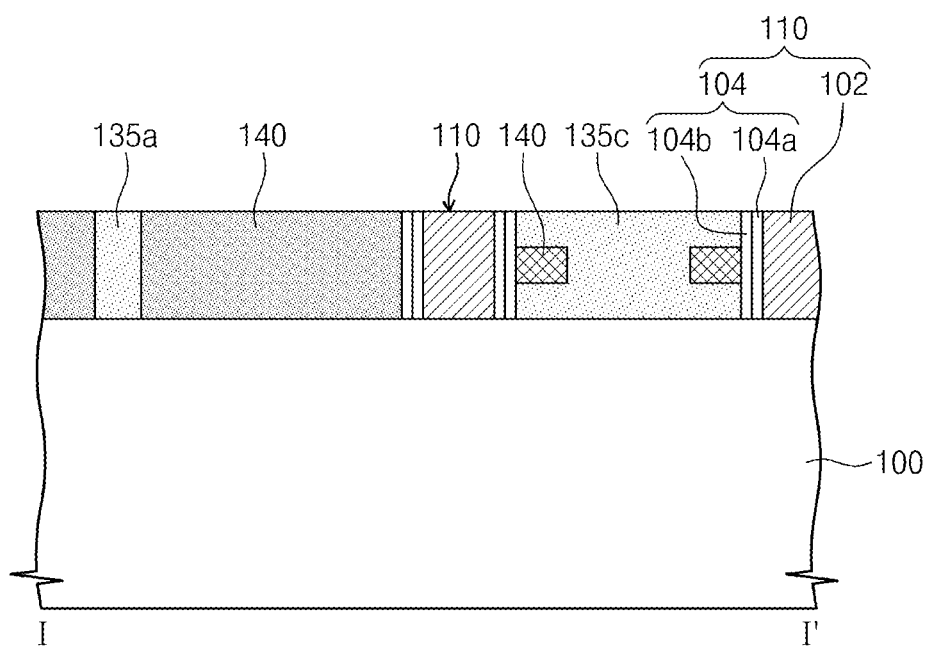

Referring to FIGS. 7A and 7B, an insulating layer 140 may be conformally formed on the substrate 100 provided with the line patterns 110 and the insulating fences 135. According to at least one example embodiment of inventive concepts, the insulating layer 140 may include a silicon nitride layer, which may be formed using an atomic layer deposition process.

According to at least one example embodiment of inventive concepts, the insulating layer 140 may be formed to fill the empty spaces between the corners of the first insulating fences 135a and the side surfaces of the line patterns 110.

According to at least one example embodiment of inventive concepts, the insulating layer 140 may be formed to fill an empty space between the end portion of the second insulating fence 135b and the side surface of the line pattern 110.

According to at least one example embodiment of inventive concepts, the insulating layer 140 may be formed to fill an etched portion of the third insulating fences 135c.

Figure 8A:
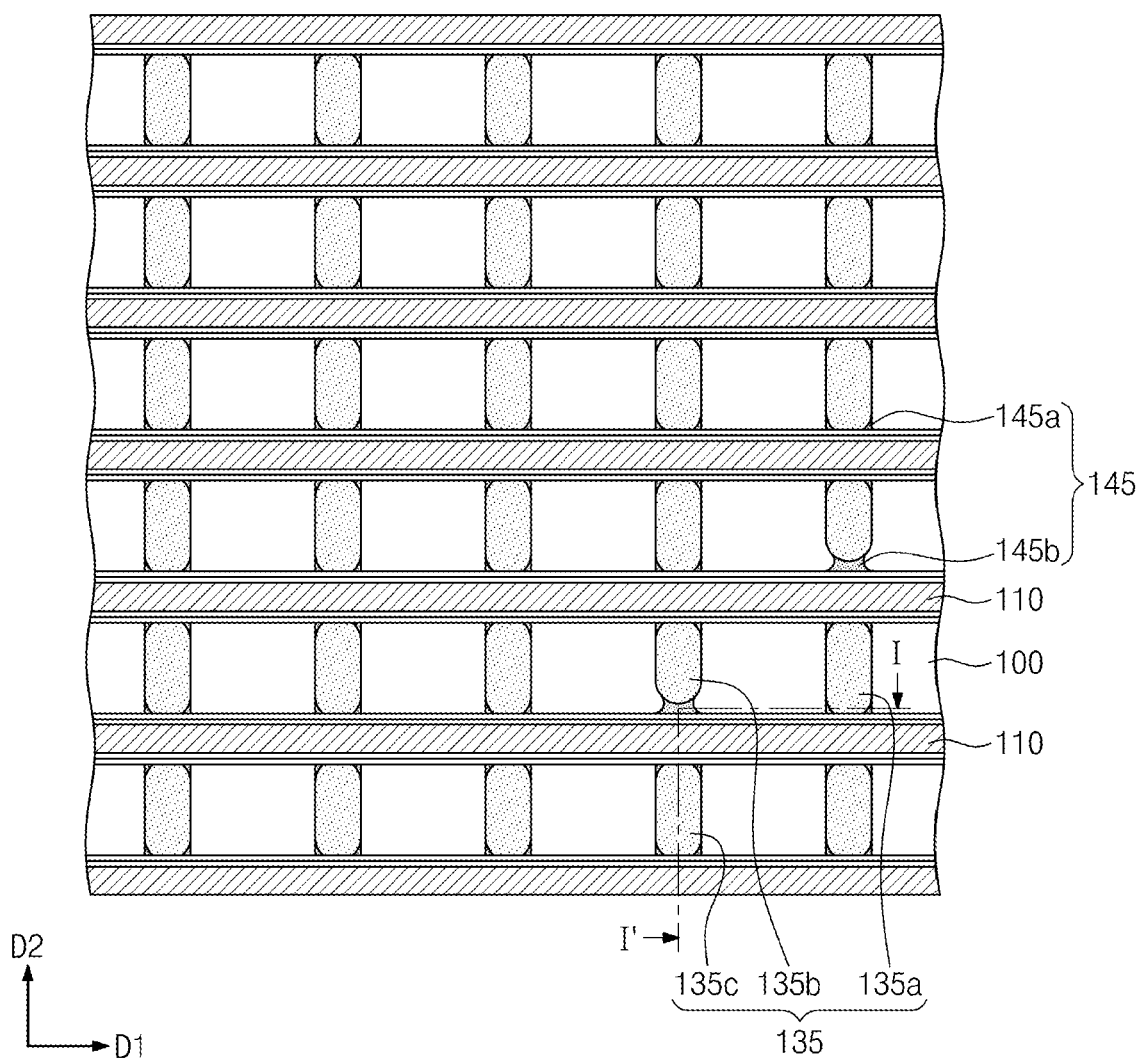
Figure 8B:
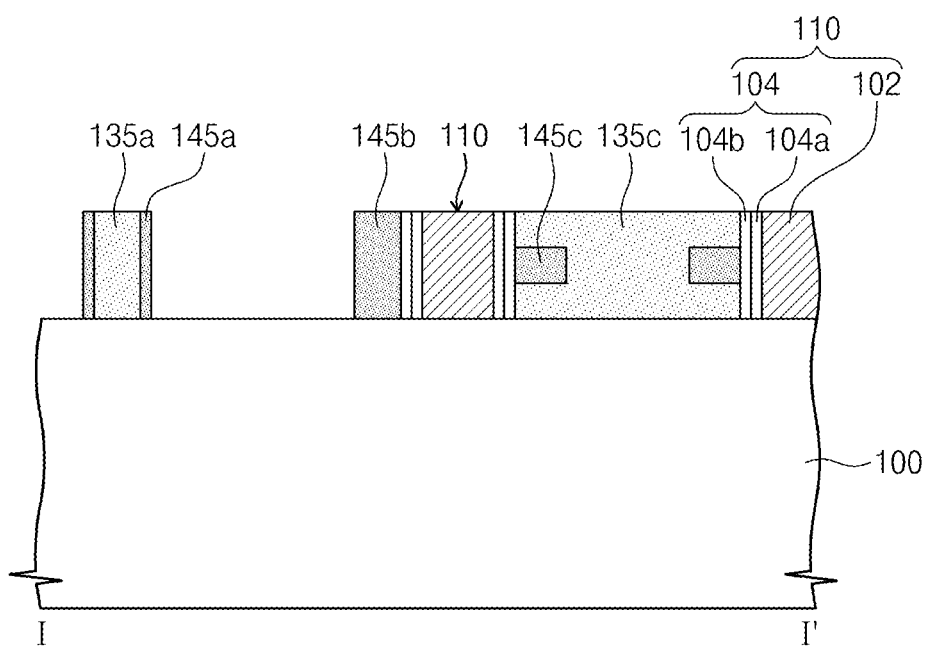

Referring to FIGS. 8A and 8B, the insulating layer 140 may be etched to form insulating patterns 145. The formation of the insulating patterns 145 may include isotropically etching the insulating layer 140. The insulating patterns 145 may include at least one of first, second, and third insulating patterns 145a, 145b, and 145c.

According to at least one example embodiment of inventive concepts, each of the first insulating patterns 145a may be formed between the corner of the first insulating fence 135a and the side surface of the line pattern 110. The side surface of each of the first insulating patterns 145a may be substantially coplanar with that of the corresponding one of the first insulating fences 135a.

According to at least one example embodiment of inventive concepts, each of the second insulating patterns 145b may be formed between the end portion of the second insulating fence 135b and the side surface of the line pattern 110. The side surface of each of the second insulating patterns 145b may be substantially coplanar with that of the corresponding one of the second insulating fences 135b.

According to at least one example embodiment of inventive concepts, each of the third insulating patterns 145c may be formed in the etched portion of the corresponding one of the third insulating fences 135c. The side surface of each of the third insulating patterns 145c may be substantially coplanar with that of the corresponding one of the third insulating fences 135c.

Referring back to FIGS. 1A and 1B, conductive patterns 150 may be formed to fill spaces defined by the line patterns 110 and the insulating fences 135.

The conductive patterns 150 and the insulating fences 135 may be alternatingly arranged between each pair of the line patterns 110. The conductive patterns 150 may include doped polysilicon, metals and/or metal compounds. The conductive patterns 150 may include at least one of tungsten, aluminum, titanium, tantalum, titanium nitride, tantalum nitride, tungsten nitride, or metal silicide.

According to at least one example embodiment of inventive concepts, due to the presence of the insulating fences 135 and the insulating patterns 145, it is possible to isolate electrically the conductive patterns 150 from each other. Since the side surfaces of the insulating patterns 145 are substantially coplanar with those of the insulating fences 135, it is unnecessary to reduce a size of each conductive pattern 150. Accordingly, it is possible to enhance an electrical isolation between the conductive patterns 150 without an increase in electrical resistance of the conductive patterns 150, and thereby, improve electric reliability of the conductive patterns 150.

Figure 9A:
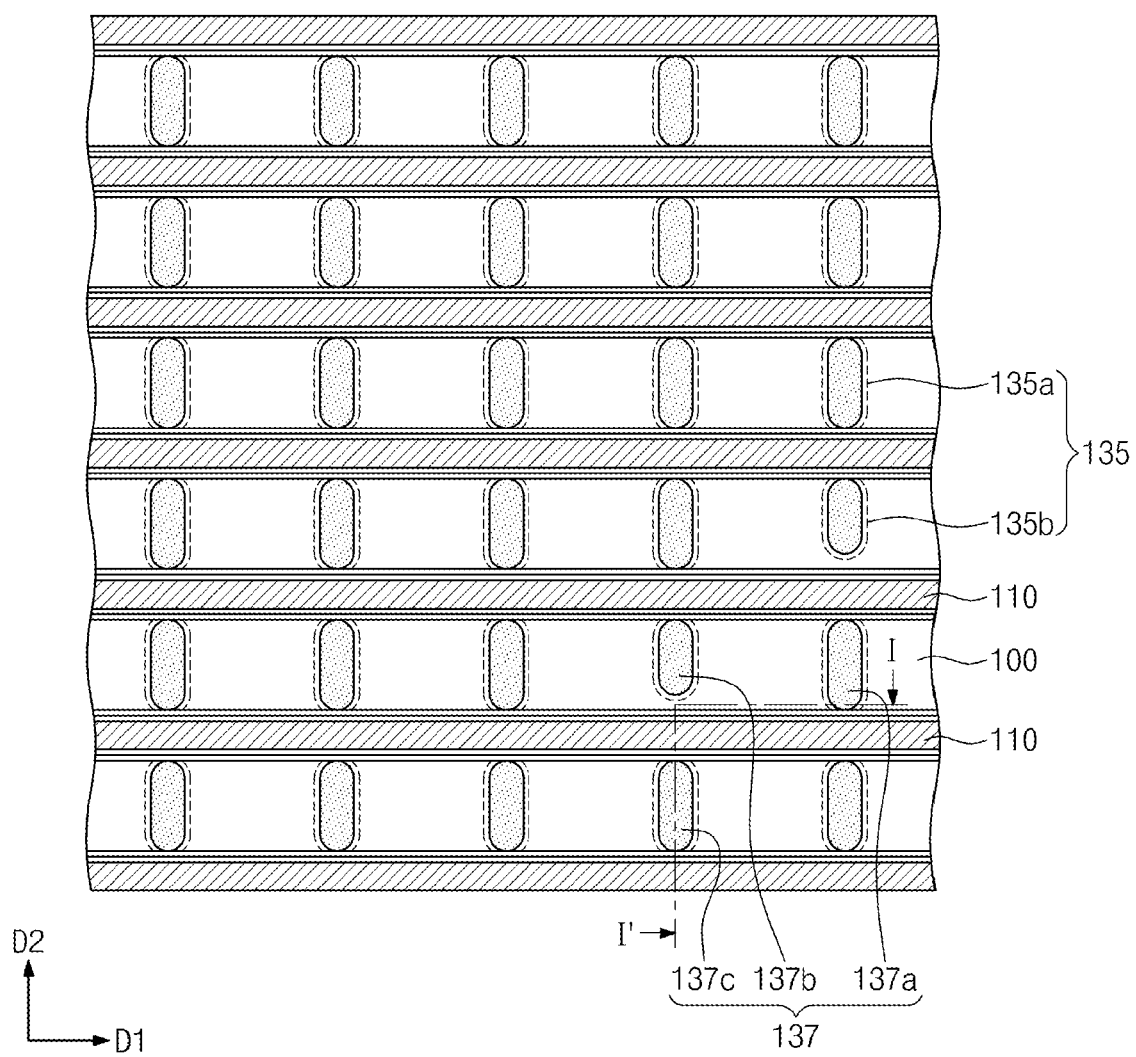
FIGS. 9A and 10A are plan views illustrating a method of fabricating a semiconductor device, according to at least one example embodiment of inventive concepts.
Figure 9B:
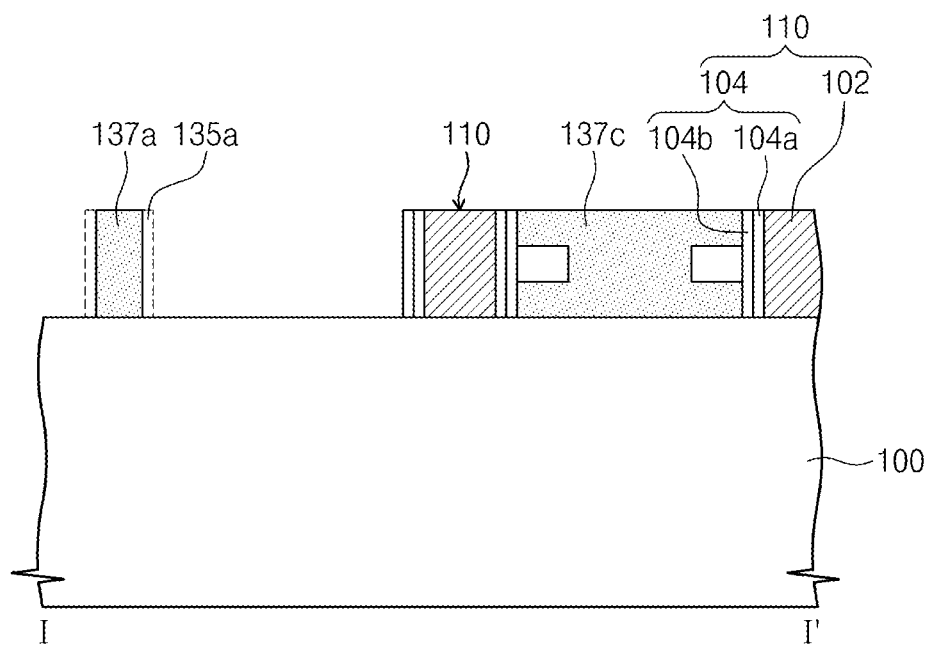
FIGS. 9B and 10B are sectional views taken along lines I-I' of FIGS. 9A and 10A, respectively.
Figure 10A:
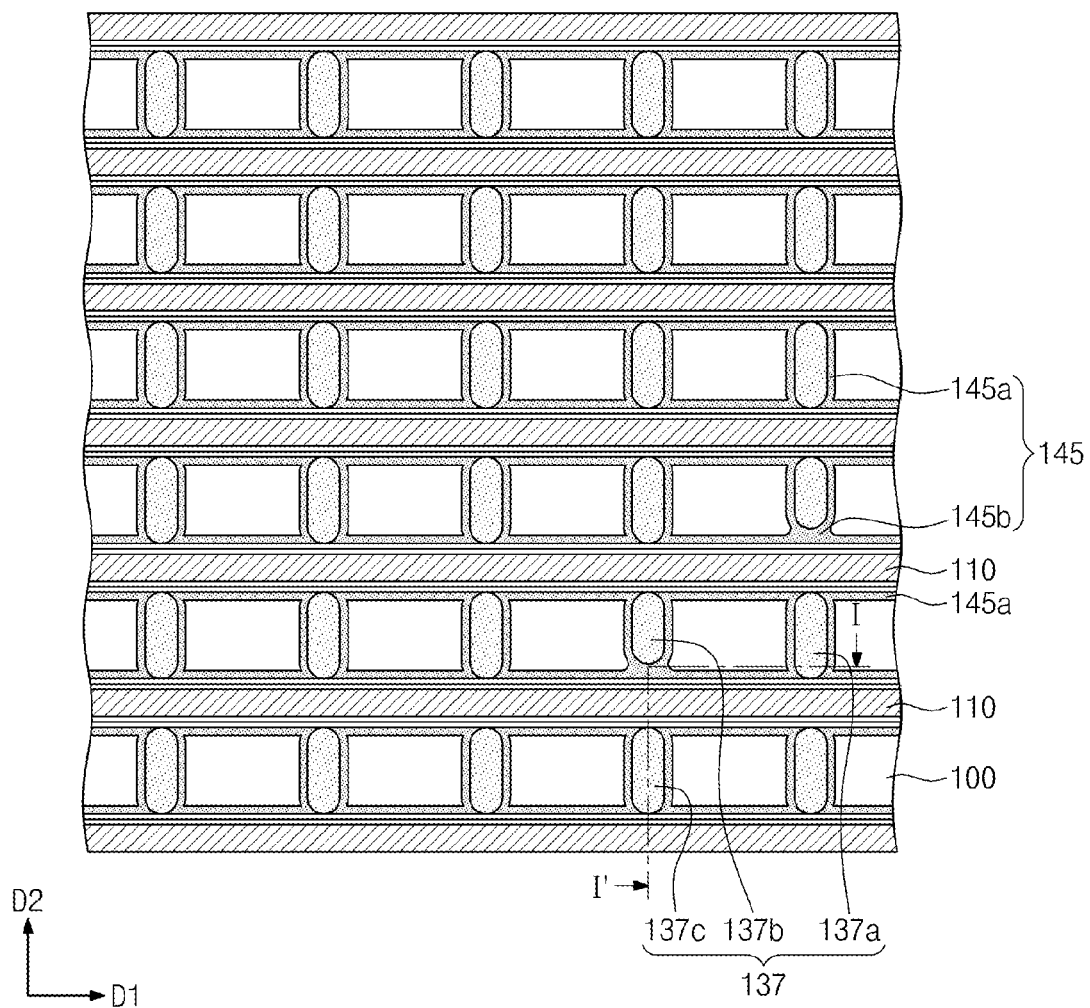
Figure 10B:
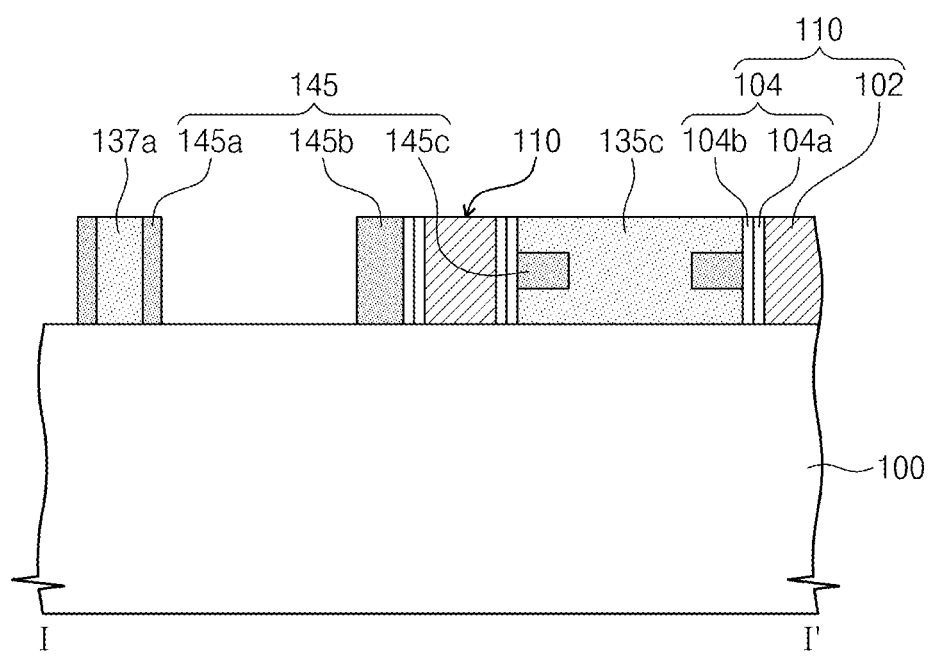

FIGS. 9A and 10A are plan views illustrating a method of fabricating a semiconductor device, according to at least one example embodiment of inventive concepts, and FIGS. 9B and 10B are sectional views taken along lines I-I' of FIGS. 9A and 10A, respectively.

Referring to FIGS. 9A and 9B, line patterns 110 and preliminary insulating fences 135 may be formed on a substrate 100. The formation of the line patterns 110 and preliminary insulating fences 135 may be performed using a process similar to that of the previous embodiments described with reference to FIGS. 3A through 6A and FIGS. 3B through 6B. However, according to the at least one embodiment, the insulating fences 135 of FIGS. 6A and 6B may be used as the preliminary insulating fences 135.

Next, the preliminary insulating fences 135 may be isotropically etched to form insulating fences 137 that are smaller than the preliminary insulating fences 135. The insulating fences 137 may include at least one of first, second, and third insulating fences 137a, 137b, and 137c.

Referring to FIGS. 10A and 10B, insulating patterns 145 may be formed on side surfaces of the insulating fences 137 and the line patterns 110.

According to at least one example embodiment of inventive concepts, each of the insulating patterns 145 may be formed to have a width that is substantially equivalent to a width of the etched portion of the preliminary insulating fence 135 etched in the etching step of FIGS. 9A and 9B.

The formation of the insulating patterns 145 may include conformally forming an insulating layer (not shown) on the substrate 100 provided with the insulating fences 137 and the line patterns 110. The insulating layer may include a silicon nitride layer, which may be formed using an atomic layer deposition process. Thereafter, the insulating layer may be anisotropically etched to form the insulating patterns 145 on the side surfaces of the insulating patterns 145 and the line patterns 110. In plain view, each of the insulating patterns 145 may be formed along an inner side surface of a space defined by a pair of the line patterns 110 and a pair of the insulating patterns 145 there between. The insulating patterns 145 may include at least one of first, second, and third insulating patterns 145a, 145b, and 145c.

According to at least one example embodiment of inventive concepts, the first insulating patterns 145a may be formed to fill the empty spaces between the corners of the first insulating fences 137a and the side surfaces of the line patterns 110. In this case, each of the first insulating patterns 145a is formed along the inner side surface of the space defined by the pair of the line patterns 110 and a pair of the insulating patterns 145 provided there between, it may have a closed-loop structure.

According to at least one example embodiment of inventive concepts, the second insulating pattern 145b may be formed to fill an empty space between the end portion of the second insulating fence 137b and the side surface of the line pattern 110. In this case, adjacent two of the second insulating patterns 145b may be connected to each other through the empty space.

According to at least one example embodiment of inventive concepts, the third insulating pattern 145c may be formed to fill the etched portion of the third insulating fence 137c.

In at least one example embodiment, each of the insulating patterns 145 may be formed to have a width that is substantially equivalent to a width of the etched portion of the preliminary insulating fence 137 etched in the etching step of FIGS. 9A and 9B.

Referring back to FIGS. 2A and 2B, conductive patterns 150 may be formed in the spaces provided with the insulating patterns 145, respectively. The formation of the conductive patterns 150 may include filling the spaces with a conductive material. The conductive material may include doped polysilicon, metals and/or metal compounds. The conductive material may include at least one of tungsten, aluminum, titanium, tantalum, titanium nitride, tantalum nitride, tungsten nitride, or metal silicide.

In at least one example embodiment, the insulating fences 137 and the insulating patterns 145 may be provided to isolate electrically the conductive patterns 150 from each other. Since each of the insulating patterns 145 has a width that is substantially equivalent to a width of the etched portion of the preliminary insulating fence 135 in the etching step of FIGS. 9A and 9B, it is unnecessary to reduce a size of each conductive pattern 150. Accordingly, it is possible to enhance an electrical isolation between the conductive patterns 150 without an increase in electrical resistance of the conductive patterns 150, and thereby, to improve electric reliability of the conductive patterns 150 or the semiconductor device.

FIGS. 11A through 21A are plan views illustrating a method of fabricating a semiconductor device, according to at least one example embodiment of inventive concepts. FIGS. 11B through 21B are sectional views taken along lines I-I' of FIGS. 11A through 21A, respectively, and FIGS. 11C through 21C are sectional views taken along lines II-II' of FIGS. 11A through 21A, respectively.

Figure 11A:
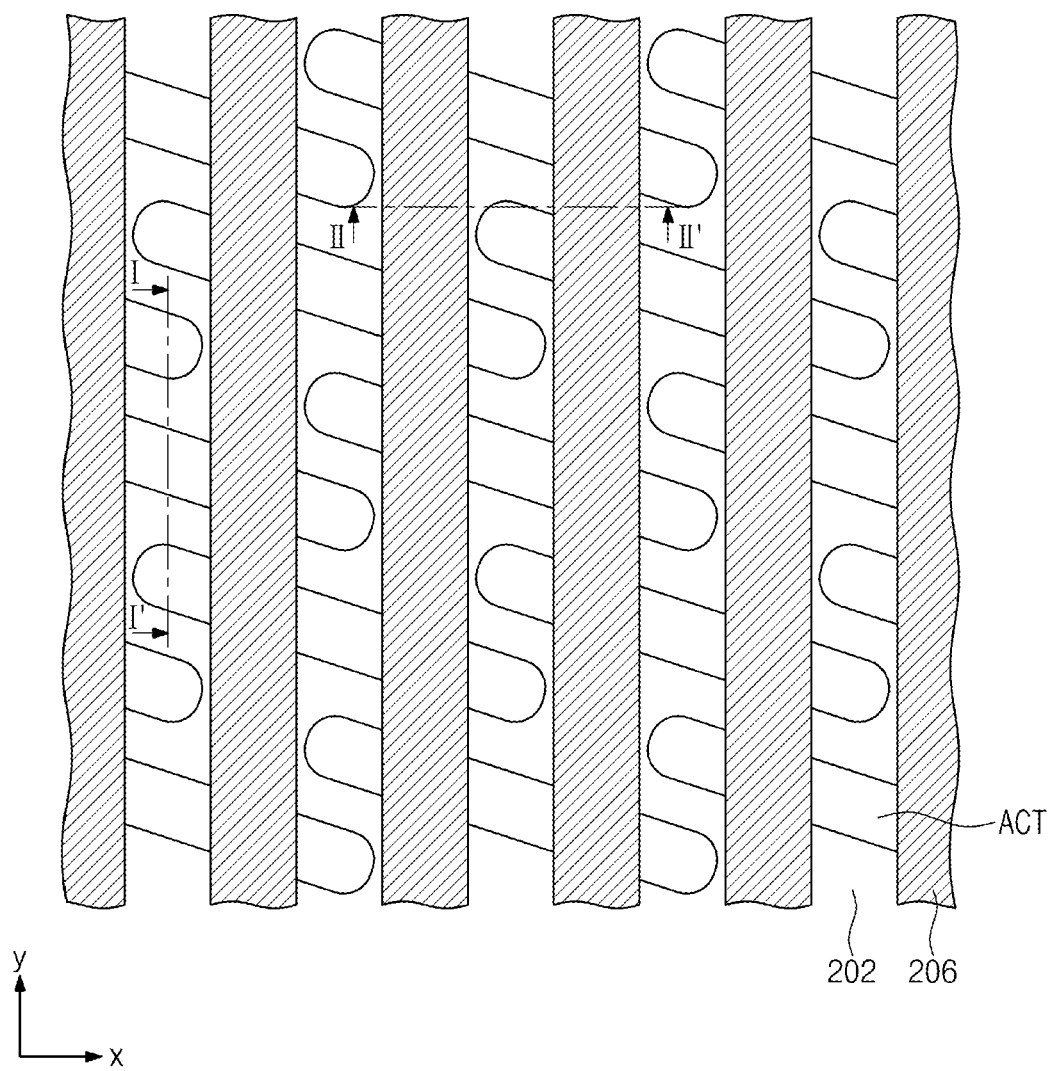
Figure 11B:
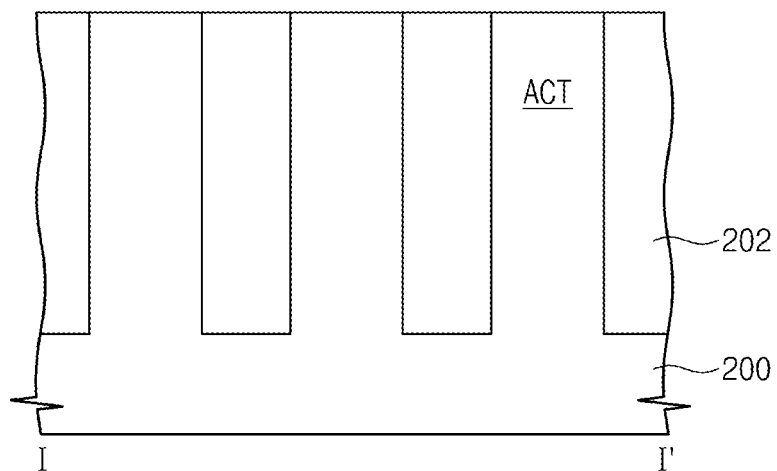
Figure 11C:
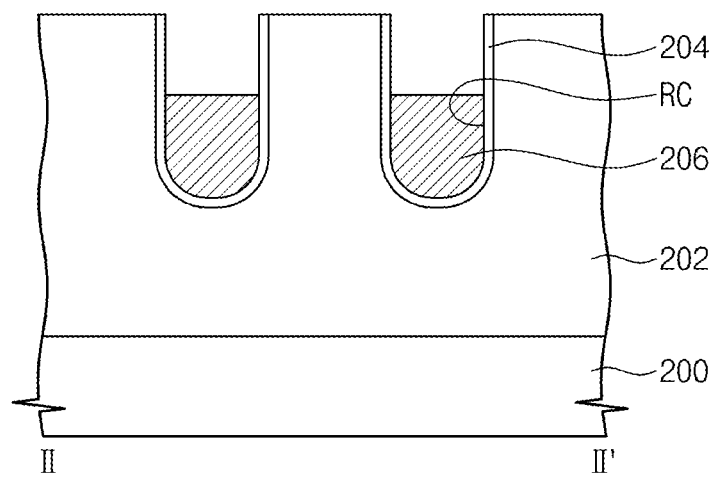

Referring to FIGS. 11A through 11C, a device isolation pattern 202 may be formed on a substrate 200 to define active regions ACT, and a gate insulating layer 204 and gate electrodes 206 may be formed on the substrate 200. The gate electrodes 206 may be formed to extend along a y-axis direction.

For example, the formation of the device isolation pattern 202 may include etching the substrate 200 to form a trench, and then, filling the trench with an insulating material. The insulating material may be an oxide layer (e.g., of silicon oxide).

Structure and arrangement of the active regions ACT will be described in more detail below, but example embodiments of inventive concepts are not be limited thereto.

In plain view, the active regions ACT may be arranged spaced apart from each other to form a plurality of rows and a plurality of columns. The rows may be parallel to an x-axis direction, and the columns may be parallel to a y-axis direction. In at least one example embodiment, the rows may include first, second and third rows that are adjacent to each other. Each of the active regions ACT constituting the first row may be provided between a corresponding pair of the active regions ACT constituting the second row. Each of the active regions ACT constituting the third row may be provided between a corresponding pair of the active regions ACT constituting the second row. Here, the active regions ACT constituting the first to third rows may be spaced apart from each other. In plain view, each of the active regions ACT may have an elliptical shape elongated along a specific direction. For example, a longitudinal axis of each active region ACT may be non-perpendicular and non-parallel to the x-axis direction.

The device isolation pattern 202 and the active regions ACT may be patterned to form recesses RC. For example, a pair of the recesses RC may be formed to cross each active region ACT. The recesses RC may be extended along the y-axis direction and be spaced apart from each other in the x-axis direction.

A thermal oxidation process or a deposition process may be performed to form the gate insulating layer 204 on the substrate 200 with the recesses RC. The gate insulating layer 204 may include oxide (e.g., silicon oxide).

Gate electrodes 206 may be formed by filling lower portions of the recesses RC with a conductive material. The gate electrode 206 may be formed to cover an inner surface of the recess RC provided with the gate insulating layer 204. For example, a portion of the active region ACT facing the inner surface of the recess RC may serve as a channel region of a transistor. This means that the channel region is provided to have a three-dimensional structure and thereby have an increased width within a given planar area.

The conductive material may include doped polysilicon, metals and/or metal compounds. The conductive material may include at least one of tungsten, aluminum, titanium, tantalum, titanium nitride, tantalum nitride, tungsten nitride, or metal silicide.

The gate electrodes 206 may be formed to have top surfaces that are lower than that of the substrate 200. Further, the gate electrodes 206 may be formed to have bottom surfaces that are higher than that of the device isolation pattern 202.

Figure 12A:
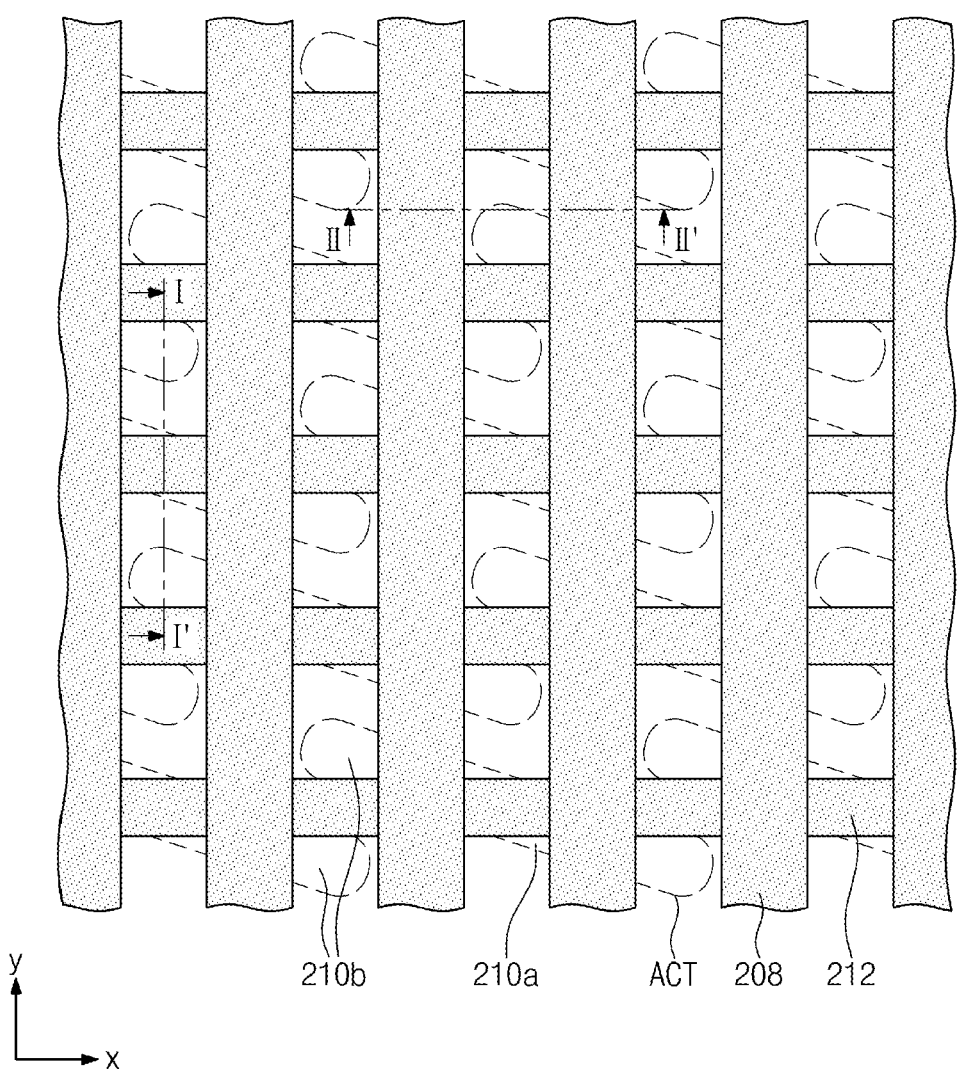
Figure 12B:
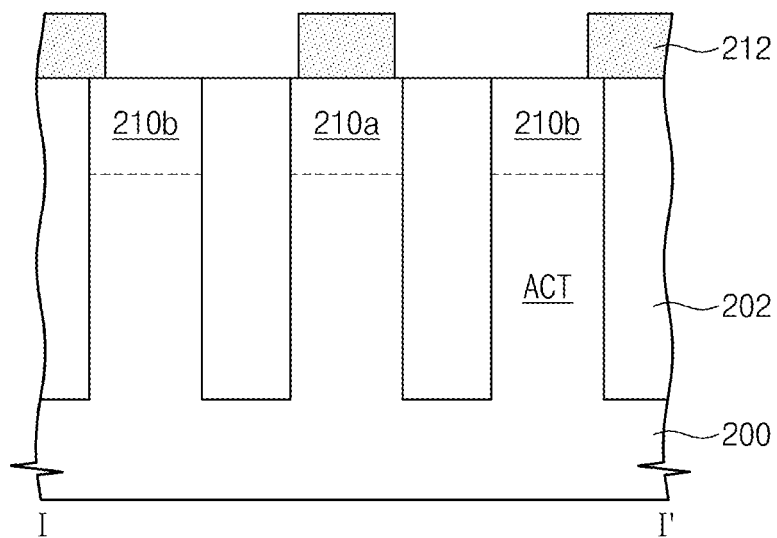
Figure 12C:
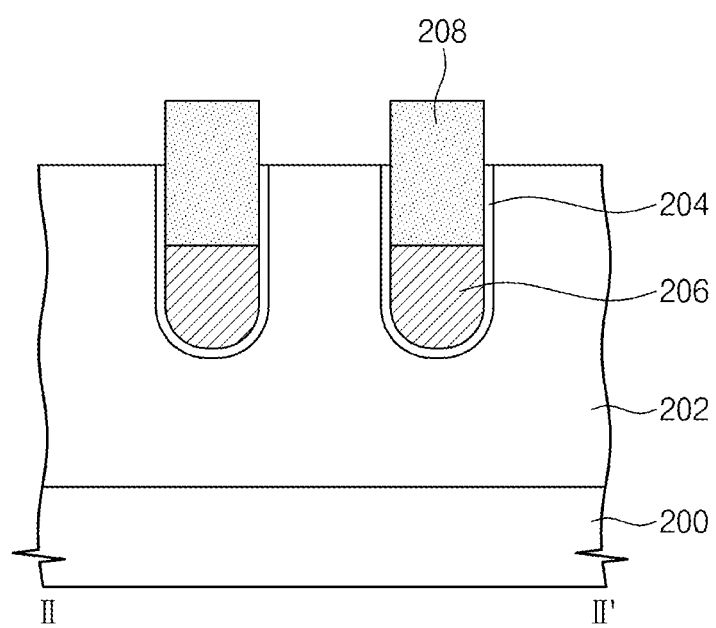

Referring to FIGS. 12A through 12C, gate capping insulating patterns 208 and lower insulating fences 212 may be formed on the substrate 200, and first and second impurity regions 210a and 210b may be formed in the substrate 200.

For example, the gate capping insulating patterns 208 may be formed to fill upper portions of the recesses RC provided with the gate electrodes 206. Further, the gate capping insulating patterns 208 may be formed to protrude upward from the substrate 200. The gate capping insulating patterns 208 may be formed of at least one of insulating materials including nitride (e.g., silicon nitride) or oxynitride (e.g., silicon oxynitride). Each of the gate capping insulating patterns 208 may be formed to have a shape extending along the y-axis direction. For example, each of the gate capping insulating patterns 208 may have a width that is substantially equivalent to that of the gate electrode 206.

Impurities may be injected into the active regions ACT exposed by the gate capping insulating patterns 208 to form the first and second impurity regions 210a and 210b. For example, the impurity injection may be performed using the gate capping insulating patterns 208 as an ion mask. In the case where a pair of the gate electrodes 206 are formed to cross each of the active regions ACT, the first impurity region 210a may be formed in the active region ACT between the pair of the gate electrodes 206 and a pair of the second impurity regions 210b may be formed in both end portions of the active region ACT.

For example, the first impurity region 210a may be formed in each active region ACT between the pair of the gate electrodes 206, and a pair of the second impurity regions 210b may be formed in both end portions, respectively, of each active region ACT. In other words, in plain view, the pair of the gate electrodes 206 may be formed between the pair of the second impurity regions 210b. Each gate electrode 206 and the first and second impurity regions 210a and 210b adjacent thereto may constitute a selection component (for example, a field effect transistor). As a result, a pair of the selection components may be formed in each active region ACT. Here, the pair of the selection component may share the first impurity region 210a. Since the gate electrode 206 is disposed in the recess RC, it is possible to increase a length (i.e., channel length) of the channel region within a given planar area. This makes it possible to suppress a short channel effect from occurring.

Next, lower insulating fences 212 may be formed between the gate capping insulating patterns 208. The lower insulating fences 212 to be disposed between the pair of the gate capping insulating patterns 208 may be arranged spaced apart from each other along the y-axis direction. The gate capping insulating patterns 208 may include nitride (for example, silicon nitride) or oxynitride (for example, silicon oxynitride). The lower insulating fences 212 may be formed to have top surfaces that are substantially coplanar with those of the gate capping insulating patterns 208.

The gate capping insulating patterns 208 and the lower insulating fences 212 may be formed to expose the second impurity regions 210b.

Figure 13A:
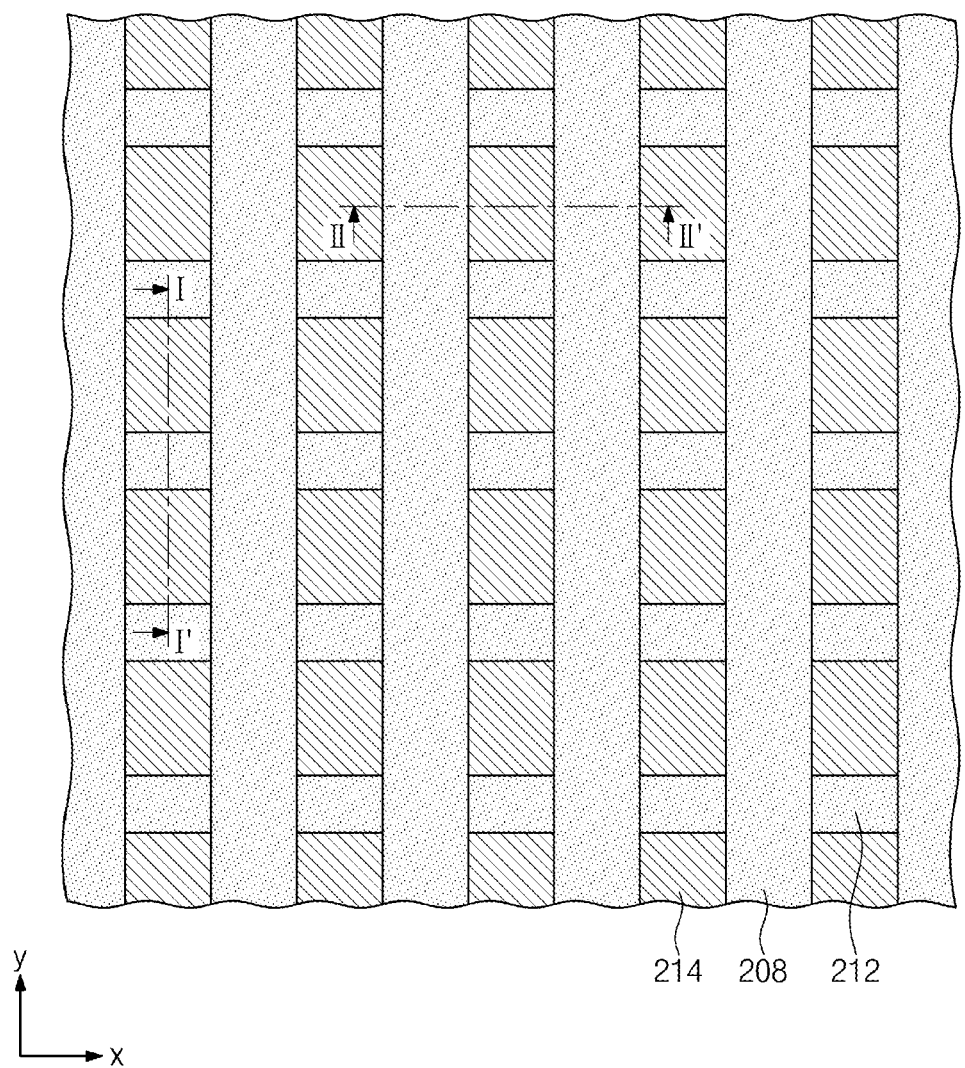
Figure 13B:
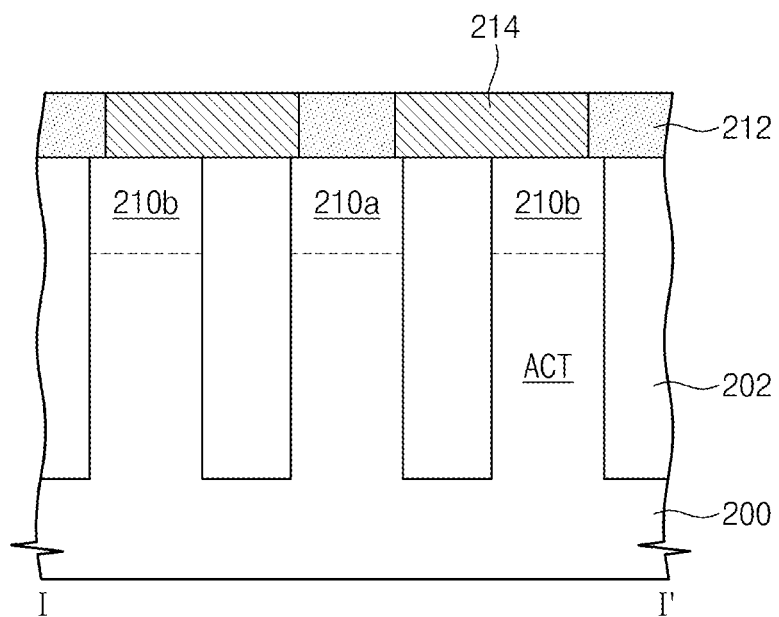
Figure 13C:
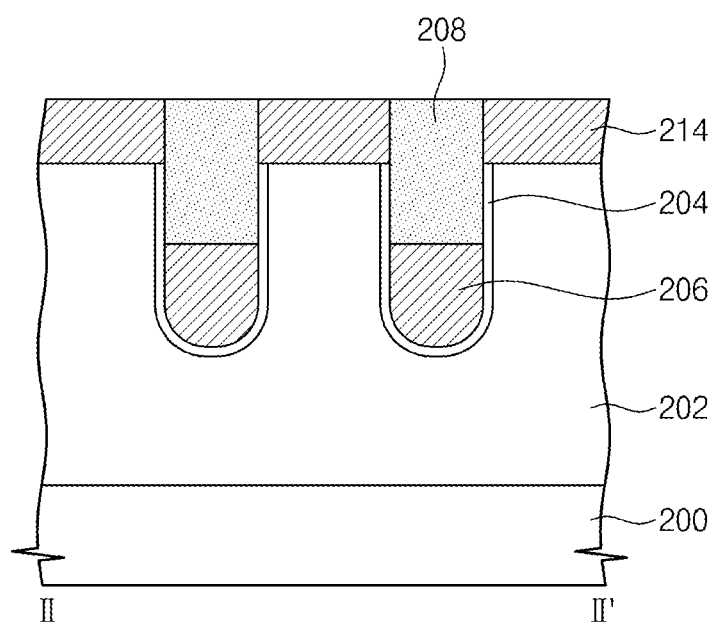

Referring to FIGS. 13A through 13C, conductive pads 214 may be formed on the exposed portions of the second impurity regions 210b, respectively.

The formation of the conductive pads 214 may include forming a conductive layer on the substrate 200 provided with the gate capping insulating patterns 208 and the lower insulating fences 212, and then, polishing the conductive layer to expose the gate capping insulating patterns 208 and the lower insulating fences 212. The conductive layer may include doped polysilicon, metals, or metal compounds. The conductive layer may include at least one of tungsten, aluminum, titanium, tantalum, titanium nitride, tantalum nitride, tungsten nitride, or metal silicide.

The conductive pads 214 may be formed to have top surfaces that are substantially coplanar with the top surfaces of the gate capping insulating patterns 208 and the lower insulating fences 212.

Figure 14A:
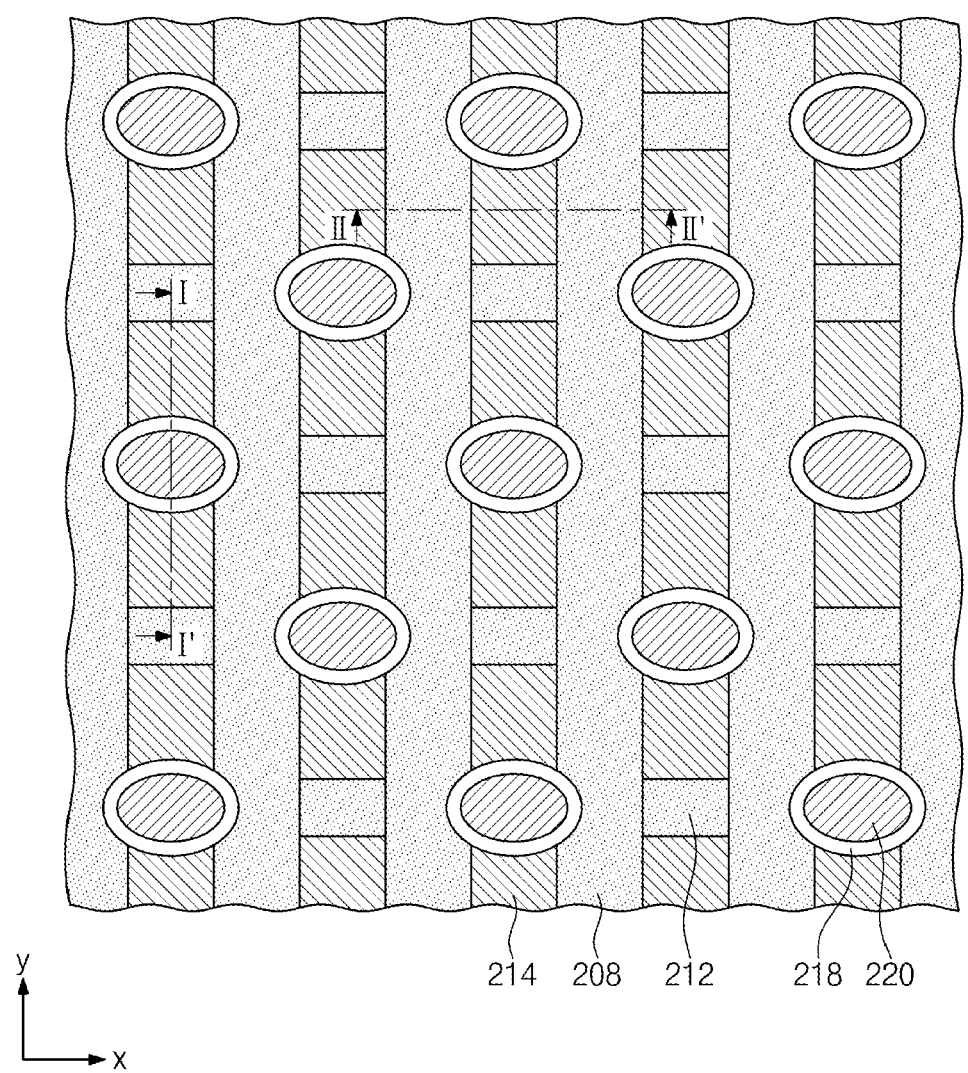
Figure 14B:
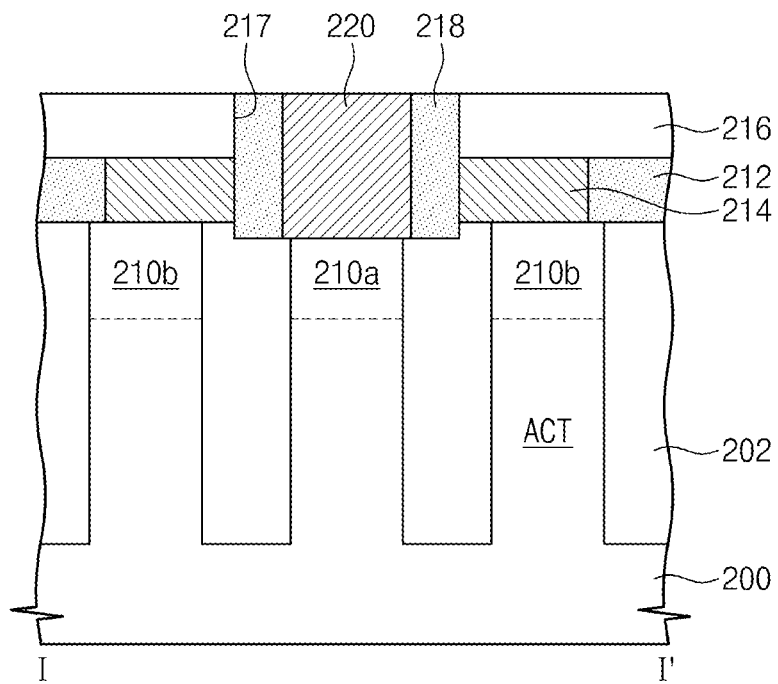
Figure 14C:
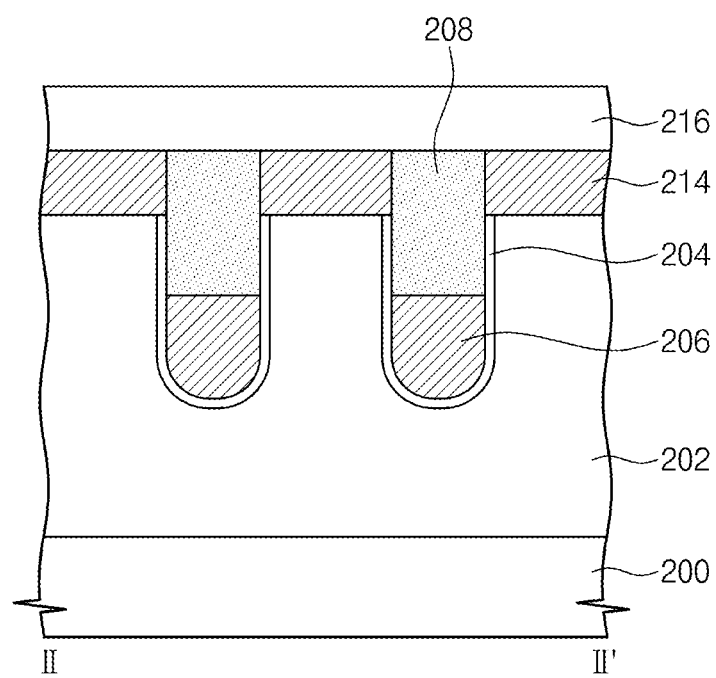

Referring to FIGS. 14A through 14C, first contact plugs 220 may be formed to be electrically connected to the first impurity regions 210a.

For example, a first interlayered insulating layer 216 may be formed on the gate capping insulating patterns 208, the lower insulating fences 212, and the conductive pads 214. The first interlayered insulating layer 216 may include oxide (for example, silicon oxide). The first interlayered insulating layer 216 and the lower insulating fences 212 may be etched to form first contact holes 217 exposing the first impurity regions 210a, respectively. In at least one example embodiment, the gate capping insulating patterns 208 and the conductive pads 214 may be partially etched to increase contact areas between the first impurity regions 210a and the first contact plugs 220.

First spacers 218 may be formed on inner side surfaces of the first contact holes 217, respectively. The first spacers 218 may include nitride (for example, silicon nitride). The first contact holes 217 provided with the first spacers 218 may be filled with a conductive material, and thus, the first contact plugs 220 may be formed in the first contact holes 217, respectively. The conductive material may include doped polysilicon, metals and/or metal compounds. In at least one example embodiment, the first contact plugs 220 may be formed to have top surfaces that are substantially coplanar with the top surfaces of the first interlayered insulating layer 216.

Planar dispositions of the lower insulating fences 212, the conductive pads 214, and first contact plugs 220 will be described in more detail below. In plain view, the lower insulating fences 212, the conductive pads 214, and the first contact plugs 220 may be disposed between an adjacent pair of the gate capping insulating patterns 208. The lower insulating fences 212 may be arranged in the x-axis direction. A pair of the conductive pads 214 may be provided between the adjacent pair of the gate capping insulating patterns 208 and between an adjacent pair of the lower insulating fences 212. Each of the first contact plugs 220 may be disposed between each pair of the conductive pads 214. The first spacer 218 may be disposed between the first contact plug 220 and a pair of the conductive pads 214 adjacent thereto.

Figure 15A:
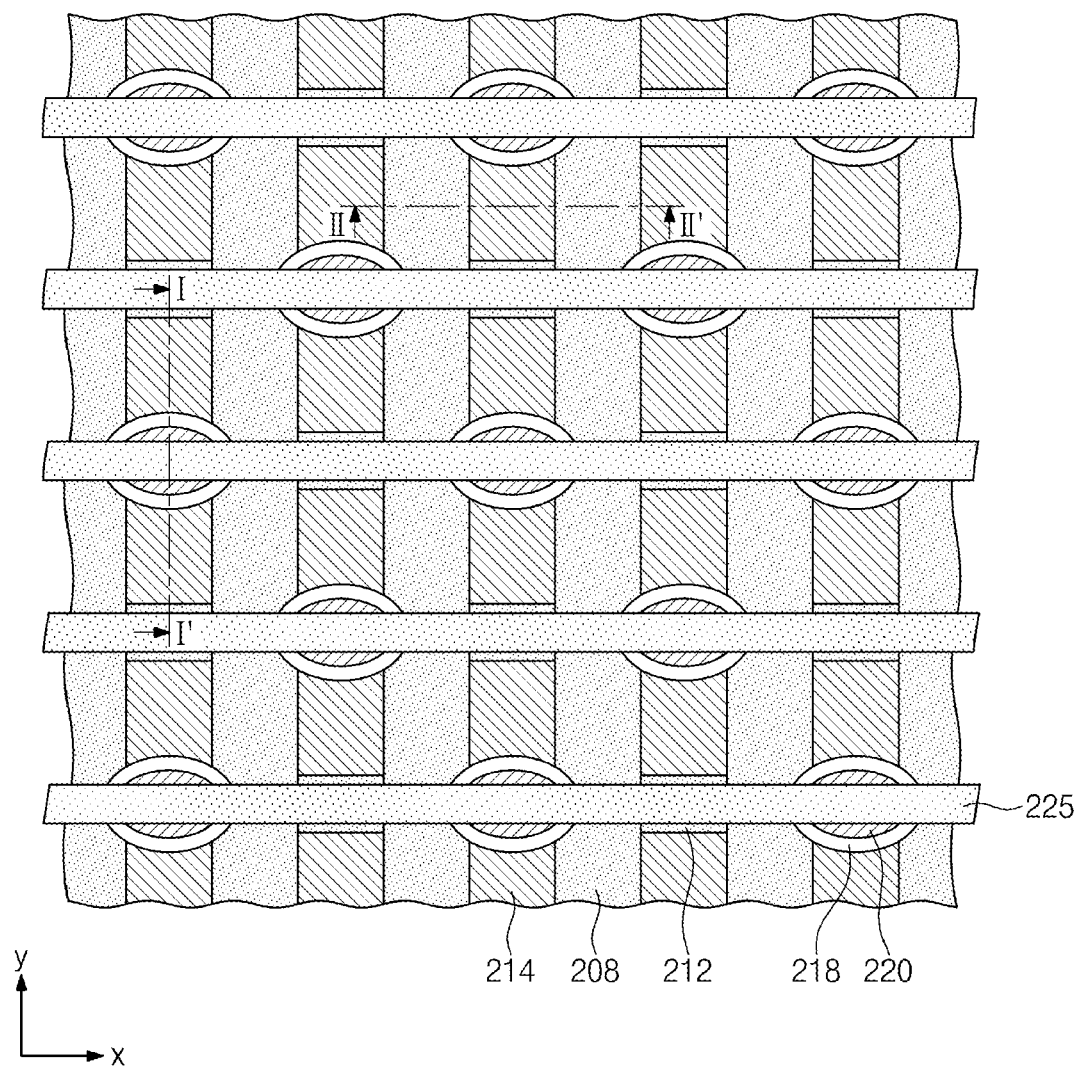
Figure 15B:
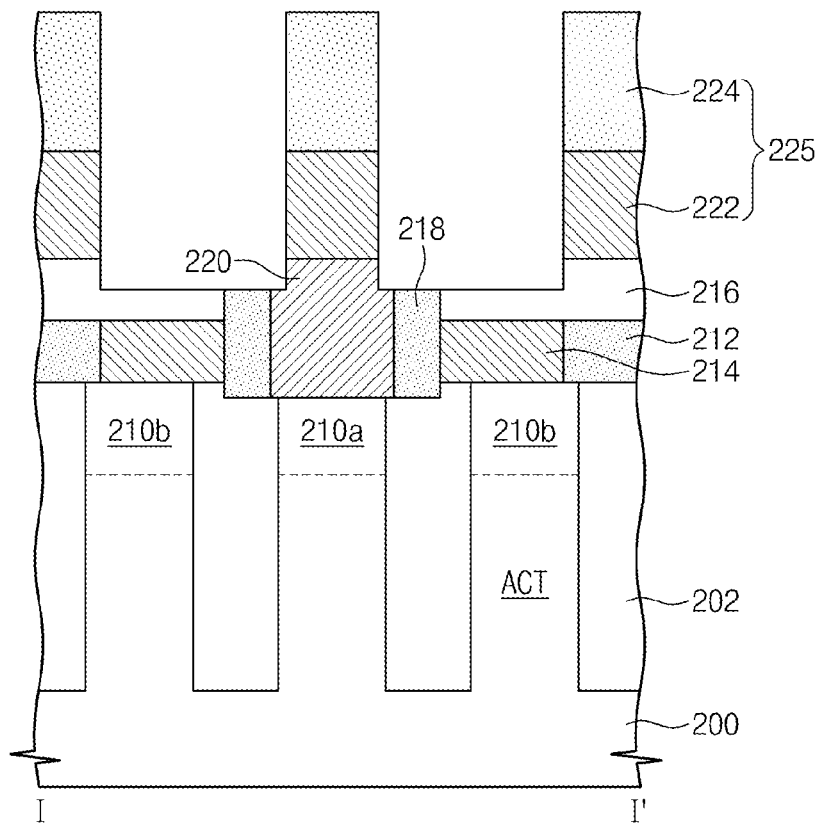
Figure 15C:
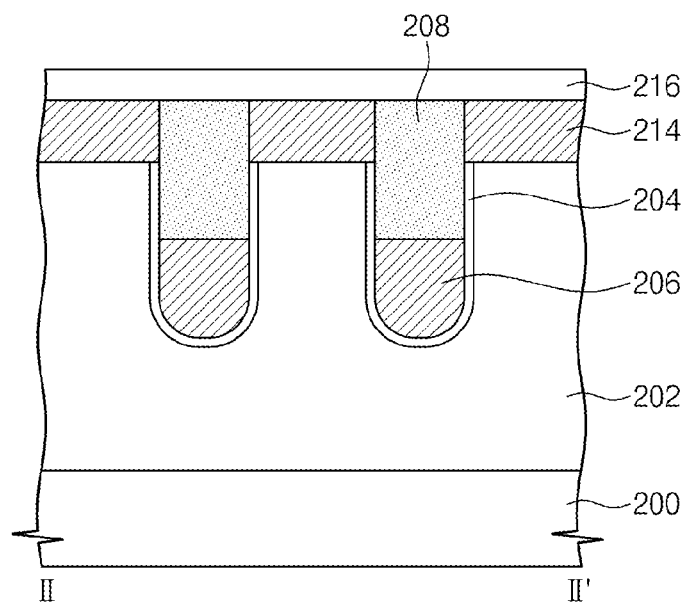

Referring to FIGS. 15A through 15C, bit line structures 225 may be formed to be electrically connected to the first contact plugs 220.

For example, a conductive layer 222 and an insulating layer 224 may be sequentially formed on the first contact plugs 220 and the first interlayered insulating layer 216. The conductive layer 222 may include at least one of metals or metal compounds. The insulating layer 224 may include nitride (e.g., silicon nitride). The conductive layer 222 may include at least one of tungsten, aluminum, titanium, tantalum, titanium nitride, tantalum nitride, tungsten nitride, or metal silicide.

The conductive layer 222 and the insulating layer 224 may be patterned to form the bit line structures 225 extending along the x-axis direction. Each of the bit line structures 225 may be formed to connect the first contact plugs 220 arranged along the x-axis direction electrically to each other. In at least one example embodiment, the first contact plugs 220 may be partially etched during the patterning of the conductive layer 222 and the insulating layer 224. Accordingly, an upper portion of the first contact plug 220 may have substantially the same width as that of the bit line structure 225. A lower portion of the first contact plug 220 may have a width that is greater than that of the bit line structure 225.

Figure 16A:
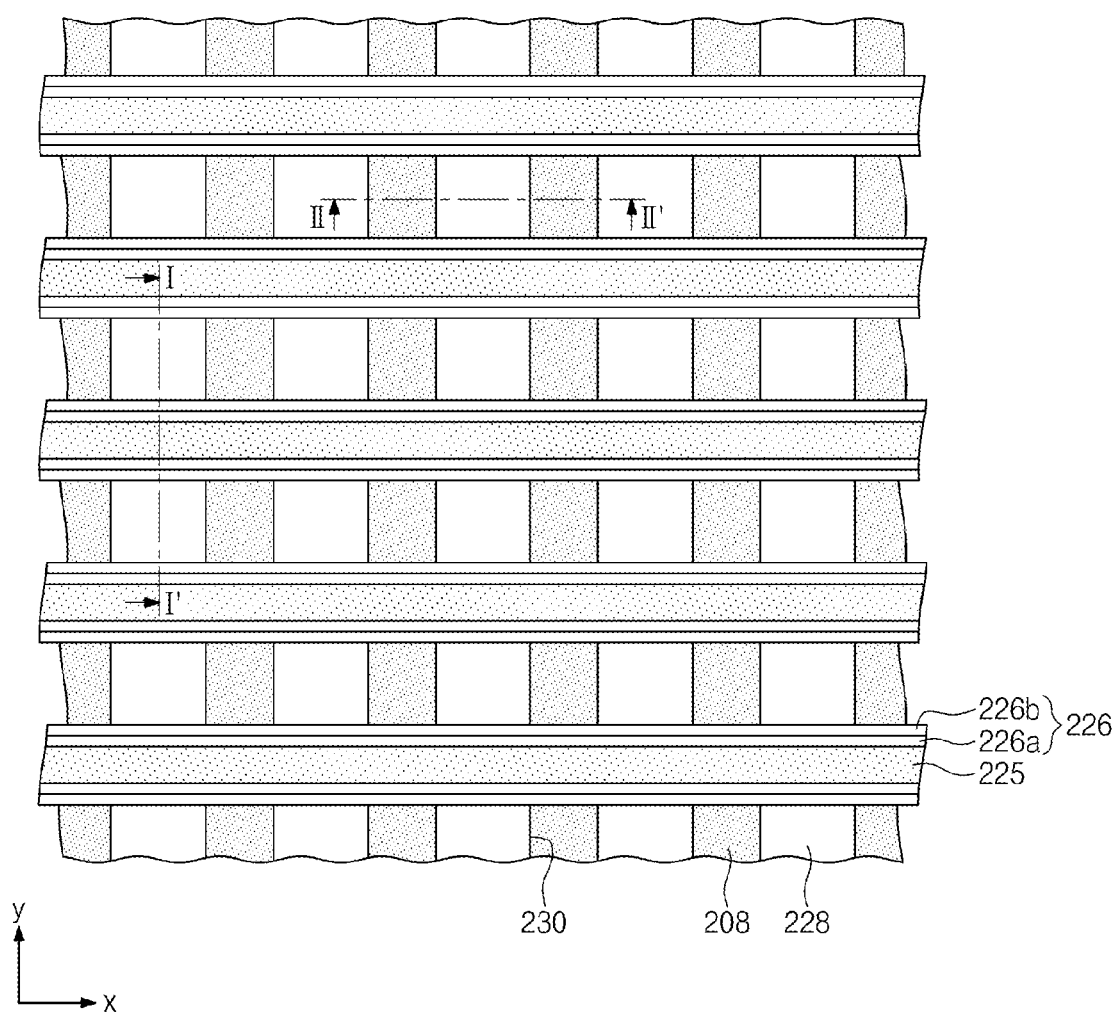
Figure 16B:
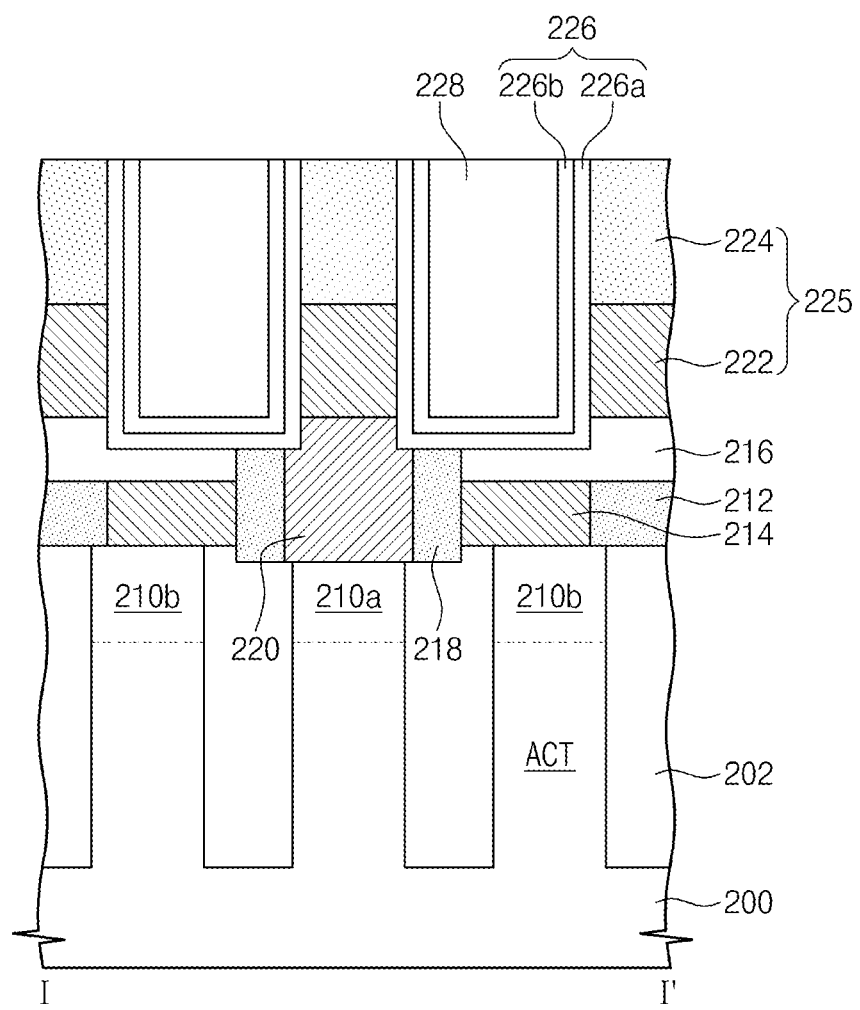
Figure 16C:
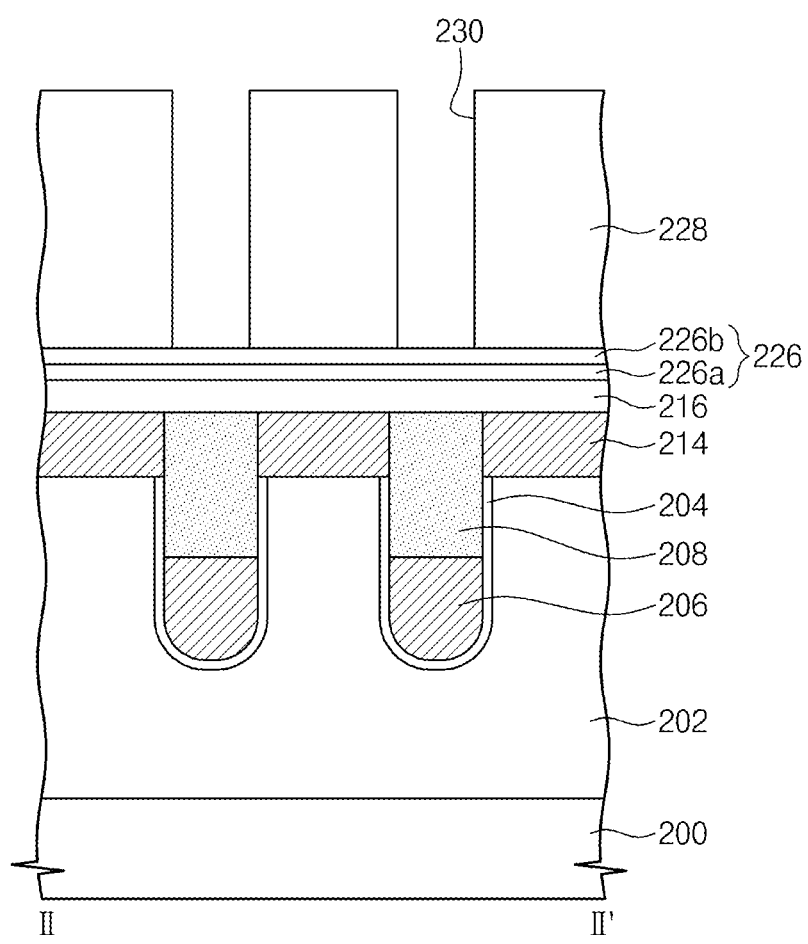

Referring to FIGS. 16A through 16C, a second spacer layer 226 and sacrificial patterns 228 may be formed on the substrate 200 provided with the bit line structures 225.

For example, the second spacer layer 226 may be formed to cover conformally the resulting structure provided with the bit line structures 225. The second spacer layer 226 may be formed to have a multi-layered structure. For example, the formation of the second spacer layer 226 may include sequentially forming a nitride layer 226a and an oxide layer 226b.

A sacrificial layer (not shown) may be formed on the resulting structure provided with the second spacer layer 226. The sacrificial layer may include oxide (for example, silicon oxide). The sacrificial layer may be polished to expose the bit line structures 225. A portion of the second spacer layer 226 disposed on the bit line structures 225 may be etched during the polishing of the sacrificial layer.

The sacrificial layer may be patterned to form the sacrificial patterns 228, which may be arranged spaced apart from each other along the x-axis direction between the bit line structures 225. The bit line structures 225 and the sacrificial patterns 228 may be formed to define empty spaces 230, and in at least one example embodiment, the empty spaces 230 may be positioned on the first impurity region 210a.

Figure 17A:
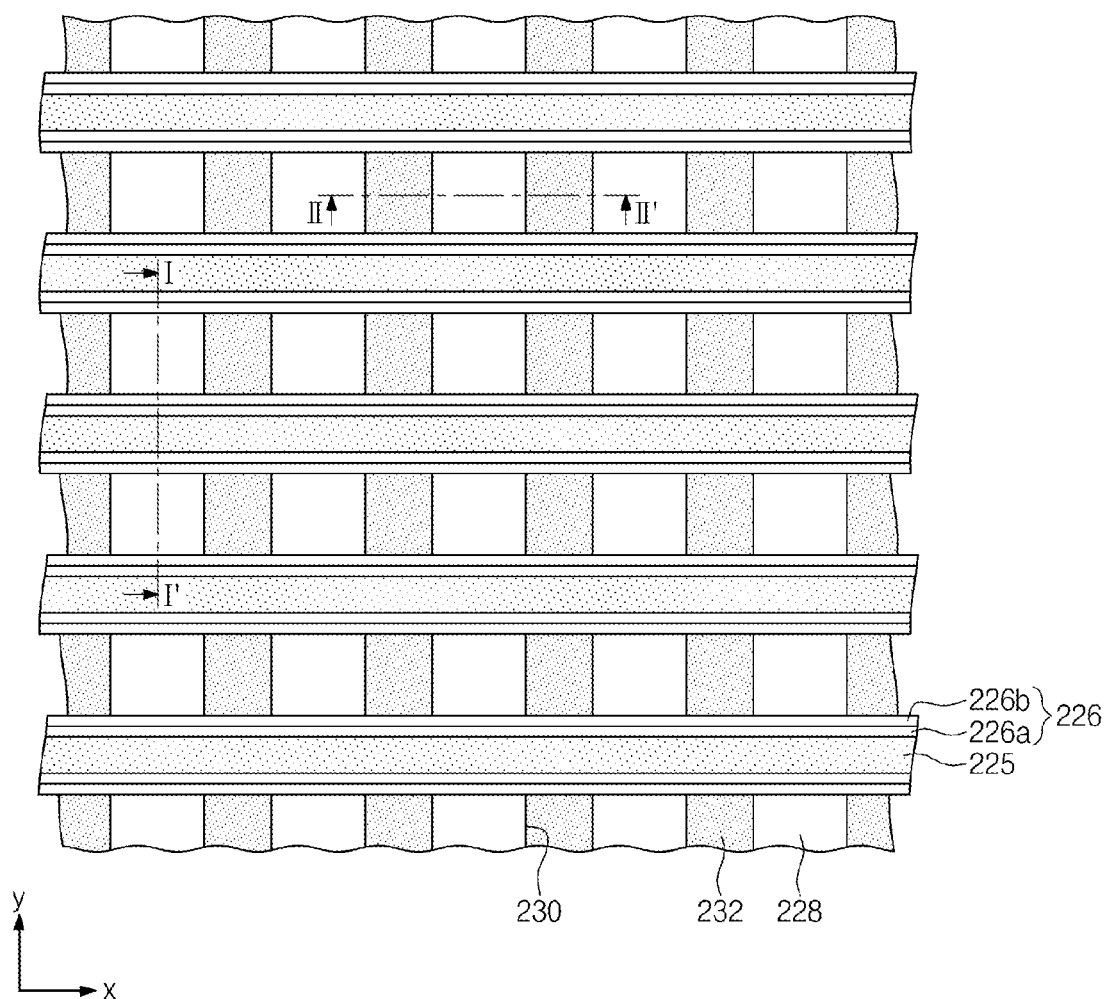
Figure 17B:
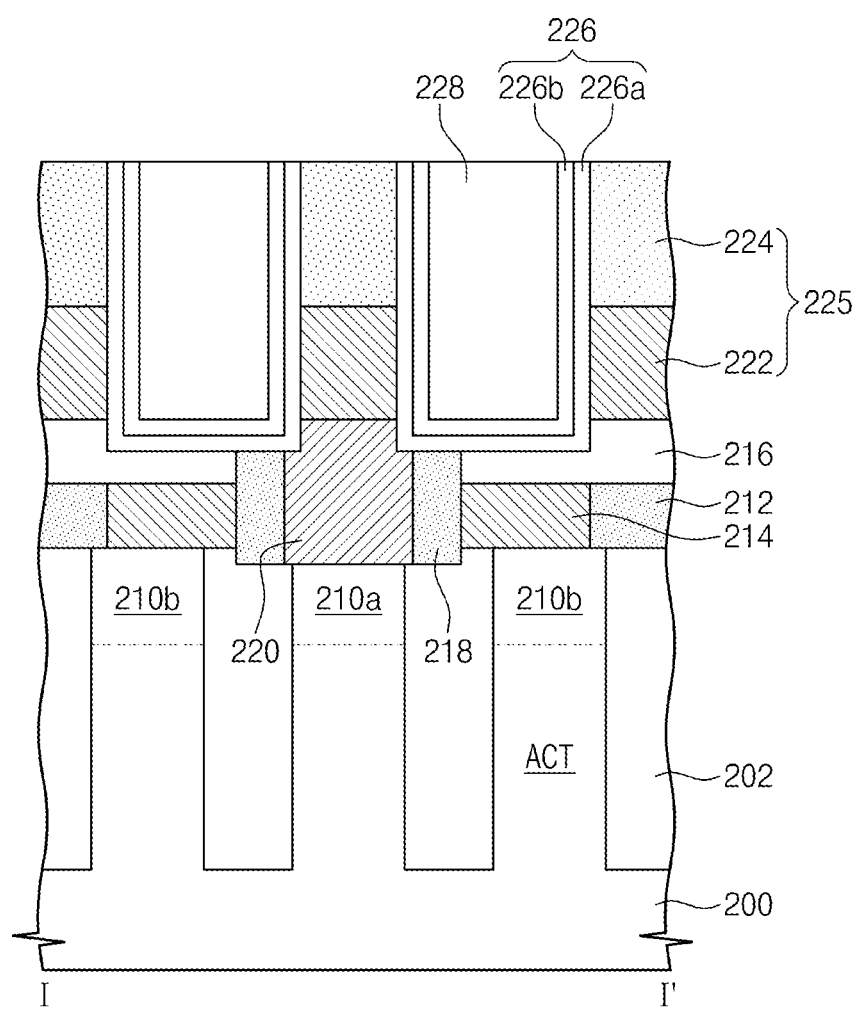
Figure 17C:
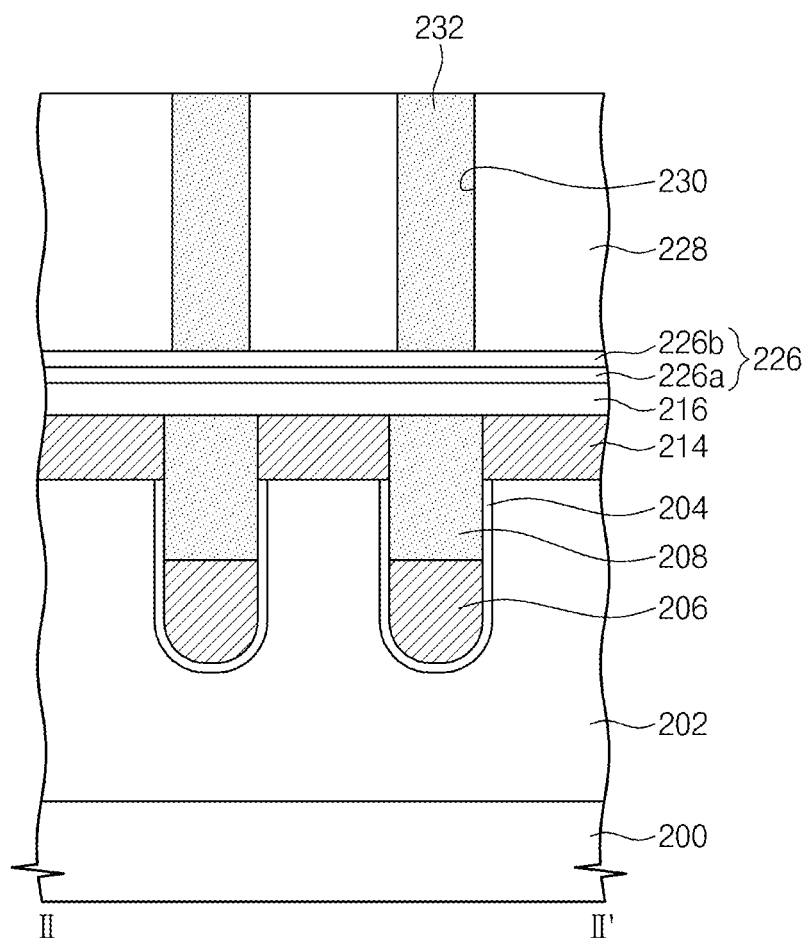

Referring to FIGS. 17A through 17C, upper insulating fences 232 may be formed in the empty spaces 230, respectively.

For example, an insulating layer (not shown) may be formed on the resulting structure provided with the sacrificial patterns 228 and the bit line structures 225. The insulating layer may include, for example, silicon nitride, which may be formed by a vapor deposition process (e.g., a chemical vapor deposition process).

The insulating layer may be polished to expose top surfaces of the sacrificial patterns 228 and the bit line structures 225 and thereby to form the upper insulating fences 232. The upper insulating fences 232 may be formed to have top surfaces that are substantially coplanar with the top surfaces of the bit line structures 225.

The upper insulating fences 232 may be formed to be spaced apart from each other along the x-axis direction between the bit line structures 225. Further, the upper insulating fences 232 and the sacrificial patterns 228 may be formed to be alternatingly arranged between the bit line structures 225.

Figure 18A:
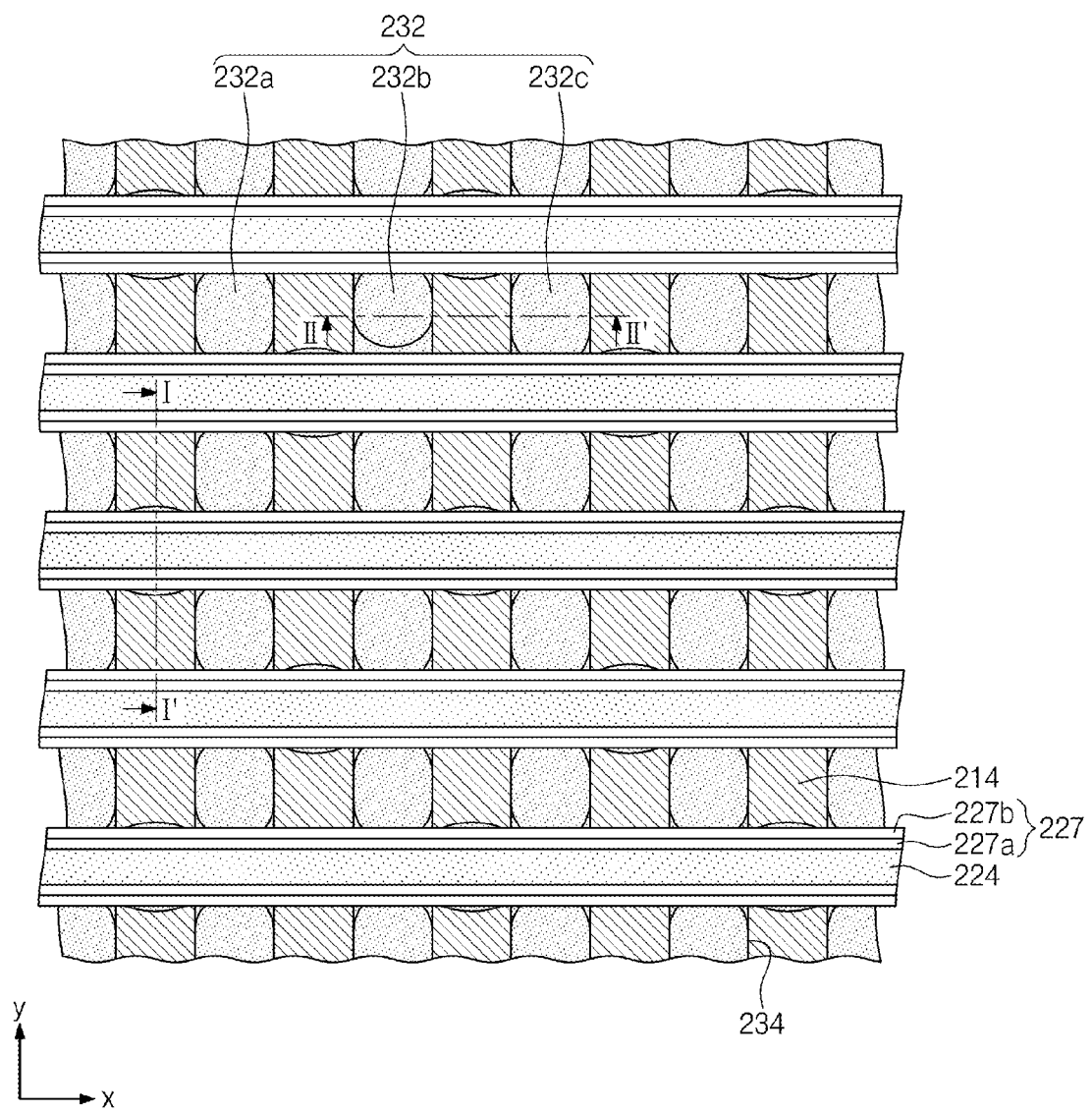
Figure 18B:
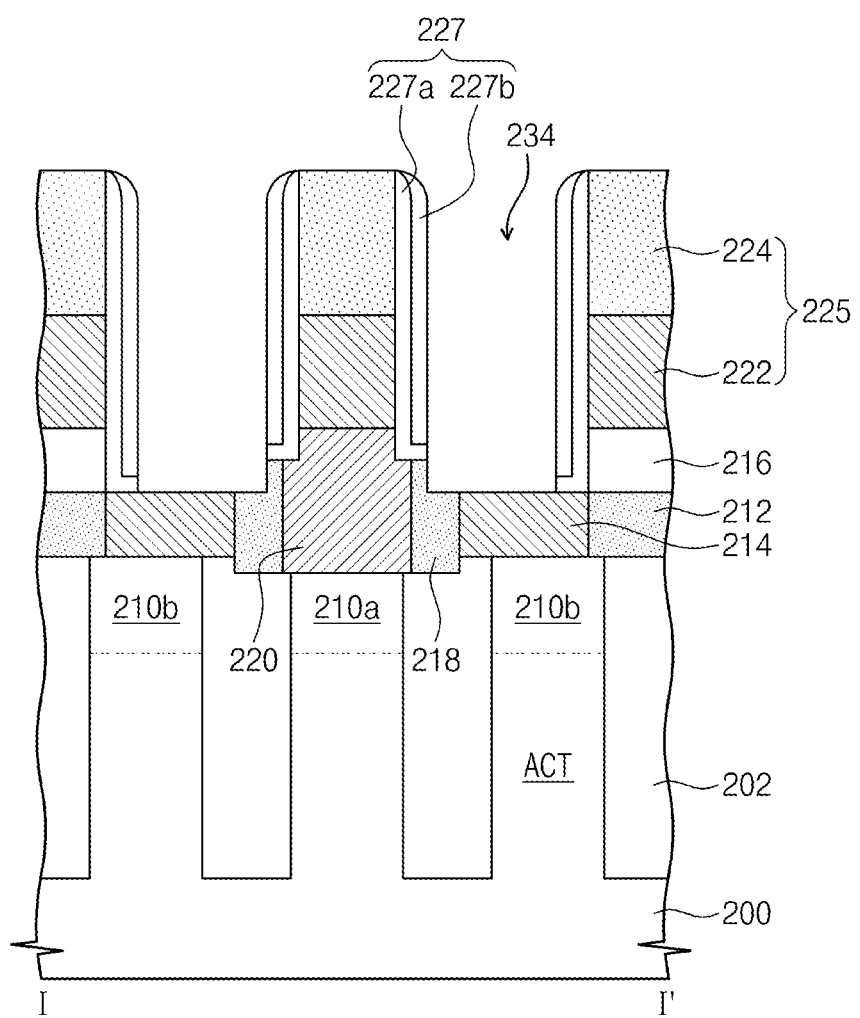
Figure 18C:
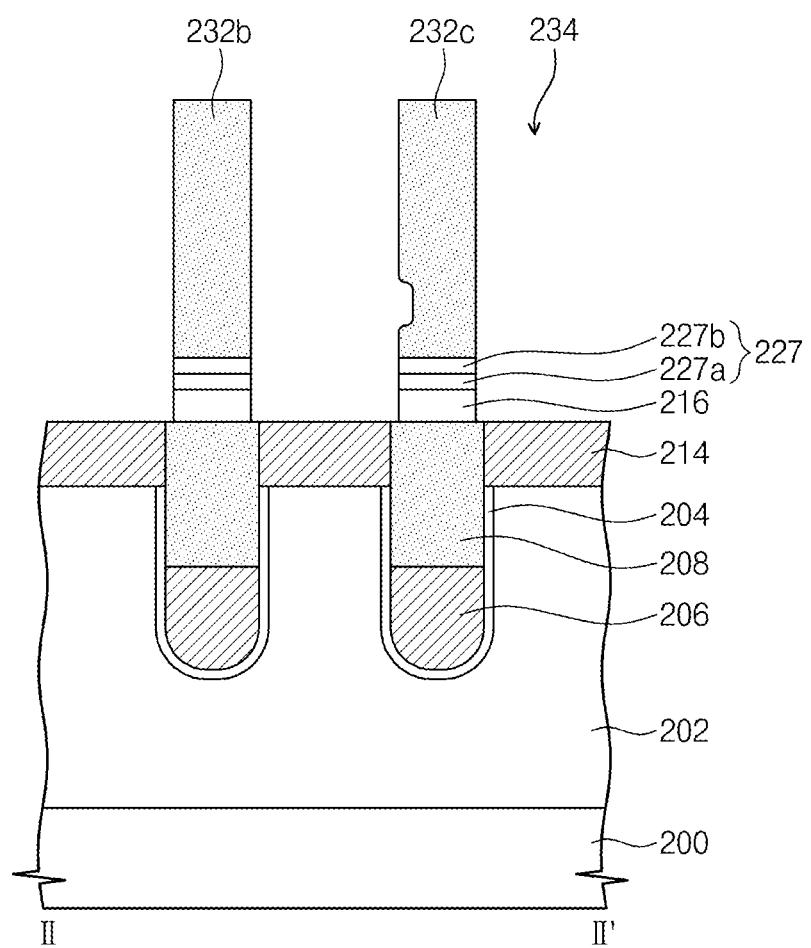

Referring to FIGS. 18A through 18C, the sacrificial patterns 228 may be removed, and then, second spacers 227 may be formed on side surfaces of the bit line structures 225.

In detail, the upper insulating fences 232 may be partially etched during the removal of the sacrificial patterns 228. In at least one example embodiment, the sacrificial patterns 228 may be removed using a wet etching process, and corners of the upper insulating fences 232 may be partially etched during the wet etching process. Accordingly, in plain view, the upper insulating fences 232 may be formed to have an elliptical shape. In at least one other embodiment, the insulating fences 135 may be formed to have a circular shape. In still at least one other embodiment, the insulating fences 135 may be formed to have a polygonal shape.

The upper insulating fences 232 may include first, second, and third insulating fences 232a, 232b, and 232c. According to at least one example embodiment of inventive concepts, the first insulating fence 232a may be formed to have an end portion that is in contact with a side surface of the bit line structure 225 and define an empty space between the end portion thereof and the side surface of the bit line structure 225. According to at least one example embodiment of inventive concepts, the second insulating fences 232b may be formed to have an end portion that is not in contact with (or spaced apart from) the side surface of the bit line structure 225. According to at least one example embodiment of inventive concepts, each of the third insulating fences 232c may be formed to have a partially etched portion.

The second spacer layer 226 may be anisotropically etched to form the second spacers 227, which may be disposed on the side surfaces of the bit line structures 225, respectively. The first interlayered insulating layer 216 may be etched using the bit line structures 225 and the second spacers 227 as an etch mask to form second contact holes 234 exposing the conductive pads 214.

Figure 19A:
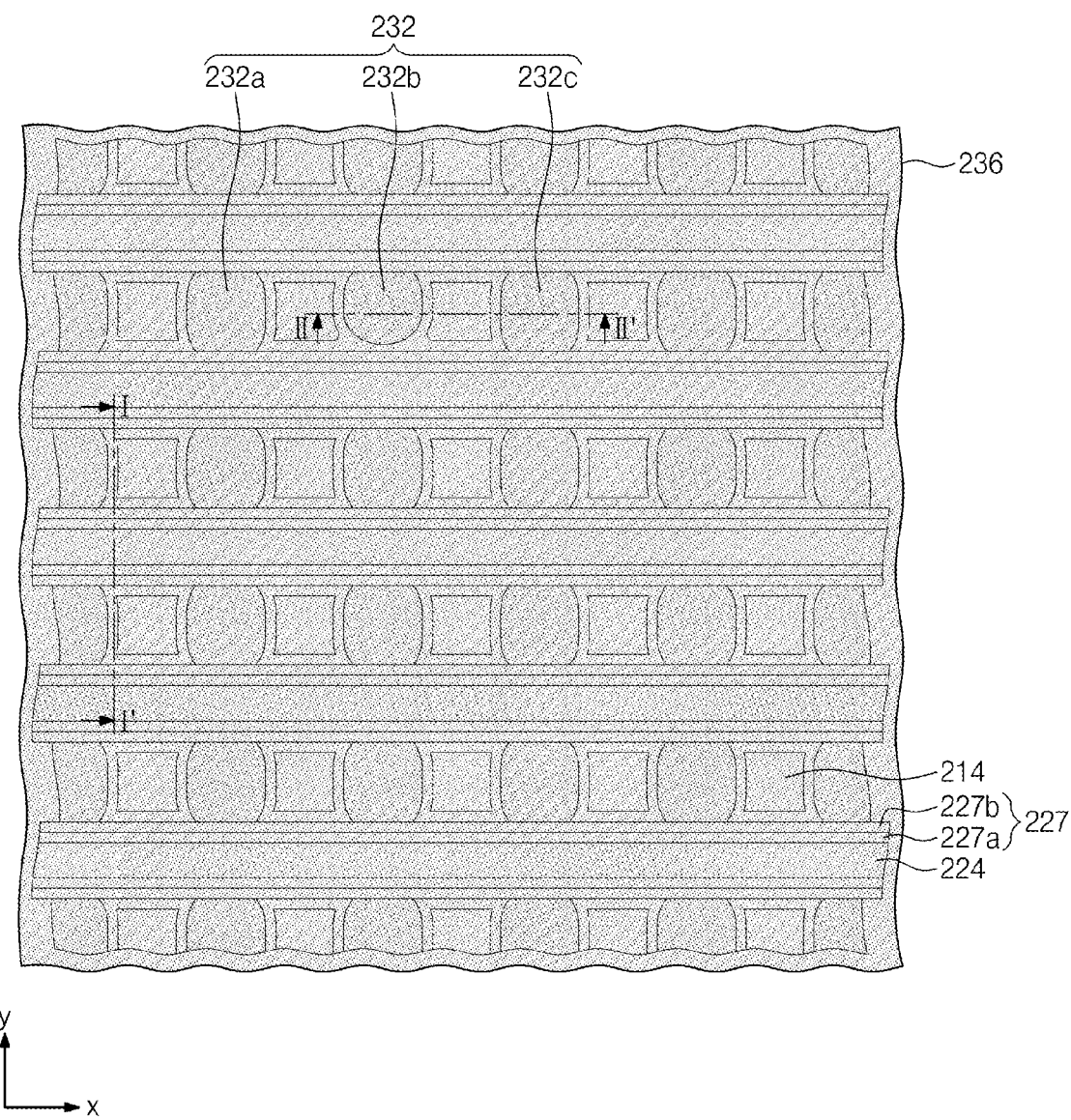
Figure 19B:
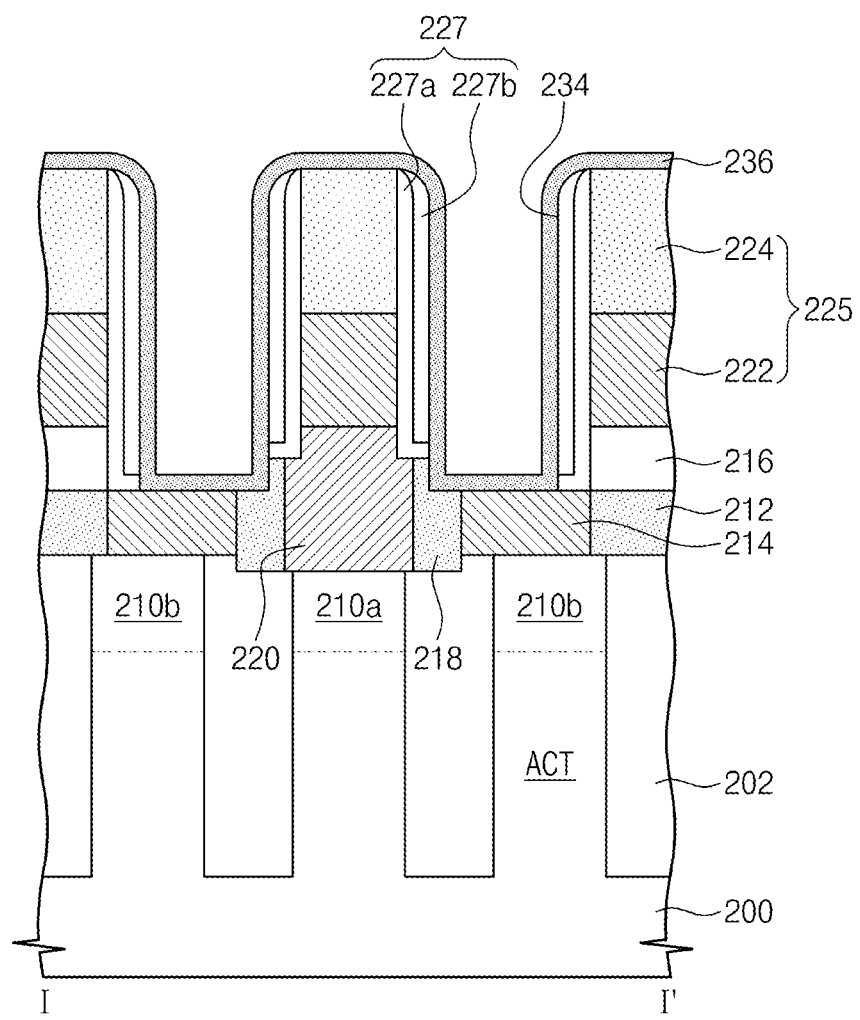
Figure 19C:
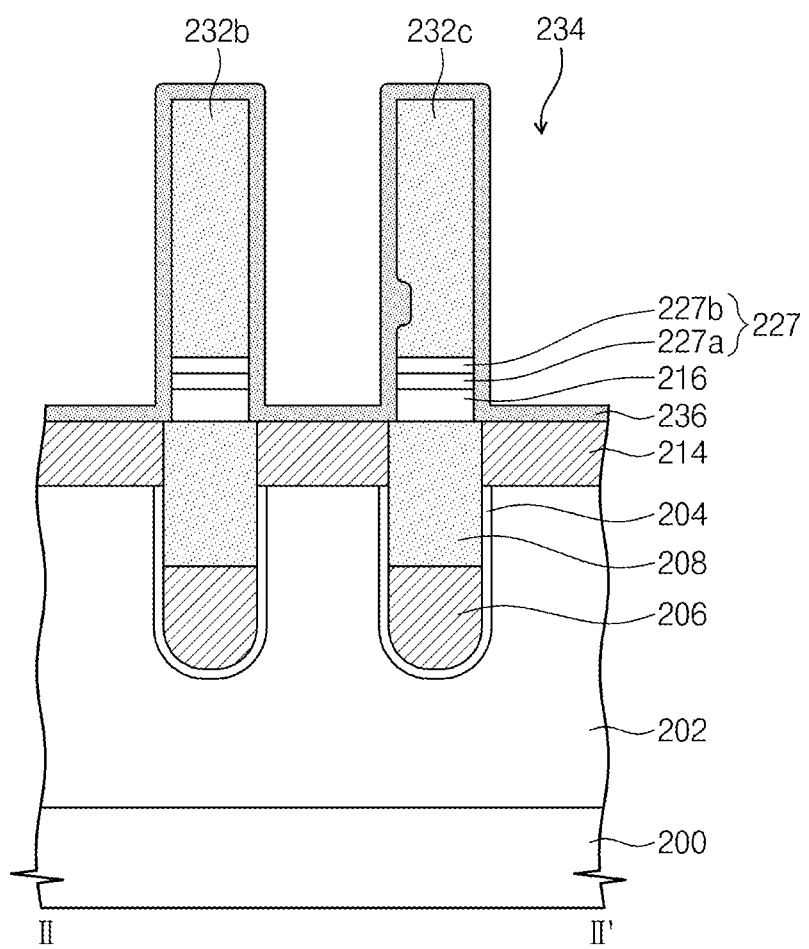

Referring to FIGS. 19A through 19C, an additional insulating layer 236 may be conformally formed on the resulting structure provided with the bit line structures 225, the second spacers 227, the upper insulating fences 232, and the conductive pads 214. The additional insulating layer 236 may include a silicon nitride layer, which may be formed by an atomic layer deposition process.

According to at least one example embodiment of inventive concepts, the additional insulating layer 236 may be formed to fill an empty space between the side surface of the bit line structure 225 and the corner of the first insulating fence 232a.

According to at least one example embodiment of inventive concepts, the additional insulating layer 236 may be formed to fill an empty space between the side surface of the bit line structure 225 and the end portion of the second insulating fence 232b. Although not shown in detail, the additional insulating layer 236 may be formed to define an air gap. For example, the additional insulating layer 236 may be formed not to fill completely an empty space between the bit line structure 225 and the second insulating fence 232b, and thus, the air gap may be formed in the additional insulating layer 236.

According to at least one example embodiment of inventive concepts, the additional insulating layer 236 may be formed to fill the etched portion of each of the third insulating fences 232c. Although not shown in detail, at least one of the upper insulating fences 232 may be formed to define an air gap. For example, the additional insulating layer 236 may be formed not to fill completely the etched portion of the third insulating fence 232c, and thus, the air gap may be formed in the third insulating fence 232c.

Figure 20A:
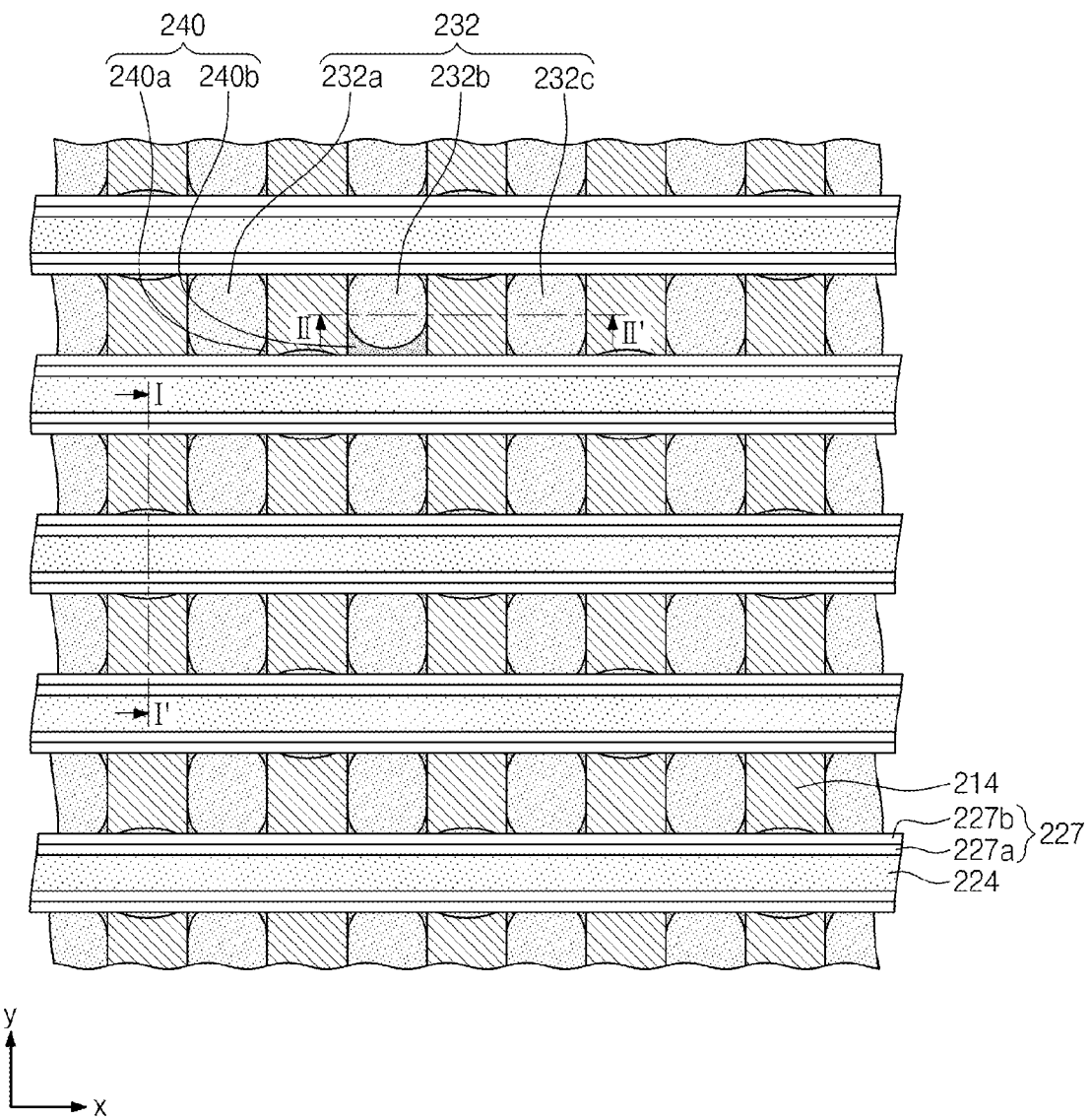
Figure 20B:
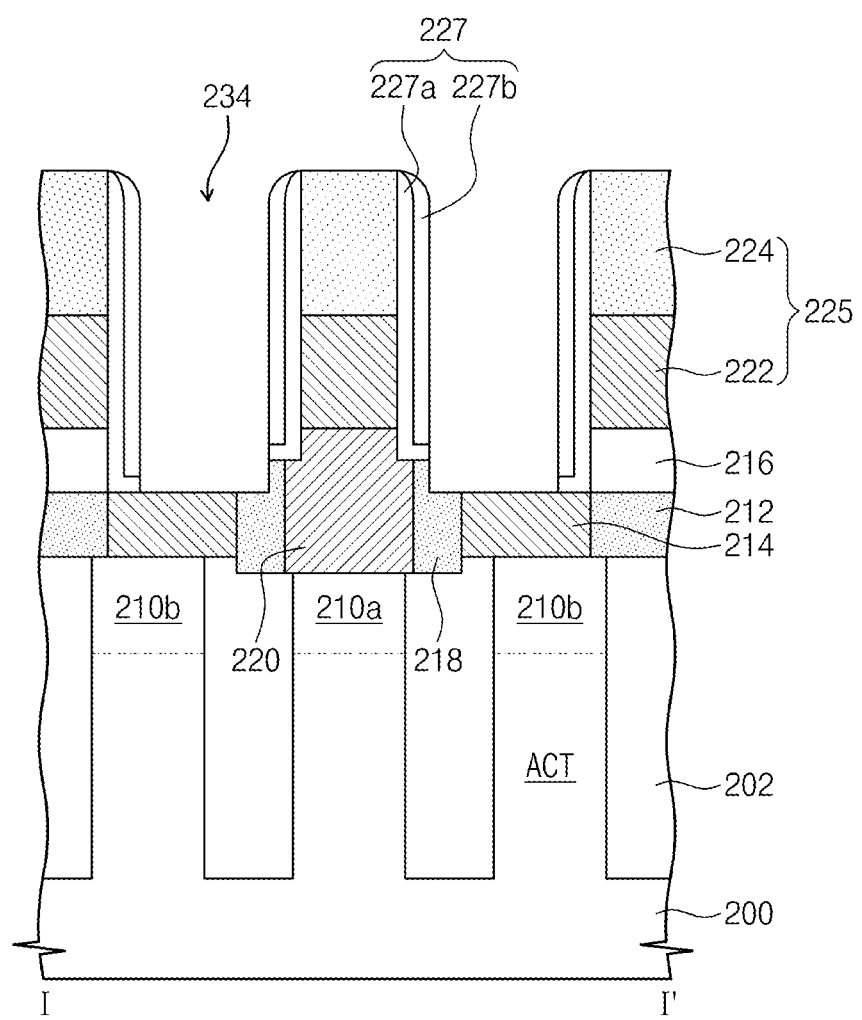
Figure 20C:
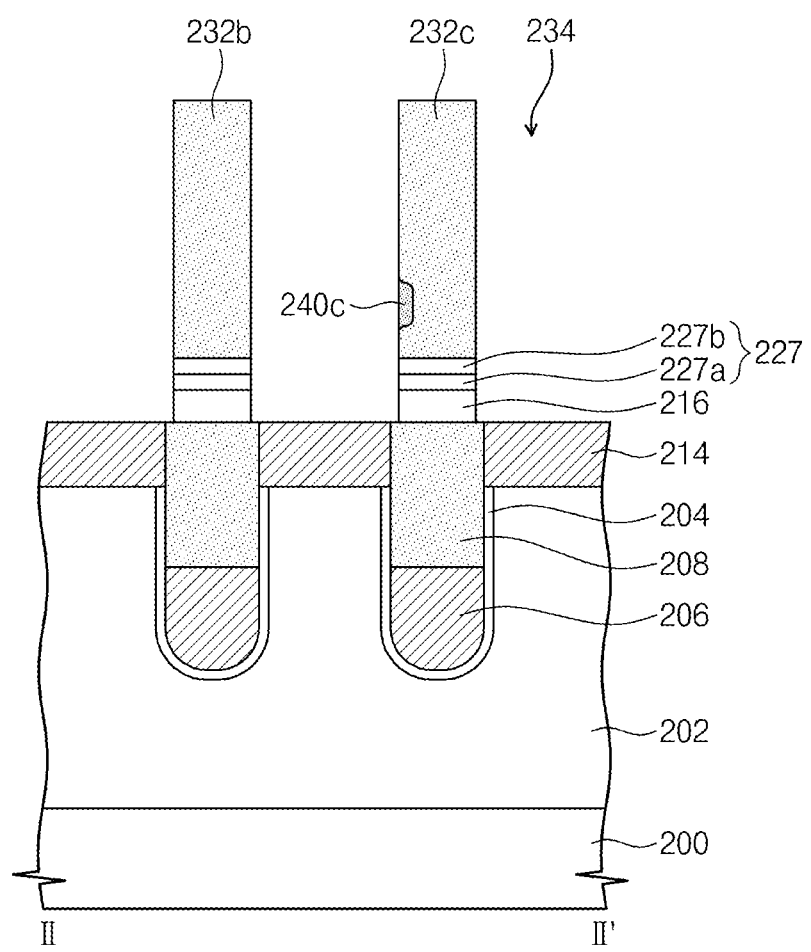

Referring to FIGS. 20A through 20C, the additional insulating layer 236 may be etched to form additional insulating patterns 240. The additional insulating patterns 240 may include at least one of first to third insulating patterns 240a, 240b, and 240c.

According to at least one example embodiment of inventive concepts, the first additional insulating patterns 240a may be formed to fill the empty space between the side surface of the bit line structure 225 and the corner of the first insulating fence 232a. The first additional insulating patterns 240a may be formed to have side surfaces that are substantially coplanar with the side surfaces of the first insulating fences 232a.

According to at least one example embodiment of inventive concepts, the second additional insulating patterns 240b may be formed to fill the empty space between the side surface of the bit line structure 225 and the end portion of the second insulating fence 232b. The second additional insulating patterns 240b may be formed to have side surfaces that are substantially coplanar with the side surfaces of the second insulating fences 232b. Although not shown in detail, the second additional insulating patterns 240b may be formed to define the air gap, which are not exposed to the outside.

According to at least one example embodiment of inventive concepts, at least one of the third additional insulating patterns 240c may be formed to fill the etched portion of the third insulating fence 232c. The third additional insulating patterns 240c may be formed to have side surfaces that are substantially coplanar with the side surfaces of the third insulating fences 232c. Although not shown in detail, at least one of the third insulating fences 232c may be formed to define the air gap, which is not exposed to the outside.

Figure 21A:
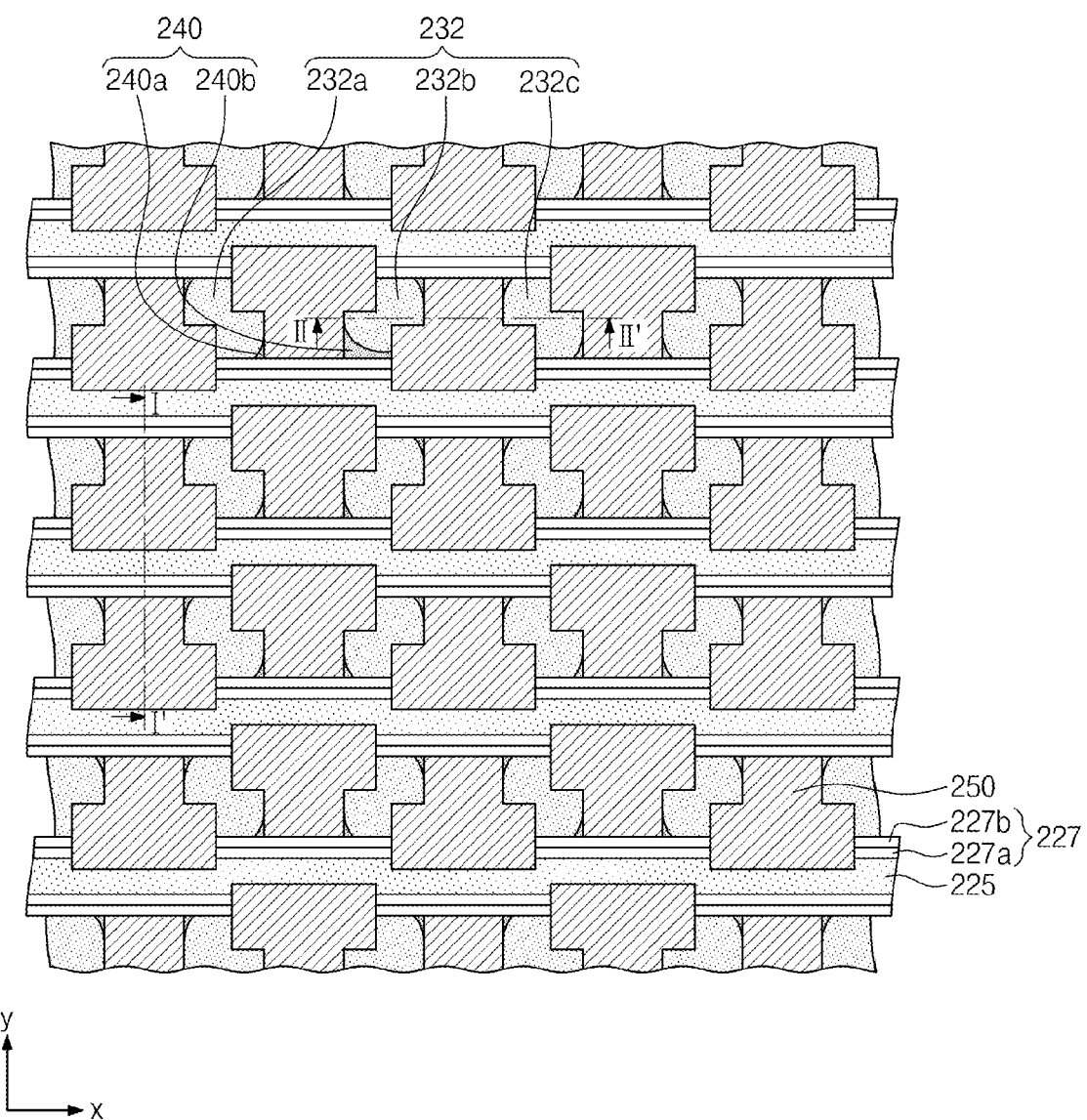
Figure 21B:
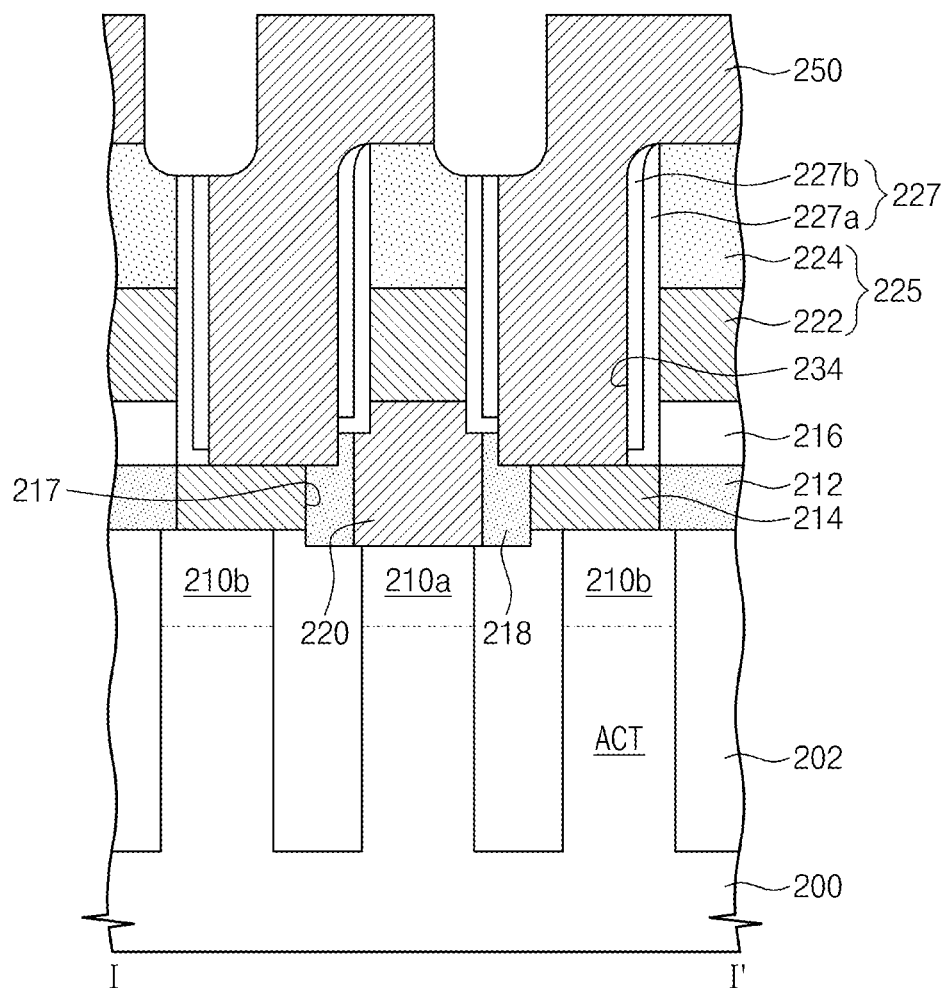
Figure 21C:
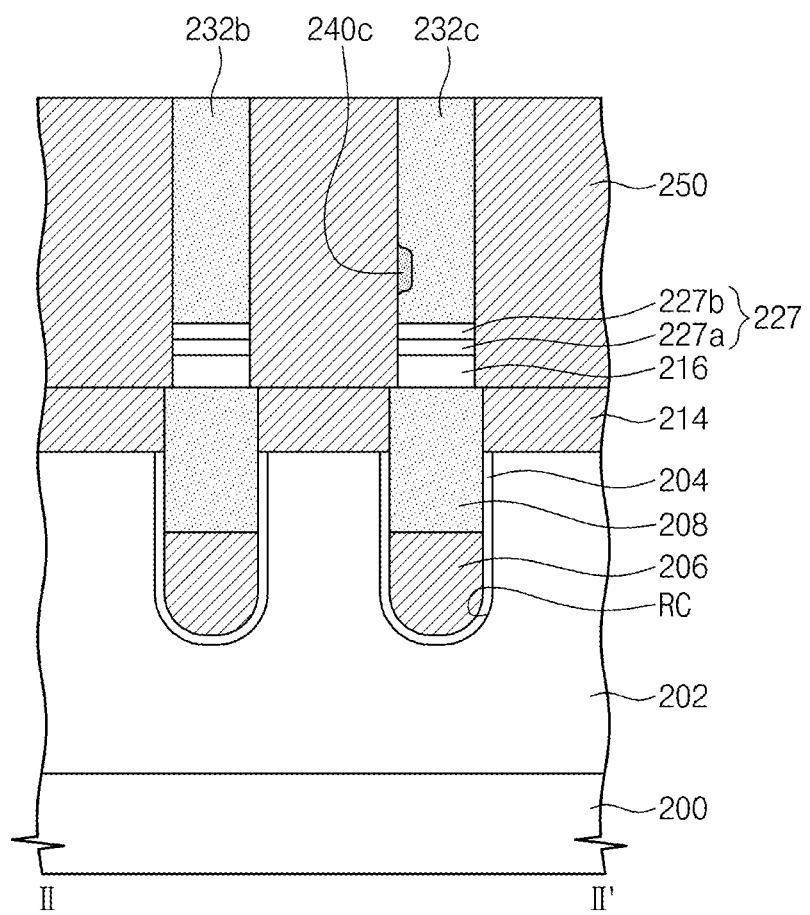

Referring to FIGS. 21A through 21C, second contact plugs 250 may be formed by filling the second contact holes 234 with a conductive material. The conductive material may include doped polysilicon, metals and/or metal compounds. The conductive material may include at least one of tungsten, aluminum, titanium, tantalum, titanium nitride, tantalum nitride, tungsten nitride, or metal silicide.

In at least one example embodiment, the second contact plugs 250 may be formed to have top surfaces that are higher than those of the bit line structures 225. In sectional view, each of the second contact plugs 250 may include a lower portion filling the second contact hole 234 and an upper portion connected to the lower portion and partially overlapped with the bit line structure 225.

The second contact plugs 250 and the second insulating fences 232 may be alternatingly arranged between each pair of the bit line structures 225 disposed adjacent to each other. For example, a plurality of the second insulating fences 232 may be arranged between each pair of the bit line structures 225, and the second contact plugs 250 may be disposed between respective pairs of the plurality of the second insulating fences 232. In plain view, the second contact plugs 250 may be arranged spaced apart from each other to form a plurality of rows and a plurality of columns. The rows may be parallel to an x-axis direction, and the columns may be parallel to a y-axis direction.

Two adjacent two of the second contact plugs 250 spaced apart from each other in the x-axis direction may be electrically isolated from each other by the upper insulating fences 232 and the additional insulating patterns 240. Similarly, two adjacent of the second contact plugs 250 spaced apart from each other in the y-axis direction may be electrically isolated from each other by the bit line structures 225. As shown, a pair of the second contact plugs 250 adjacent to each other in the x-axis direction may be electrically isolated from each other by both of the upper insulating fences 232 and the additional insulating patterns 240, and thus, it is possible to enhance electric isolation between the second contact plugs 250. In at least one example embodiment, the additional insulating patterns 240 may be formed to have side surfaces that are substantially coplanar with the side surfaces of the upper insulating fences 232, and thus, it is unnecessary to decrease a size of each second contact plug 250. Accordingly, it is possible to enhance an electrical isolation between the second contact plugs 250 without an increase in electrical resistance of the second contact plugs 250, and thereby, improve electric reliability of the device.

Next, capacitors (not shown) may be formed to be electrically connected to the second contact plugs 250, respectively. The capacitors may serve as data-storing elements of the memory device. Each of the capacitors may be electrically connected to the second impurity region 210b through the second contact plug 250 and the conductive pad 214. Each selection component and the capacitor connected thereto may constitute a unit memory cell. As a result, the semiconductor device according to at least one example embodiment of inventive concepts may be operated as a semiconductor memory device. In at least one example embodiment, the capacitors may be replaced with a variety of data-storing elements configured to store digitalized data.

According to at least one example embodiment of inventive concepts, the pair of the second contact plugs 250 adjacent to each other may be electrically isolated from each other by both of the upper insulating fences 232 and the additional insulating patterns 240, and thus, it is possible to enhance electric isolation between the second contact plugs 250. Further, the additional insulating patterns 240 may be formed to have side surfaces that are substantially coplanar with the side surfaces of the upper insulating fences 232, and thus, it is unnecessary to decrease a size of each second contact plug 250. Accordingly, it is possible to enhance an electrical isolation between the second contact plugs 250 without an increase in electrical resistance of the second contact plugs 250, and thereby, improve electric reliability of the device.

FIGS. 22A through 25A are plan views illustrating a method of fabricating a semiconductor device, according to at least one example embodiment of inventive concepts. FIGS. 22B through 25B are sectional views taken along lines I-I' of FIGS. 22A through 25A, respectively, and FIGS. 22C through 25C are sectional views taken along lines II-II' of FIGS. 22A through 25A, respectively.

Figure 22A:
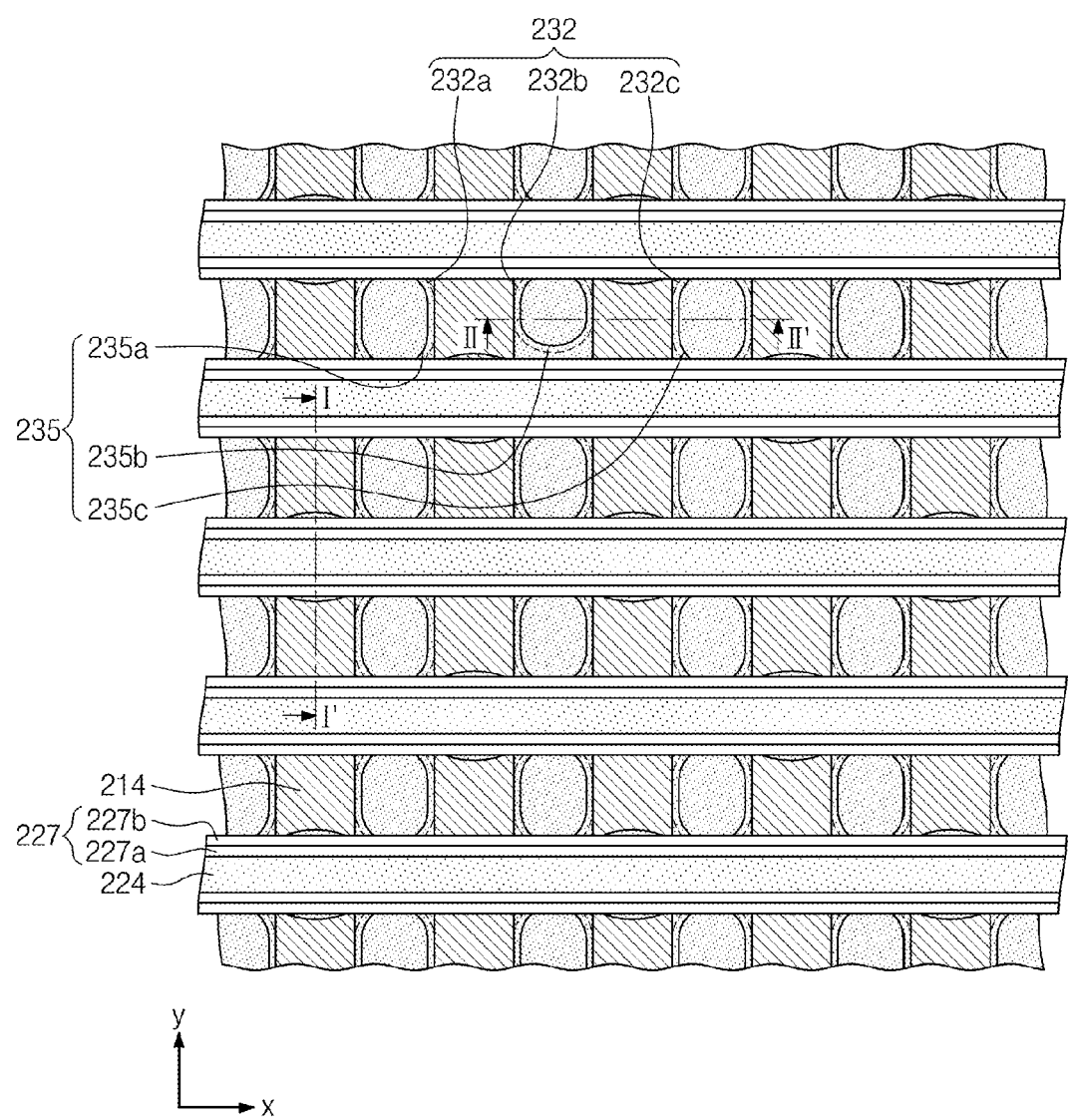
Figure 22B:
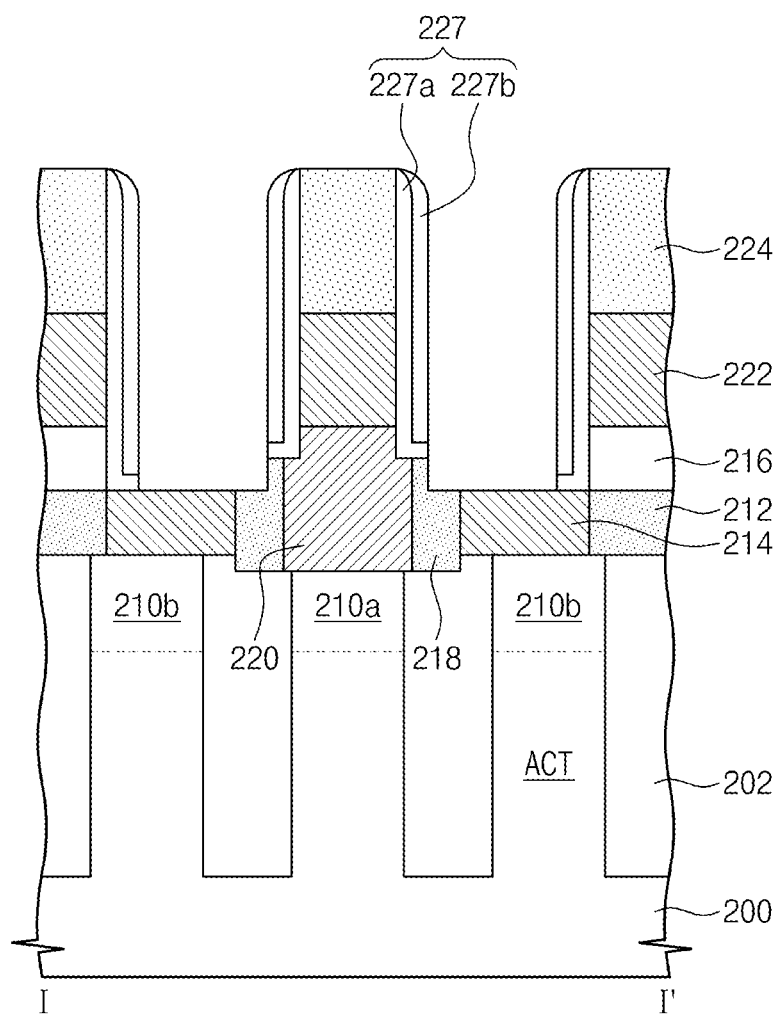
Figure 22C:
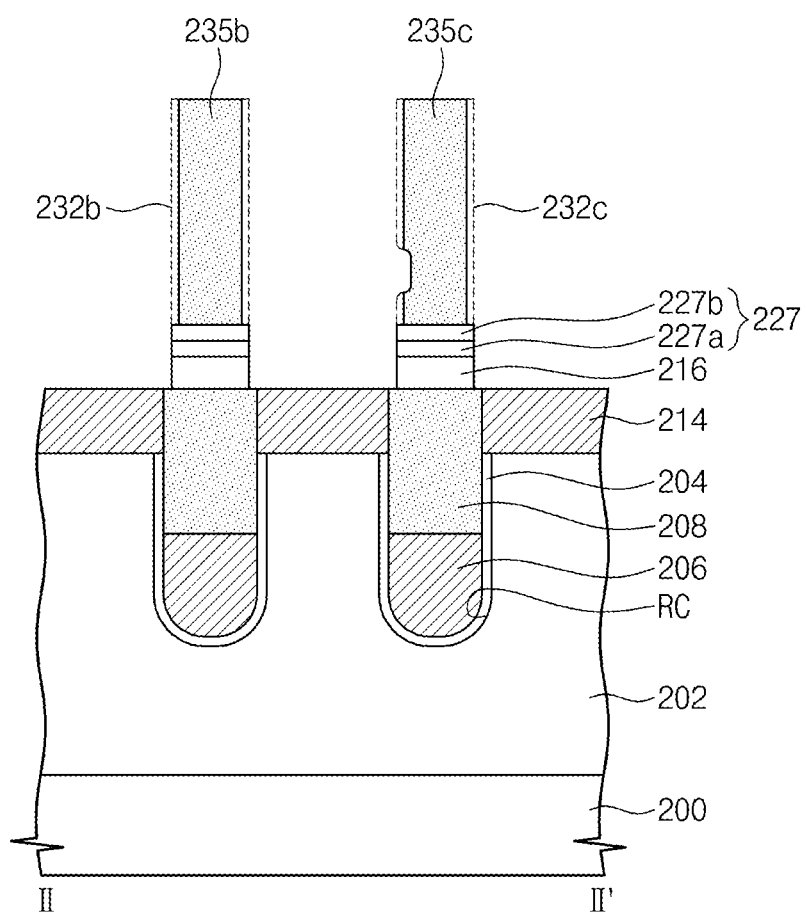

Referring to FIGS. 22A through 22C, a device isolation pattern 202 may be formed on a substrate 200 to define active regions ACT, and a gate insulating layer 204, gate electrodes 206, gate capping insulating patterns 208, first impurity regions 210a, second impurity regions 210b, conductive pads 214, lower insulating fences 212, first contact plugs 220, bit line structures 225, second spacers 227, and preliminary upper insulating fences 232 may be formed on or in the substrate 200.

The processes previously described with reference to FIGS. 11A-18A, 11B-18B, and 11C-18C may be used, in substantially the same manner, to form the device isolation pattern 202, the gate insulating layer 204, the gate electrodes 206, the gate capping insulating patterns 208, the first impurity regions 210a, the second impurity regions 210b, the conductive pads 214, the lower insulating fences 212, the first contact plugs 220, the bit line structures 225, the second spacers 227, and the preliminary upper insulating fences 232, and thus, an overlapping description thereon may be omitted below. Here, the preliminary upper insulating fences 232 may correspond to the upper insulating fences 232 of FIGS. 18A through 18C.

Next, the preliminary upper insulating fences 232 may be isotropically etched to form upper insulating fences 235. The upper insulating fences 235 may include at least one of first, second, and third insulating fences 235a, 235b, and 235c.

For example, corners of an end portion of the first insulating fence 235a may be partially etched to be separated from the side surface of the bit line structure 225. An end portion of the second insulating fence 235b may be partially etched to be not in contact with (or be separated from) the side surface of the bit line structure 225. Each of the third insulating fences 235c may be partially etched.

Figure 23A:
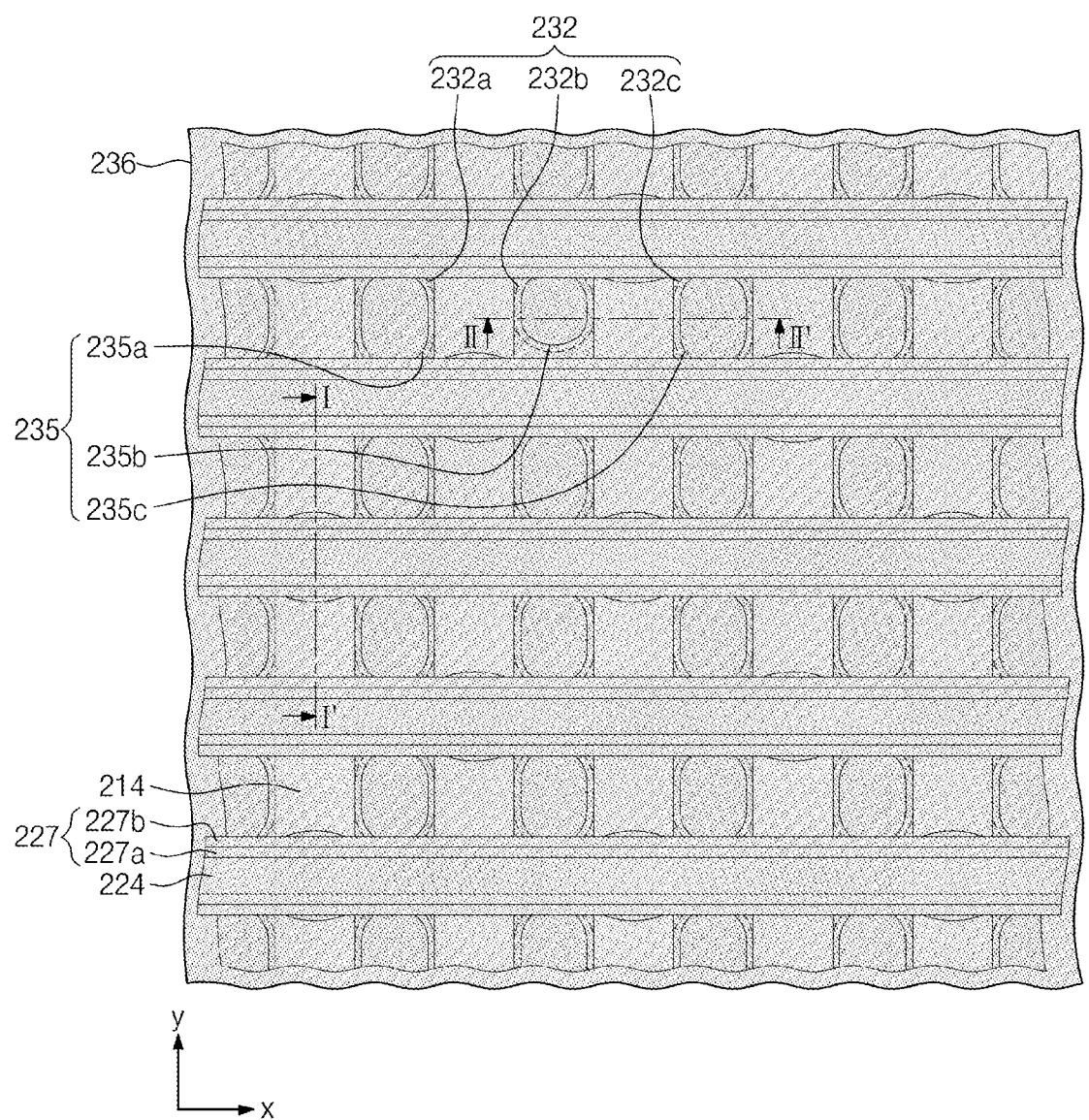
Figure 23B:
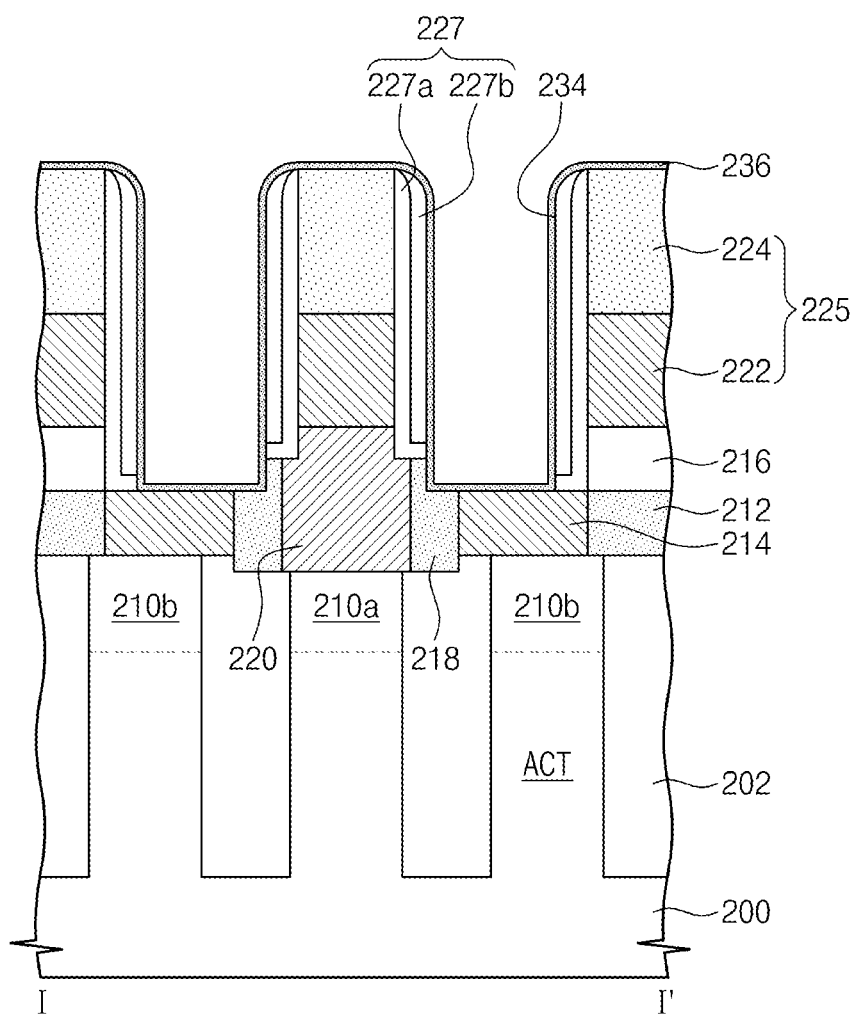
Figure 23C:
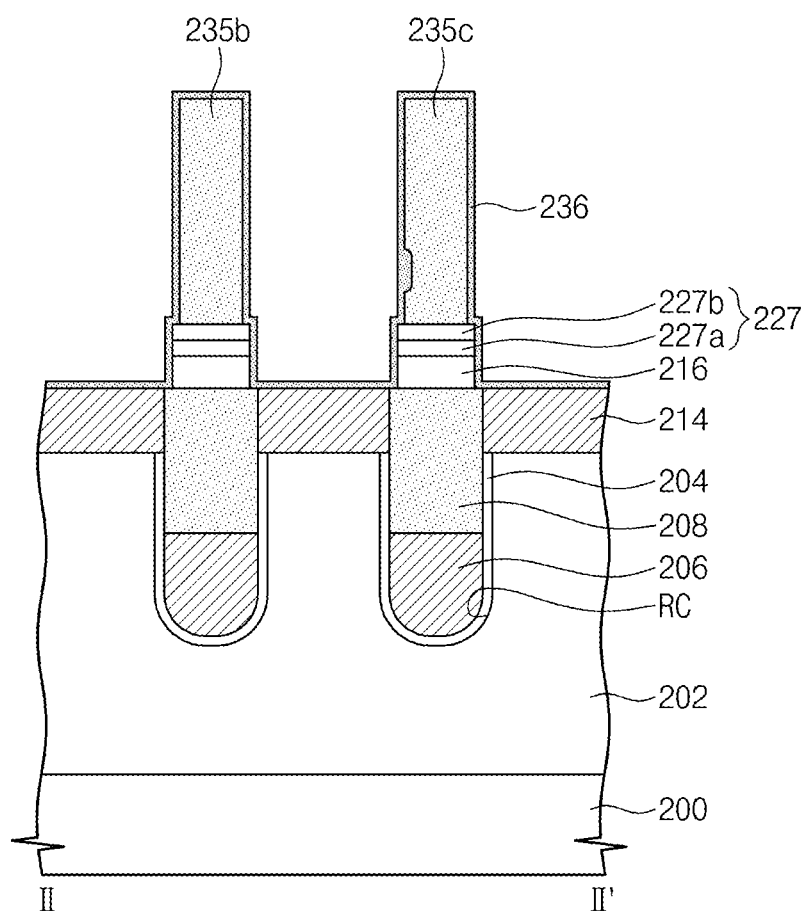

Referring to FIGS. 23A through 23C, an additional insulating layer 236 may be conformally formed on the resulting structure provided with the bit line structures 225, the second spacers 227, the upper insulating fences 232, and the conductive pads 214.

According to at least one example embodiment of inventive concepts, the additional insulating layer 236 may be formed in such a way that a thickness thereof is substantially equivalent to an etched thickness of the preliminary upper insulating fences 232 in the isotropic etching step or a difference in width between the preliminary upper insulating fence 232 and the upper insulating fence 235.

The additional insulating layer 236 may include nitride (for example, silicon nitride). The additional insulating layer 236 may be formed to fill an empty space between the side surface of the bit line structure 225 and the end portion of the upper insulating fence 235.

According to at least one example embodiment of inventive concepts, if the first insulating fences 235a have the end portions, whose corners are partially etched, the additional insulating layer 236 may fill the empty space between the etched corners of the first insulating fence 235a and the side surface of the bit line structure 225.

According to at least one example embodiment of inventive concepts, if the end portions of the second insulating fences 235b are etched to be spaced apart from the bit line structures 225, the additional insulating layer 236 may fill the space between the end portion of the second insulating fence 235b and the bit line structure 225.

According to at least one example embodiment of inventive concepts, if a portion of the third insulating fence 235c is partially etched, the additional insulating layer 236 may fill the etched portion of third upper insulating fence 235c.

Figure 24A:
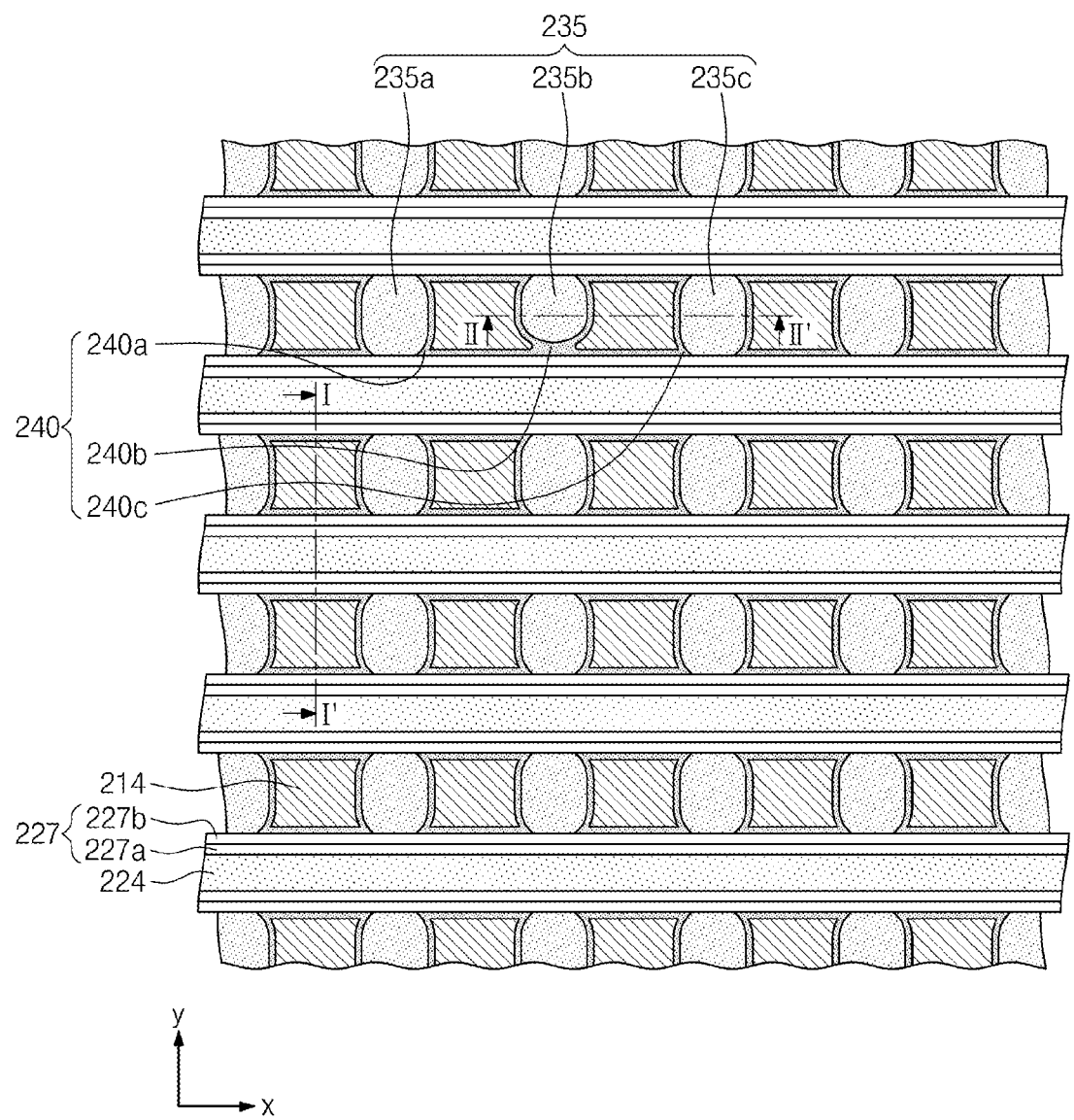
Figure 24B:
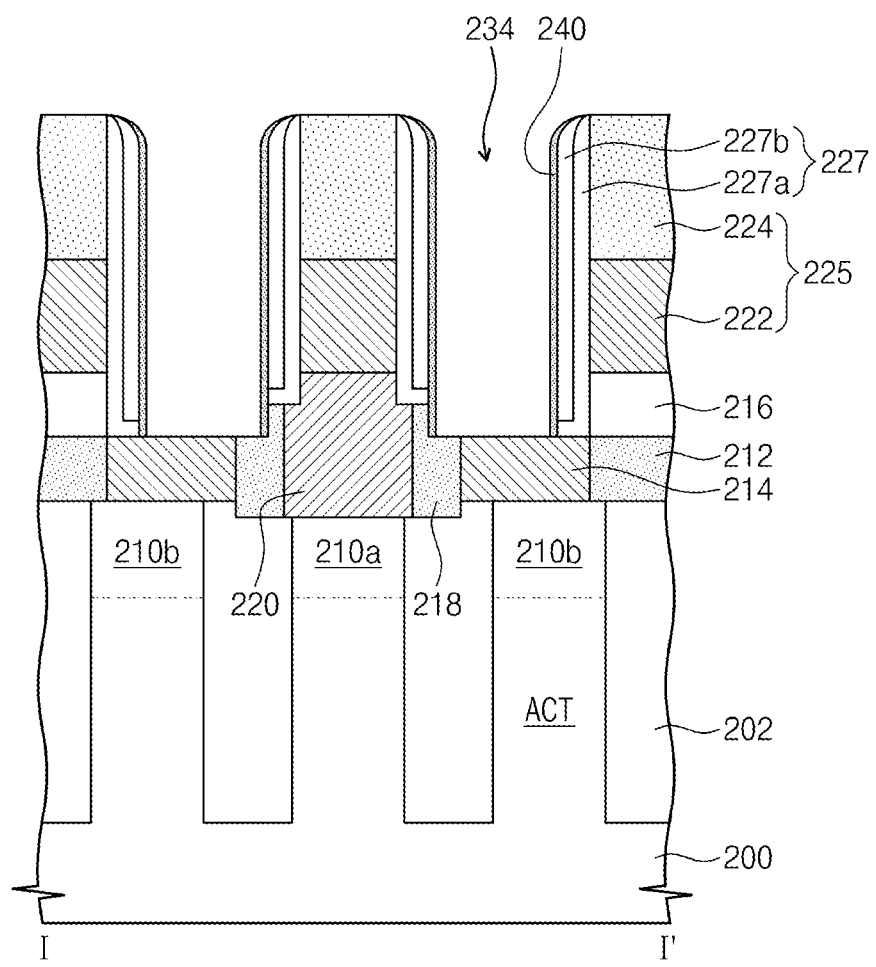
Figure 24C:
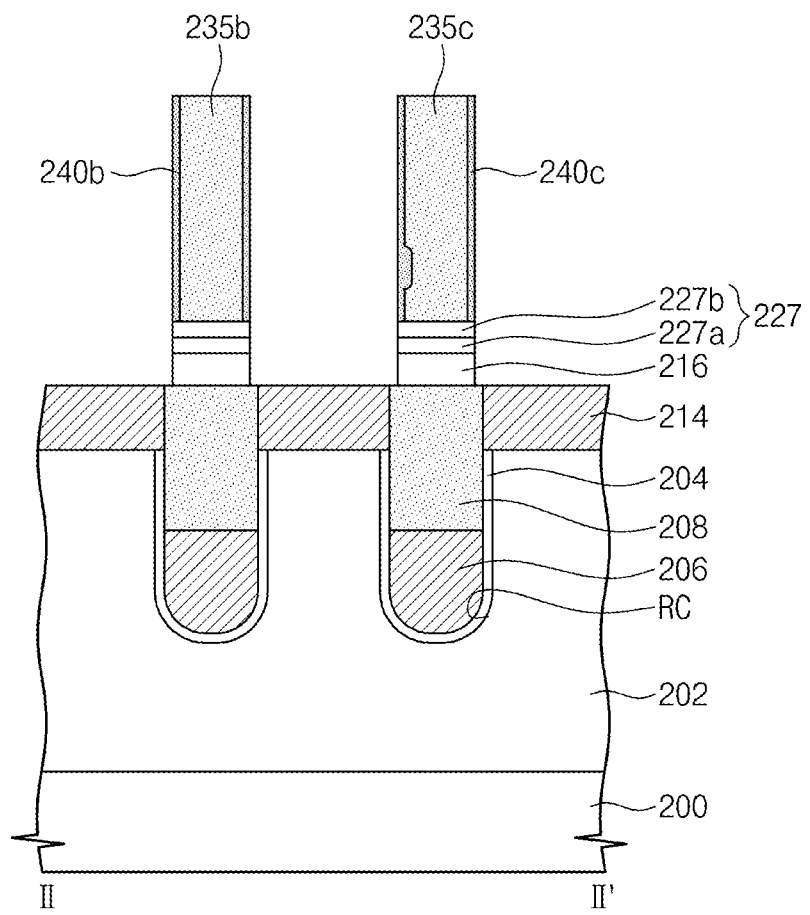

Referring to FIGS. 24A through 24C, the additional insulating layer 236 may be anisotropically etched to form the additional insulating patterns 240, which may be disposed on inner side surfaces of the second contact holes 234, respectively.

According to at least one example embodiment of inventive concepts, the first additional insulating patterns 240a may have a closed-loop structure. At least a portion of the first additional insulating patterns 240a may be extended to fill a space between the corner of each of the first insulating fences 235a and the side surface of each of the bit line structures 225.

According to at least one example embodiment of inventive concepts, the second additional insulating pattern 240b may include at least a portion filling a gap between the end portion of the second insulating fence 235b and the side surface of the bit line structure 225. In this case, an adjacent pair of the second additional insulating patterns 240b may be connected to each other through the gap between the second insulating fence 235b and the bit line structure 225.

According to at least one example embodiment of inventive concepts, the third additional insulating pattern 240c may include at least a portion filling the etched portion of the third insulating fence 235c.

According to at least one example embodiment of inventive concepts, the upper insulating fences 235 and the additional insulating patterns 240 may be provided to isolate electrically the second contact plugs 250 from each other. Further, in the at least one example embodiment, the preliminary upper insulating fences 232 may be etched to form the upper insulating fences 235, and the etched thickness may be substantially equivalent to a thickness of the additional insulating patterns 240 provided on the side surfaces of the upper insulating fences 235. Accordingly, a size of the second contact plug 250 is not reduced. This makes it possible to enhance electric isolation between the second contact plugs 250 without undesirably increasing an electrical resistance of the second contact plug 250. As a result, the semiconductor device with the second contact plugs 250 may have improved electric reliability.

Figure 25A:
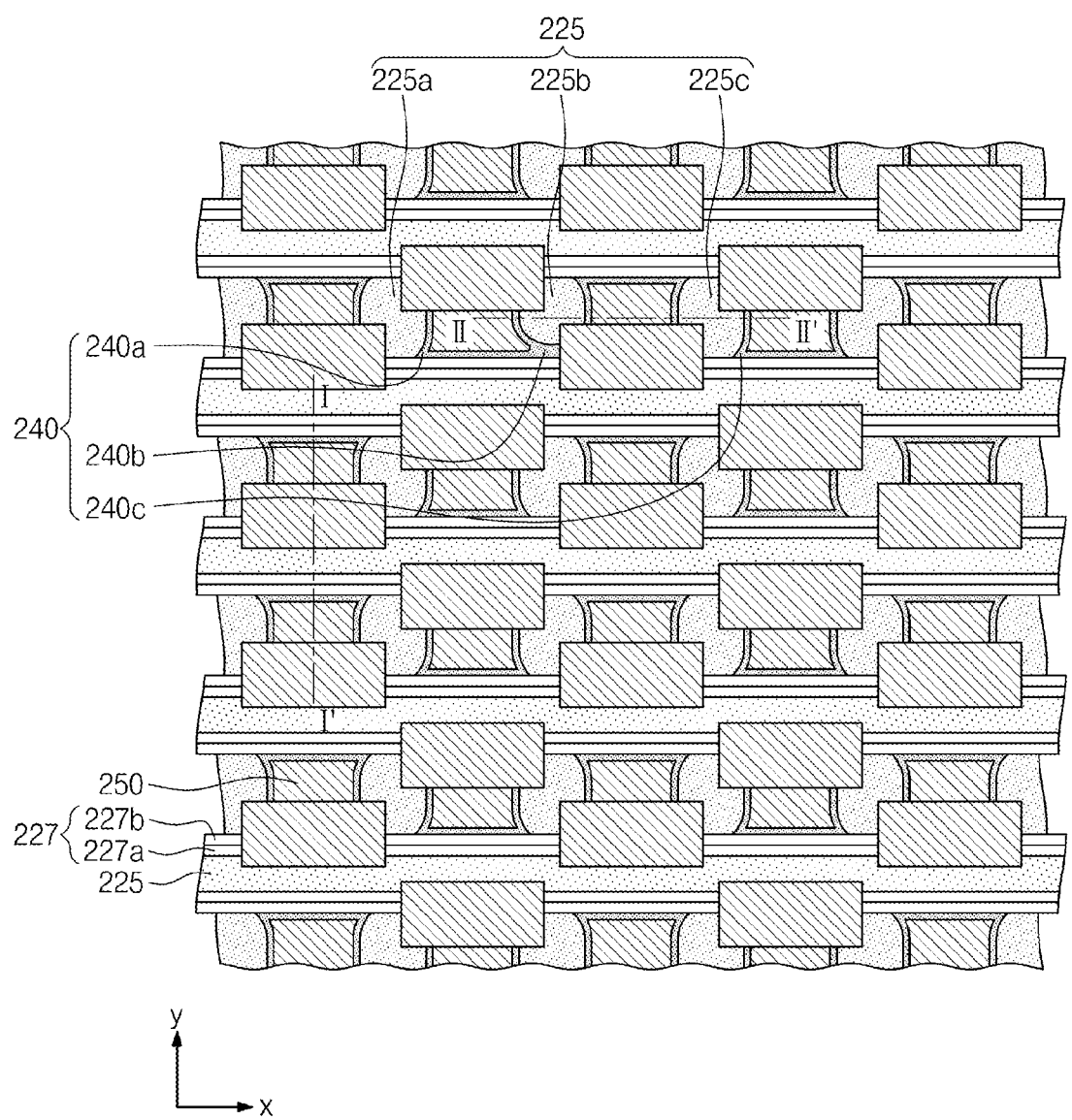
Figure 25B:
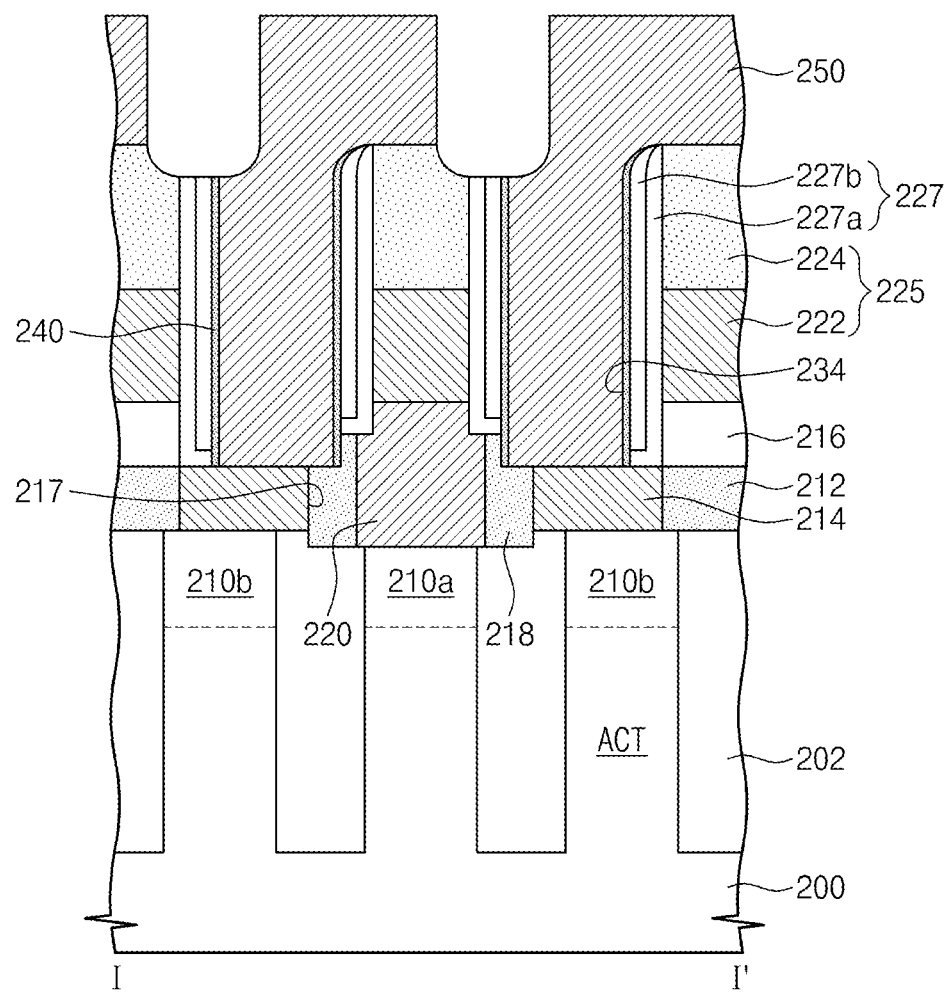
Figure 25C:
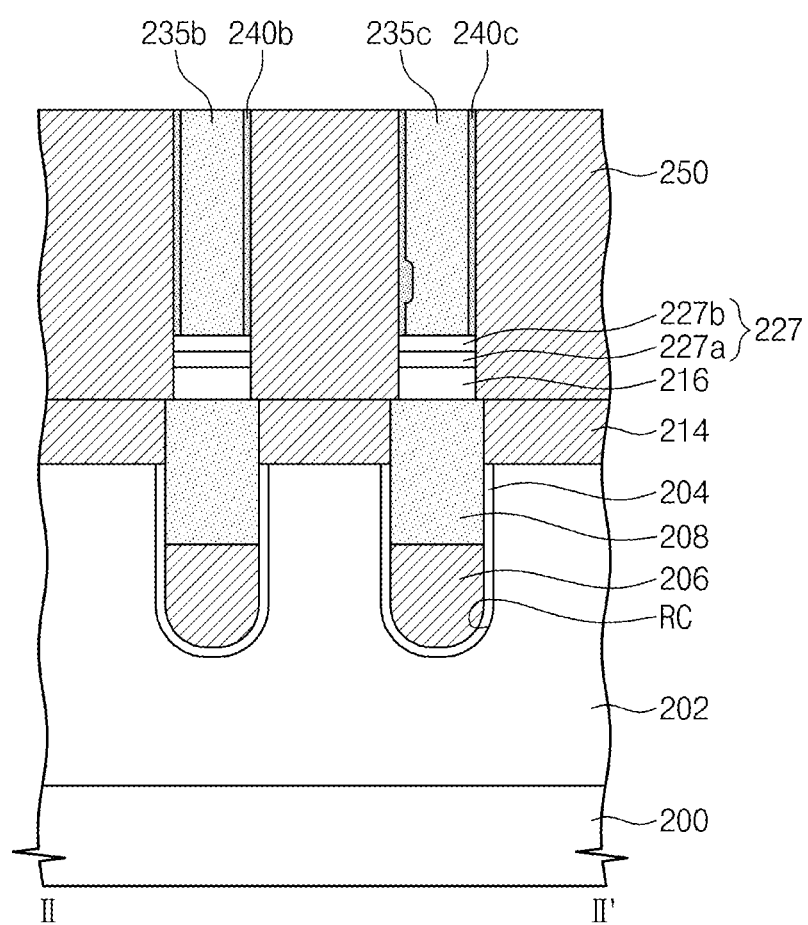

Referring to FIGS. 25A through 25C, second contact plugs 250 may be formed by forming a conductive material to fill the second contact holes 234 provided with the additional insulating patterns 240. Next, capacitors (not shown) may be formed to be electrically connected to the second contact plugs 250, respectively.

Figure 26A:
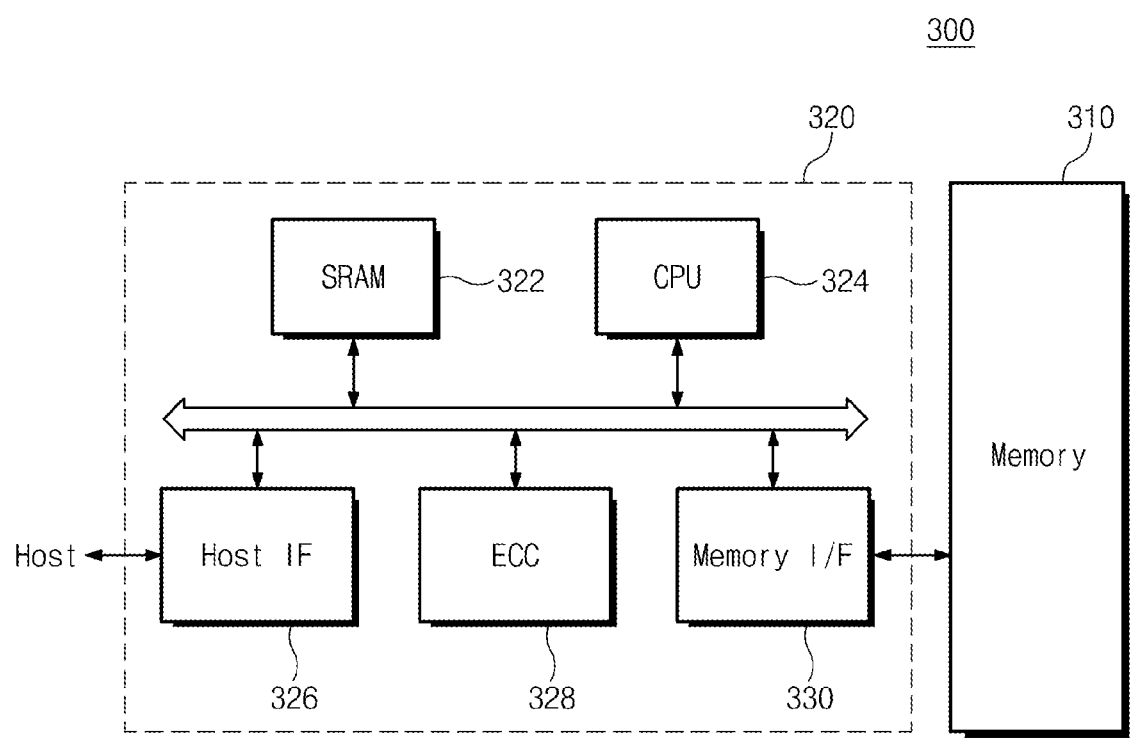
FIG. 26A is a block diagram illustrating a memory card including a semiconductor device according to at least one example embodiment of inventive concepts.

FIG. 26A is a block diagram illustrating a memory card including a semiconductor device according to at least one example embodiment of inventive concepts.

Referring to FIG. 26A, a semiconductor device according to at least one exemplary embodiment of inventive concepts may be applied to form a memory card 300. The memory card 300 may include a memory controller 320 to control a data exchange between a host and a semiconductor memory device 310. A static random access memory 322 may be used as an operation memory of a central processing unit 324. A host interface 326 may include at least one data exchange protocol of the host connected to the memory card 300. An error correction code unit 328 may detect and correct at least one error that may be included in data read from the semiconductor memory device 310. A memory interface 330 can interface with the semiconductor memory device 310. The central processing unit 324 may control data exchange of the memory controller 320 with, for example, the semiconductor device 310.

The semiconductor memory device 310 applied to realize the memory card 300 may be configured to have substantially the same technical features as at least one example embodiment described above, and thus, it is possible to enhance electrical isolation between a transistor and a contact plug. This makes it possible to improve electric reliability of a semiconductor device including the transistor and the contact plug.

Figure 26B:
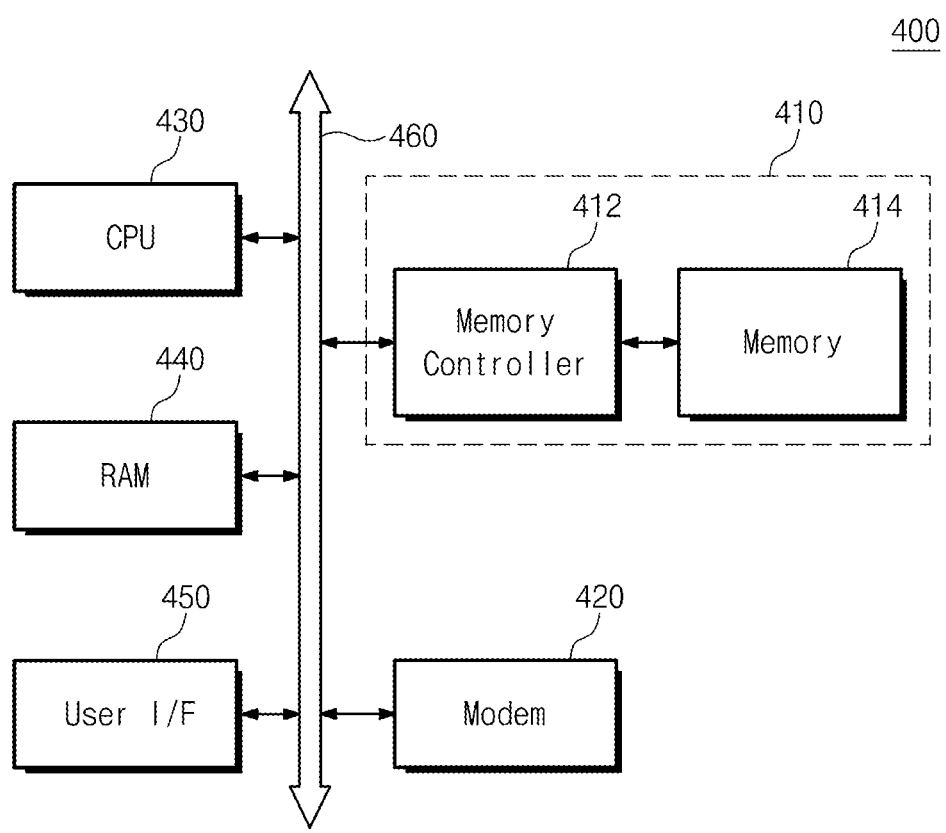
FIG. 26B is a block diagram illustrating an information processing system including a semiconductor device according to at least one example embodiment of inventive concepts.

FIG. 26B is a block diagram illustrating an information processing system including a semiconductor device according to at least one example embodiment of inventive concepts.

Referring to FIG. 26B, an information processing system 400 may include a semiconductor device according to at least one example embodiment of inventive concepts. The information processing system 400 may include a mobile device or a computer. As an illustration, the information processing system 400 may include the memory system 410, a modem 420, a central processing unit (CPU) 430, a random access memory (RAM) 440, and a user interface 450 that are electrically connected to a system bus 460. The memory system 410 may store data processed by the central processing unit (CPU) 430 and data inputted from the outside (e.g., via the user interface 450 and/or the modem 420). The memory system 410 may include a memory 412 and a memory controller 414. The memory system 410 may be the same as the memory card 300 described with reference to FIG. 26A. The information processing system 400 may be provided as a memory card, a solid state disk, a camera image sensor and an application chip set. For example, the memory system 410 may be a solid state disk (SSD) drive. The information processing system 400 may stably and reliably store data in the memory system 410.

According to at least one example embodiment of inventive concepts, both of the insulating fences and the additional insulating patterns may be used to electrically isolate adjacent ones of the conductive patterns from each other, and thus, it is possible to enhance an electrical isolation between the conductive patterns. Further, the additional insulating patterns may be provided to have side surfaces that are substantially coplanar with those of the insulating fences, and thus, even though the additional insulating patterns are provided, it is unnecessary to reduce a size of the conductive pattern.

In the case where the semiconductor device may include the additional insulating pattern enclosing the conductive patterns, the insulating fence may be partially etched to have a reduced size corresponding to a width or thickness of the additional insulating pattern. Accordingly, it is unnecessary to reduce a size of the conductive pattern. As a result, it is possible to enhance the electrical isolation between the conductive patterns without an increase in electrical resistance of the conductive patterns, and thereby, to improve electric reliability of the semiconductor device or the conductive patterns.

While example embodiments of inventive concepts have been particularly shown and described, it will be understood by one of ordinary skill in the art that variations in form and detail may be made therein without departing from the spirit and scope of the attached claims.

What is claimed is:

1. A semiconductor device, comprising:
   line patterns disposed on a substrate, the line patterns extending in a first direction and being parallel to one another;
   conductive patterns spaced apart from each other in the first direction between an adjacent pair of the line patterns;
   insulating fences electrically isolating the conductive patterns from each other; and
   insulating patterns filling gaps between side surfaces of the line patterns,
   wherein at least one of the insulating patterns has a structure that encloses at least one of the conductive patterns.

2. The device of claim 1, wherein each of the insulating fences is elongated along a second direction perpendicular to the first direction, each of the insulating fences having an elliptical shape.

3. The device of claim 1, wherein each of the insulating patterns includes a portion filling a gap between a side surface of the line pattern and at least one end portion of one of the insulating fences.

4. The device of claim 3, wherein each of the insulating patterns has a side surface that is substantially coplanar with at least one of the insulating fences.

5. The device of claim 3, wherein,
   at least one of the insulating patterns has an air gap, and
   the air gap is not exposed to the outside.

6. The device of claim 1, wherein each of the insulating fences has chamfered corners and at least one of the insulating patterns fills a space created by the chamfered portion of at least one of the insulating fences.

7. The device of claim 6, wherein at least one of the insulating patterns has a side surface that is substantially coplanar with a side surface of at least one of the insulating fences.

8. The device of claim 6, wherein,
   at least one of the insulating fences has an air gap, and
   the air gap is not exposed to the outside.

9. A semiconductor device, comprising:
   a device isolation pattern on a substrate to define active regions;
   gate electrodes formed parallel to a first direction such that the gate electrodes cross the active regions and the device isolation pattern;
   first and second impurity regions formed in the active regions at both sides of each of the gate electrodes;
   bit line structures extending in a second direction perpendicular to the first direction, the bit line structures being electrically connected to the first impurity regions;
   first contact plugs between the bit line structures and electrically connected to the second impurity regions;
   first insulating fences between the bit line structures, the first insulating fences electrically isolating the first contact plugs from each other; and
   insulating patterns filling gaps between side surfaces of the bit line structures;
   wherein at least one of the insulating patterns has an air gap.

10. The semiconductor device of claim 9, wherein each of the first insulating fences has an elliptical shape.

11. The semiconductor device of claim 9, wherein,
    the insulating patterns fill gaps between side surfaces of the bit line structures and end portions of the first insulating fences, and at least one of the insulating patterns has a side surface that is substantially coplanar with a side surface of at least one of the first insulating fences.

12. The semiconductor device of claim 11, wherein the air gap is not exposed to the outside.

13. The semiconductor device of claim 9, wherein, each of the insulating fences has chamfered corners,
at least one of the insulating patterns fills a space created by the chamfered corners of at least one of the first insulating fences, and
the insulating pattern has a side surface that is substantially coplanar with a side surface of at least one of the first insulating fences.

14. The semiconductor device of claim 13, wherein,
at least one of the first insulating fences has an air gap, and
the air gap is not exposed to the outside.

15. The semiconductor device of claim 9, wherein at least one of the insulating patterns has a structure that encloses at least one of the first contact plugs.

16. The semiconductor device of claim 9, wherein the first insulating fences include a nitride layer formed by a vapor deposition process.

17. The semiconductor device of claim 16, wherein the insulating patterns include a nitride layer formed by an atomic layer deposition process.

18. The semiconductor device of claim 9, further comprising:
second contact plugs between the gate electrodes, the second contact plugs electrically connecting the first impurity regions to the bit line structures; and
second insulating fences between the gate electrodes, the second insulating fences electrically isolating adjacent the second contact plugs from each other.

19. A semiconductor device, comprising:
first and second line patterns extending in a first direction and being parallel to one another;
a plurality of insulating fences between the first and second line patterns, each of the insulating fences having chamfered corners;
a plurality of insulating patterns, at least a one of the insulating patterns enclosing the chamfered corners of at least one of the insulating fences; and
a plurality of conductive patterns between the first and second line patterns, the plurality of conductive patterns being electrically isolated from each other by at least one of the insulating patterns and at least one of the insulating fences.

20. The semiconductor device of claim 19, wherein each of the first and second line patterns includes a conductive line and at least one insulating spacer.

21. The semiconductor device of claim 20, wherein at least a first one of the insulating patterns includes a first air gap sealed within the first one of the insulating patterns.

22. The semiconductor device of claim 21, wherein at least one of the insulating fences includes at least a second one of the insulating patterns and a second air gap, the second air gap being sealed within the at least one of the insulating fences by the second one of the insulating patterns.

23. The semiconductor device of claim 22, wherein each of the insulating fences has a substantially elliptical shape.

* * * * *